US010236391B2

(12) United States Patent
Sakata et al.

(10) Patent No.: US 10,236,391 B2
(45) Date of Patent: Mar. 19, 2019

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Junichiro Sakata, Atsugi (JP); Takuya Hirohashi, Atsugi (JP); Hideyuki Kishida, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/994,303

(22) Filed: May 31, 2018

(65) Prior Publication Data

US 2018/0286986 A1    Oct. 4, 2018

Related U.S. Application Data

(63) Continuation of application No. 15/292,530, filed on Oct. 13, 2016, now Pat. No. 9,991,396, which is a (Continued)

(30) Foreign Application Priority Data

Mar. 6, 2009    (JP) .................................. 2009-053399

(51) Int. Cl.
*H01L 29/10*    (2006.01)
*H01L 29/786*   (2006.01)
(Continued)

(52) U.S. Cl.
CPC .... *H01L 29/7869* (2013.01); *H01L 21/02565* (2013.01); *H01L 21/02631* (2013.01);
(Continued)

(58) Field of Classification Search
CPC .......... H01L 29/7869; H01L 21/02697; H01L 23/12; H01L 27/1225; H01L 29/04;
(Continued)

(56) References Cited

U.S. PATENT DOCUMENTS 5,334,859 A    8/1994  Matsuda
5,731,856 A    3/1998  Kim et al.
(Continued)

FOREIGN PATENT DOCUMENTS

CN    001522470 A    8/2004
CN    001941299 A    4/2007
(Continued)

OTHER PUBLICATIONS

Taiwanese Office Action (Application No. 106141662) dated Jul. 31, 2018.
(Continued)

*Primary Examiner* — Robert G Bachner
(74) *Attorney, Agent, or Firm* — Robinson Intellectual Property Law Office; Eric J. Robinson

(57) ABSTRACT

It is an object to provide a highly reliable semiconductor device including a thin film transistor with stable electric characteristics. In a semiconductor device including an inverted staggered thin film transistor whose semiconductor layer is an oxide semiconductor layer, a buffer layer is provided over the oxide semiconductor layer. The buffer layer is in contact with a channel formation region of the semiconductor layer and source and drain electrode layers. A film of the buffer layer has resistance distribution. A region provided over the channel formation region of the semiconductor layer has lower electrical conductivity than the channel formation region of the semiconductor layer, and a region in contact with the source and drain electrode (Continued)

layers has higher electrical conductivity than the channel formation region of the semiconductor layer.

18 Claims, 35 Drawing Sheets

Related U.S. Application Data continuation of application No. 15/074,245, filed on Mar. 18, 2016, now Pat. No. 9,496,414, which is a continuation of application No. 14/570,565, filed on Dec. 15, 2014, now Pat. No. 9,324,878, which is a continuation of application No. 14/305,156, filed on Jun. 16, 2014, now Pat. No. 8,916,870, which is a continuation of application No. 13/945,323, filed on Jul. 18, 2013, now Pat. No. 8,872,175, which is a continuation of application No. 12/717,324, filed on Mar. 4, 2010, now Pat. No. 8,492,757.

(51) Int. Cl.
| | | |
|---|---|---|
| H01L 29/417 | (2006.01) | |
| H01L 29/423 | (2006.01) | |
| H01L 29/49 | (2006.01) | |
| H01L 21/02 | (2006.01) | |
| H01L 27/12 | (2006.01) | |
| H01L 29/66 | (2006.01) | |
| H01L 29/08 | (2006.01) | |
| H01L 29/24 | (2006.01) | |

(52) U.S. Cl.
CPC ...... *H01L 27/1225* (2013.01); *H01L 29/0847* (2013.01); *H01L 29/1033* (2013.01); *H01L 29/24* (2013.01); *H01L 29/41733* (2013.01); *H01L 29/42356* (2013.01); *H01L 29/42384* (2013.01); *H01L 29/4908* (2013.01); *H01L 29/66969* (2013.01); *H01L 29/78606* (2013.01); *H01L 29/78618* (2013.01); *H01L 29/78693* (2013.01); *H01L 29/78696* (2013.01); *H01L 21/02554* (2013.01)

(58) Field of Classification Search
CPC ..... H01L 29/24; H01L 29/242; H01L 29/247; H01L 29/26; H01L 29/66477; H01L 29/66742; H01L 29/66765; H01L 29/66969; H01L 29/78; H01L 29/78693; H01L 35/12; H01L 45/12; H01L 45/141; H01L 45/16; H01L 51/0096; A62B 18/02; A62B 7/08; A62B 7/14
See application file for complete search history.

(56) References Cited

U.S. PATENT DOCUMENTS

| | | |
|---|---|---|
| 5,744,864 A | 4/1998 | Cillessen et al. |
| 5,821,005 A | 10/1998 | Kijima et al. |
| 5,847,410 A | 12/1998 | Nakajima |
| 6,197,625 B1 | 3/2001 | Choi |
| 6,278,131 B1 | 8/2001 | Yamazaki et al. |
| 6,294,274 B1 | 9/2001 | Kawazoe et al. |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,838,308 B2 | 1/2005 | Haga |
| 6,906,347 B2 | 6/2005 | Yamazaki et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,435,633 B2 | 10/2008 | Todorokihara et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,473,968 B2 | 1/2009 | Yamazaki et al. |
| 7,501,293 B2 | 3/2009 | Ito et al. |
| 7,576,394 B2 | 8/2009 | Furuta et al. |
| 7,598,670 B2 | 10/2009 | Kumaki et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,781,964 B2 | 8/2010 | Hara et al. |
| 7,791,074 B2 | 9/2010 | Iwasaki |
| 7,847,287 B2 | 12/2010 | Kim et al. |
| 7,884,360 B2 | 2/2011 | Takechi et al. |
| 7,888,681 B2 | 2/2011 | Yamazaki et al. |
| 7,910,490 B2 | 3/2011 | Akimoto et al. |
| 7,910,920 B2 | 3/2011 | Park et al. |
| 7,919,365 B2 | 4/2011 | Kim et al. |
| 7,932,521 B2 | 4/2011 | Akimoto et al. |
| 7,935,964 B2 | 5/2011 | Kim et al. |
| 7,977,255 B1 | 7/2011 | Scheer et al. |
| 7,981,734 B2 | 7/2011 | Furuta et al. |
| 7,994,500 B2 | 8/2011 | Kim et al. |
| 8,038,857 B2 | 10/2011 | Inoue et al. |
| 8,058,645 B2 | 11/2011 | Jeong et al. |
| 8,058,647 B2 | 11/2011 | Kuwabara et al. |
| 8,063,421 B2 | 11/2011 | Kang et al. |
| 8,129,717 B2 | 3/2012 | Yamazaki et al. |
| 8,143,678 B2 | 3/2012 | Kim et al. |
| 8,148,779 B2 | 4/2012 | Jeong et al. |
| 8,188,480 B2 | 5/2012 | Itai |
| 8,193,045 B2 | 6/2012 | Omura et al. |
| 8,202,365 B2 | 6/2012 | Umeda et al. |
| 8,203,143 B2 | 6/2012 | Imai |
| 8,222,092 B2 | 7/2012 | Yamazaki et al. |
| 8,274,077 B2 | 9/2012 | Akimoto et al. |
| 8,274,078 B2 | 9/2012 | Itagaki et al. |
| 8,283,666 B2 | 10/2012 | Kim et al. |
| 8,334,532 B2 | 12/2012 | Umeda et al. |
| 8,343,800 B2 | 1/2013 | Umeda et al. |
| 8,344,387 B2 | 1/2013 | Akimoto et al. |
| 8,420,442 B2 | 4/2013 | Takechi et al. |
| 8,466,463 B2 | 6/2013 | Akimoto et al. |
| 8,492,757 B2 | 7/2013 | Sakata et al. |
| 8,558,323 B2 | 10/2013 | Kim et al. |
| 8,614,442 B2 | 12/2013 | Park et al. |
| 8,729,544 B2 | 5/2014 | Yamazaki et al. |
| 8,872,175 B2 | 10/2014 | Sakata et al. |
| 8,889,480 B2 | 11/2014 | Takechi et al. |
| 8,916,870 B2 | 12/2014 | Sakata et al. |
| 9,087,745 B2 | 7/2015 | Yamazaki et al. |
| 9,111,804 B2 | 8/2015 | Yamazaki et al. |
| 9,209,026 B2 | 12/2015 | Takechi et al. |
| 9,324,878 B2 | 4/2016 | Sakata et al. |
| 9,496,414 B2 | 11/2016 | Sakata et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0164888 A1 | 11/2002 | Roh et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |

(56) References Cited

U.S. PATENT DOCUMENTS

| | | |
|---|---|---|
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0145148 A1 | 7/2006 | Hirai et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0069209 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0241327 A1 | 10/2007 | Kim et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0067508 A1 | 3/2008 | Endo et al. |
| 2008/0073653 A1 | 3/2008 | Iwasaki |
| 2008/0083950 A1 | 4/2008 | Pan et al. |
| 2008/0093595 A1 | 4/2008 | Song et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0191204 A1 | 8/2008 | Kim et al. |
| 2008/0203387 A1 | 8/2008 | Kang et al. |
| 2008/0206935 A1 | 8/2008 | Jang et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2008/0315193 A1 | 12/2008 | Kim et al. |
| 2008/0318368 A1 | 12/2008 | Ryu et al. |
| 2009/0001881 A1 | 1/2009 | Nakayama |
| 2009/0008639 A1 | 1/2009 | Akimoto et al. |
| 2009/0011551 A1 | 1/2009 | Yamazaki |
| 2009/0045397 A1 | 2/2009 | Iwasaki |
| 2009/0045399 A1 | 2/2009 | Kaji et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0160741 A1 | 6/2009 | Inoue et al. |
| 2009/0179199 A1 | 7/2009 | Sano et al. |
| 2009/0224238 A1 | 9/2009 | Kim et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2009/0305461 A1 | 12/2009 | Akimoto et al. |
| 2010/0025678 A1 | 2/2010 | Yamazaki et al. |
| 2010/0065844 A1 | 3/2010 | Tokunaga |
| 2010/0073268 A1 | 3/2010 | Matsunaga et al. |
| 2010/0092800 A1 | 4/2010 | Itagaki et al. |
| 2010/0109002 A1 | 5/2010 | Itagaki et al. |
| 2010/0109003 A1 | 5/2010 | Akimoto et al. |
| 2010/0117078 A1 | 5/2010 | Kuwabara et al. |
| 2010/0117999 A1 | 5/2010 | Matsunaga et al. |
| 2010/0133530 A1 | 6/2010 | Akimoto et al. |
| 2010/0136743 A1 | 6/2010 | Akimoto et al. |
| 2010/0155716 A1 | 6/2010 | Cheong et al. |
| 2010/0163368 A1 | 7/2010 | Duchemin et al. |
| 2010/0176383 A1 | 7/2010 | Park et al. |
| 2010/0219410 A1 | 9/2010 | Godo et al. |
| 2010/0276689 A1 | 11/2010 | Iwasaki |
| 2010/0279462 A1 | 11/2010 | Iwasaki |
| 2010/0283509 A1 | 11/2010 | Kim et al. |
| 2011/0049508 A1 | 3/2011 | Kawamura et al. |
| 2011/0062436 A1 | 3/2011 | Yamazaki et al. |
| 2011/0104851 A1 | 5/2011 | Akimoto et al. |
| 2011/0115839 A1 | 5/2011 | Takahashi et al. |
| 2011/0117697 A1 | 5/2011 | Akimoto et al. |
| 2011/0121290 A1 | 5/2011 | Akimoto et al. |
| 2011/0127521 A1 | 6/2011 | Yamazaki |
| 2011/0127522 A1 | 6/2011 | Yamazaki |
| 2011/0127523 A1 | 6/2011 | Yamazaki |
| 2011/0127579 A1 | 6/2011 | Yamazaki |
| 2011/0193083 A1 | 8/2011 | Kim et al. |
| 2011/0215328 A1 | 9/2011 | Morosawa et al. |
| 2012/0032163 A1 | 2/2012 | Yamazaki |
| 2012/0119205 A1 | 5/2012 | Taniguchi et al. |
| 2012/0295399 A1 | 11/2012 | Kim et al. |
| 2013/0277672 A1 | 10/2013 | Sano et al. |
| 2015/0349099 A1 | 12/2015 | Yamazaki et al. |

FOREIGN PATENT DOCUMENTS

| | | |
|---|---|---|
| CN | 101246909 A | 8/2008 |
| CN | 101257048 A | 9/2008 |
| CN | 101308904 A | 11/2008 |
| CN | 101326644 A | 12/2008 |
| CN | 101369587 A | 2/2009 |
| CN | 101640219 A | 2/2010 |
| EP | 0530834 A | 3/1993 |
| EP | 0544069 A | 6/1993 |
| EP | 1020920 A | 7/2000 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2006824 A | 12/2008 |
| EP | 2226847 A | 9/2010 |
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 A | 10/1996 |

(56) References Cited

FOREIGN PATENT DOCUMENTS

| | | |
|---|---|---|
| JP | 08-306231 A | 11/1996 |
| JP | 11-505377 | 5/1999 |
| JP | 2000-044236 A | 2/2000 |
| JP | 2000-150900 A | 5/2000 |
| JP | 2000-269511 A | 9/2000 |
| JP | 3175225 | 6/2001 |
| JP | 2002-076356 A | 3/2002 |
| JP | 2002-289859 A | 10/2002 |
| JP | 2003-041362 A | 2/2003 |
| JP | 2003-086000 A | 3/2003 |
| JP | 2003-086808 A | 3/2003 |
| JP | 2003-298062 A | 10/2003 |
| JP | 2003-347400 A | 12/2003 |
| JP | 2004-103957 A | 4/2004 |
| JP | 2004-273614 A | 9/2004 |
| JP | 2004-273732 A | 9/2004 |
| JP | 2005-209978 A | 8/2005 |
| JP | 2006-165529 A | 6/2006 |
| JP | 2006-313776 A | 11/2006 |
| JP | 2007-096055 A | 4/2007 |
| JP | 2007-123861 A | 5/2007 |
| JP | 2007-250983 A | 9/2007 |
| JP | 2007-284342 A | 11/2007 |
| JP | 2007-286150 A | 11/2007 |
| JP | 2007-310352 A | 11/2007 |
| JP | 2008-042088 A | 2/2008 |
| JP | 2008-072025 A | 3/2008 |
| JP | 2008-140984 A | 6/2008 |
| JP | 2008-140987 A | 6/2008 |
| JP | 2008-199005 A | 8/2008 |
| JP | 2008-205469 A | 9/2008 |
| JP | 2008-219008 A | 9/2008 |
| JP | 2008-276212 A | 11/2008 |
| JP | 2008-311342 A | 12/2008 |
| JP | 2009-004787 A | 1/2009 |
| JP | 2009-010362 A | 1/2009 |
| JP | 2009-021554 A | 1/2009 |
| JP | 2009-031750 A | 2/2009 |
| JP | 2009-038357 A | 2/2009 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 2010-199307 A | 9/2010 |
| JP | 2010-232647 A | 10/2010 |
| JP | 4571221 | 10/2010 |
| JP | 2012-160679 A | 8/2012 |
| KR | 2006-0133834 A | 12/2006 |
| KR | 2008-0074515 A | 8/2008 |
| KR | 10-0858088 | 9/2008 |
| KR | 2008-0079906 A | 9/2008 |
| WO | WO-2004/114391 | 12/2004 |
| WO | WO-2006/051993 | 5/2006 |
| WO | WO-2007/089048 | 8/2007 |
| WO | WO-2007/119386 | 10/2007 |
| WO | WO-2008/126883 | 10/2008 |
| WO | WO-2008/126884 | 10/2008 |
| WO | WO-2008/133345 | 11/2008 |
| WO | WO-2008/149873 | 12/2008 |

OTHER PUBLICATIONS

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Kimizuka.N. et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nakamura.M et al., "Syntheses and crystal structures of new homologous compounds, indium iron zinc oxides ($InFeO_3(ZnO)m$) (m natural number) and related compounds", Kotai Butsuri (Solid State Physics), 1993, vol. 28, No. 5, pp. 317-327.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Dembo.H et al., "RFCPUS on Glass and Plastic Substrates Fabricated by.TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS"; SID Digest '09 : SID International Symposium Digest of Technical Papers, May 31. 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

(56) References Cited

OTHER PUBLICATIONS

Sakata.J et al., "Development of 4.0-in. Amoled Display With Driver Circuit Using Amorphous In—Ga—Zn-Oxide TFTS", IDW '09 : Proceedings of the 16th International Display Workshops, 2009, pp. 689-692.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 in. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.N. et al., "SPINEL,YBFe2O4, and YB2Fe3O7 Types of Structures for Compounds in the In2O3 and SC2O3—A2O3—BO SYSTEMS [A; Fe, Ga, OR AL; B: Mg, Mn, Fe, Ni, Cu,OR Zn] at Temperatures Over 1000° C.", Journal of Solid State Chemistry, 1985, vol. 60, pp. 332-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2060, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 25, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(56) References Cited

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Korean Office Action (Application No. 2012-0149192) dated Nov. 11, 2013.

Chinese Office Action (Application No. 201010130072.X) dated Nov. 6, 2013.

Chinese Office Action (Application No. 201010130072.X) dated Jul. 9, 2014.

Taiwanese Office Action (Application No. 99106444) dated Jul. 18, 2014.

Taiwanese Office Action (Application No. 102101624) dated Aug. 18, 2014.

Korean Office Action (Application No. 2010-0018811) dated Jan. 27, 2016.

Korean Office Action (Application No. 2015-0027760) dated Jan. 27, 2016.

Korean Office Action (Application No. 2016-0129614) dated Dec. 13, 2016.

Chinese Office Action (Application No. 201510430056.5) dated Sep. 12, 2017.

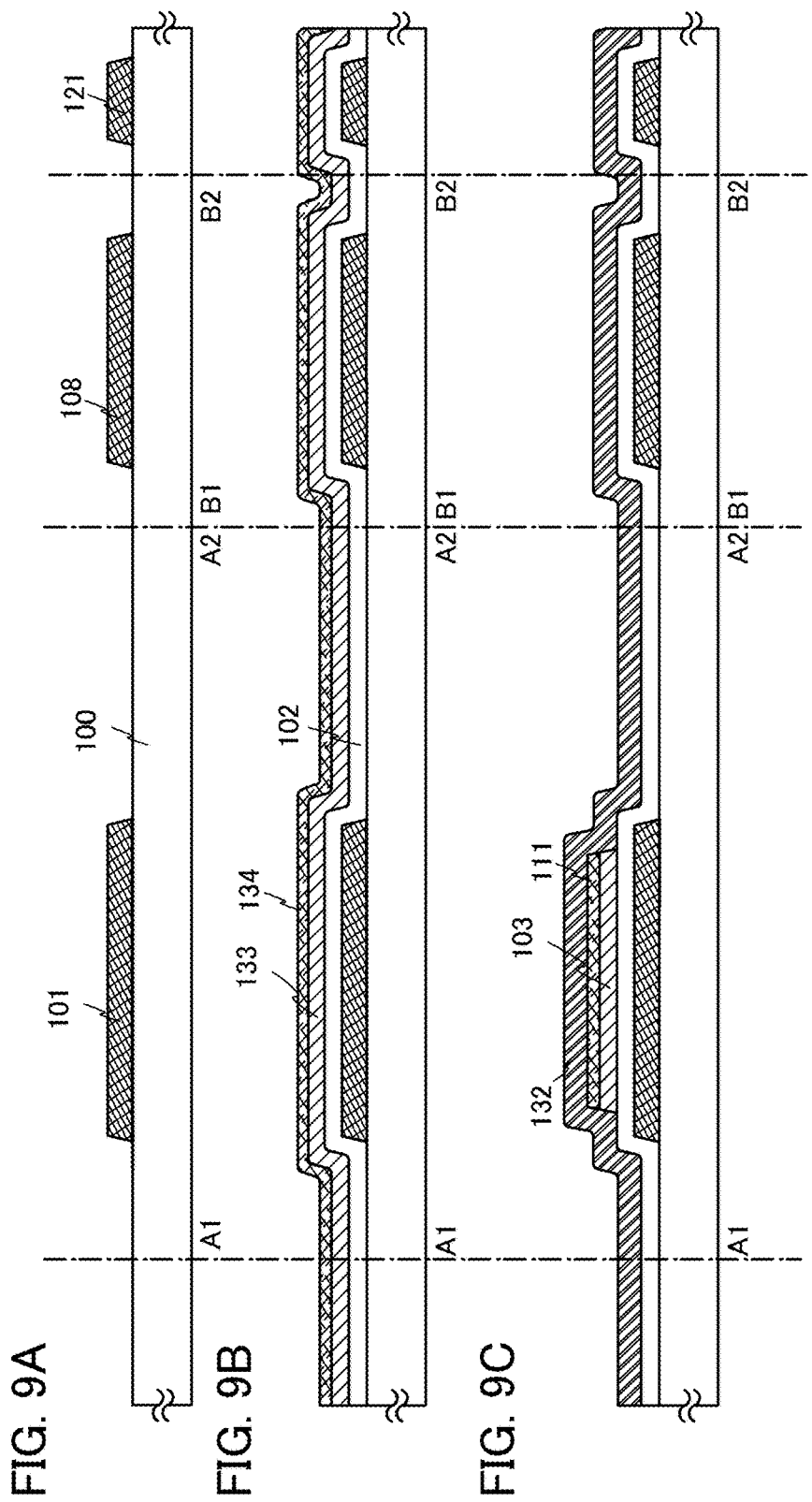

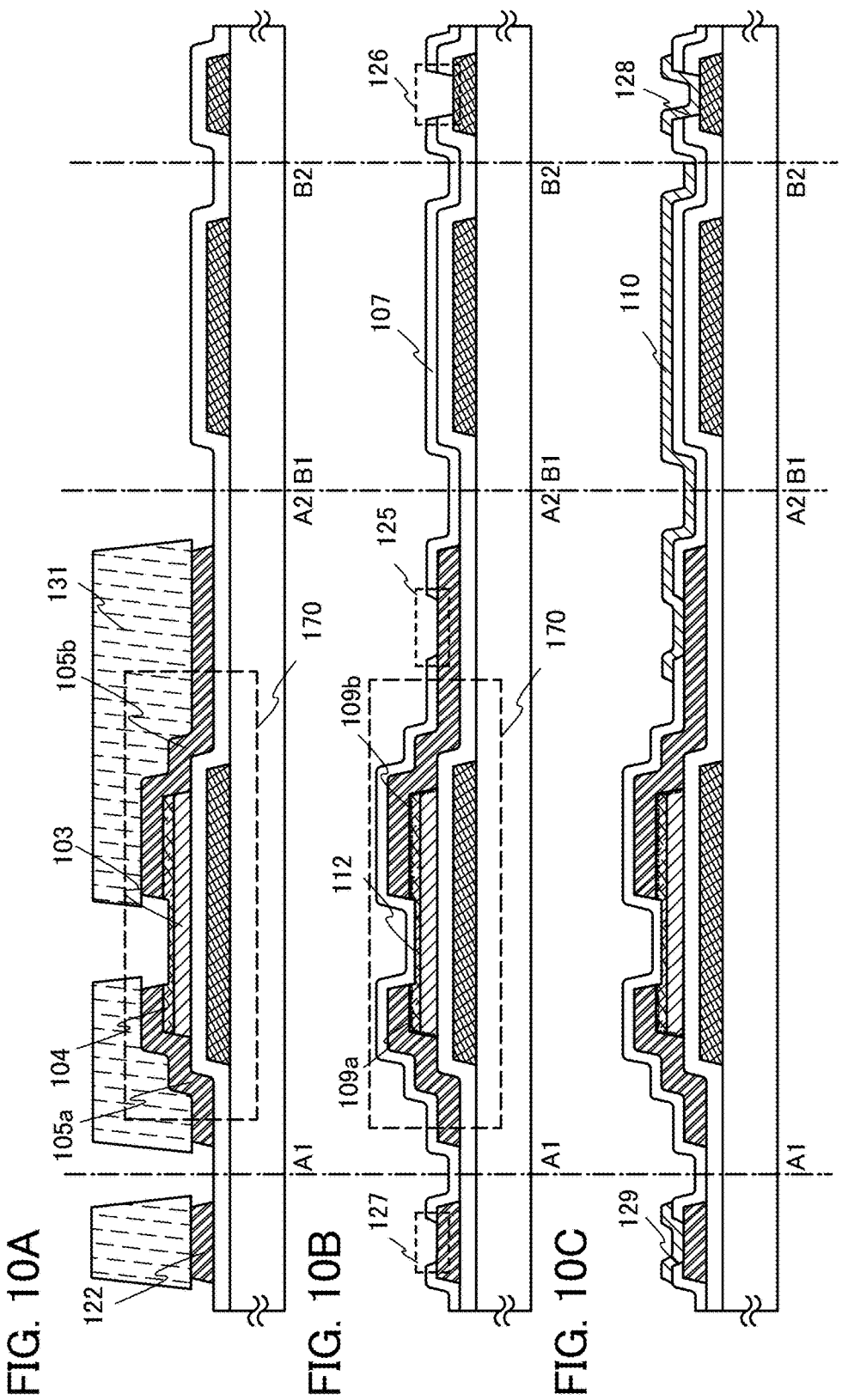

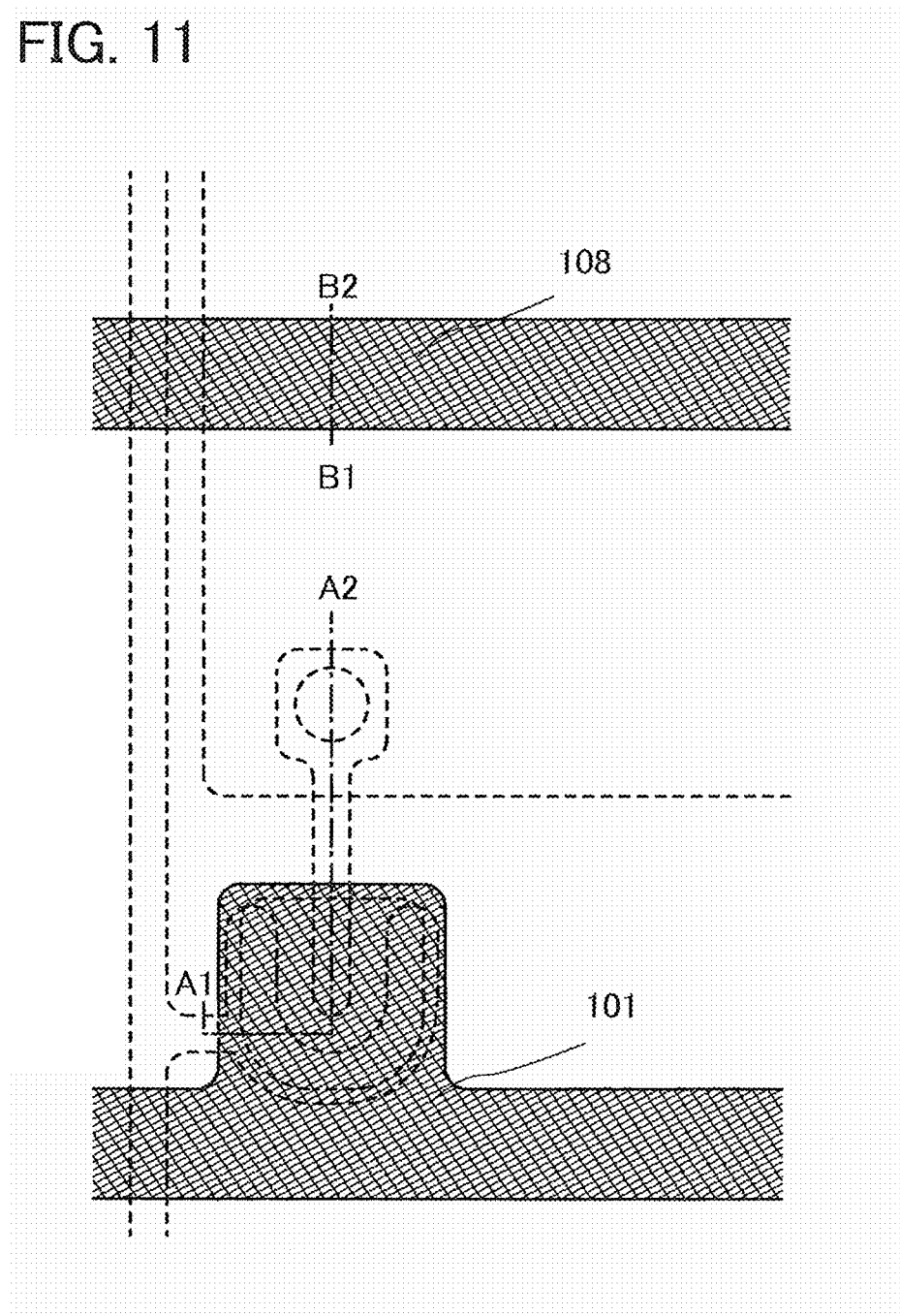

FIG. 15A1
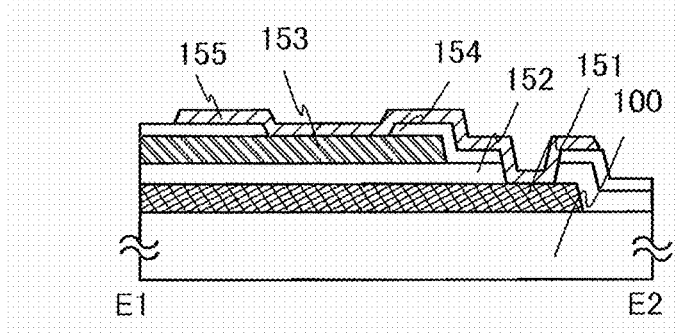
FIG. 15A2
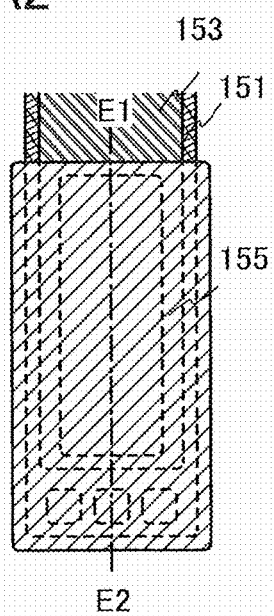
FIG. 15B1
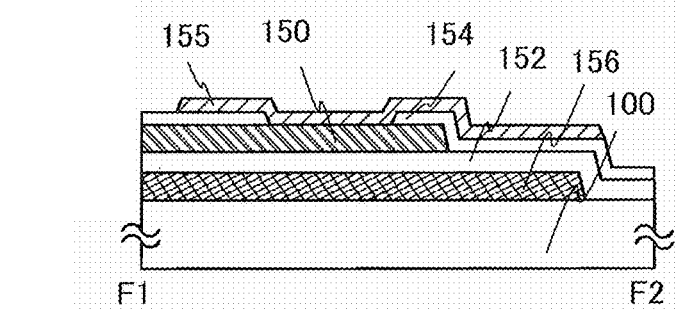
FIG. 15B2
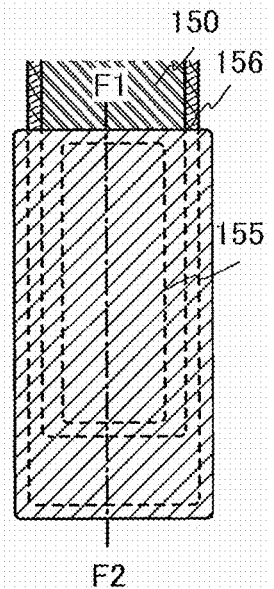

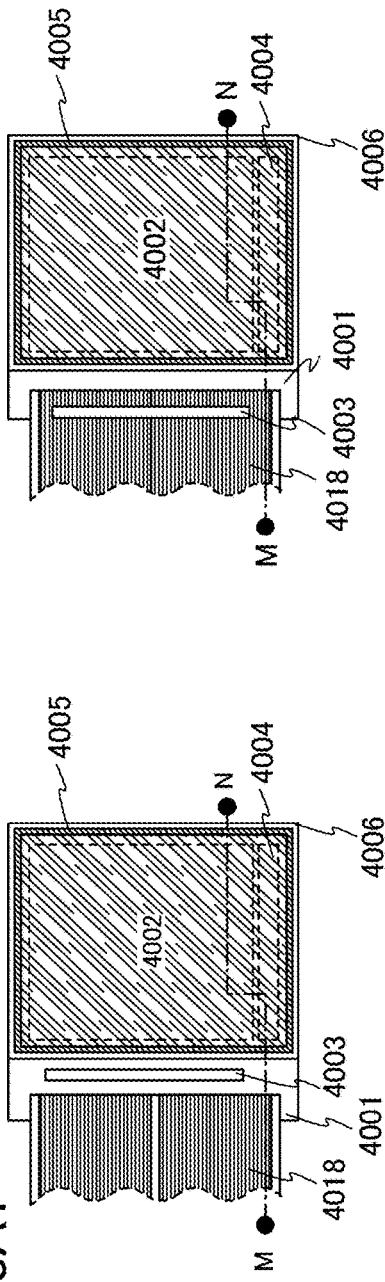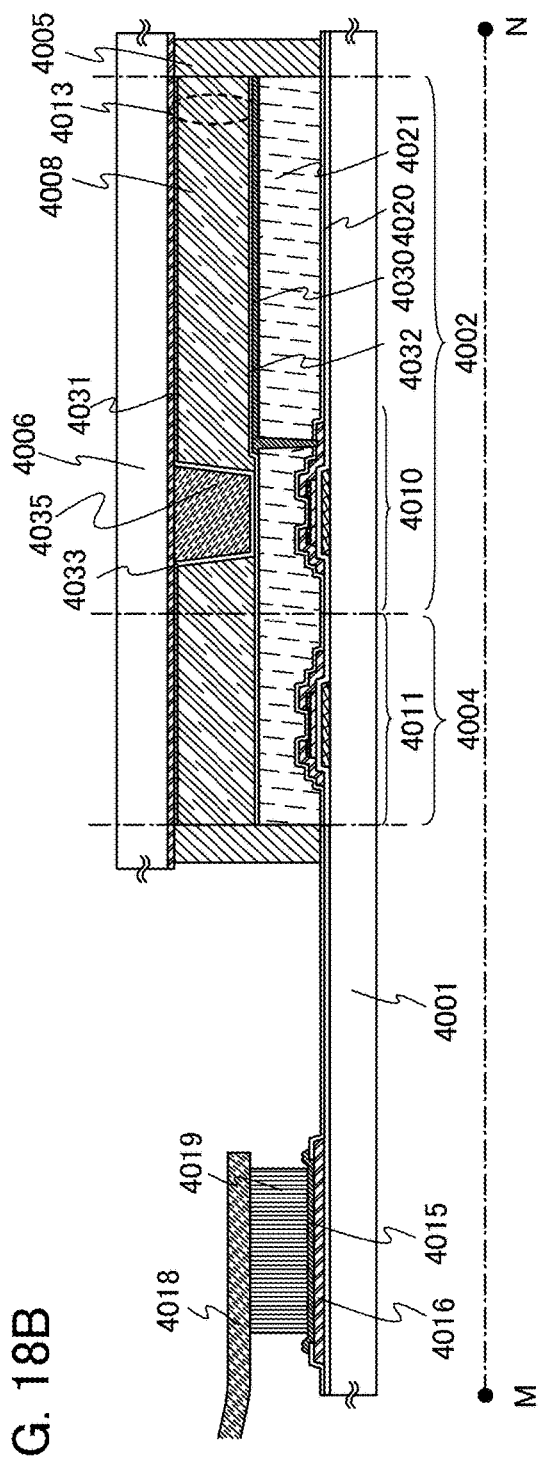
FIG. 18A1
FIG. 18A2
FIG. 18B

SEMICONDUCTOR DEVICE AND METHOD FOR MANUFACTURING THE SAME

BACKGROUND OF THE INVENTION

1. Field of the Invention

The present invention relates to a semiconductor device including an oxide semiconductor and a manufacturing method thereof.

2. Description of the Related Art

There are a variety of kinds of metal oxides intended for many uses. Indium oxide is a well-known material and is used as a transparent electrode material necessary for a liquid crystal display or the like.

Some metal oxides have semiconductor characteristics. For example, metal oxides having semiconductor characteristics include tungsten oxide, tin oxide, indium oxide, zinc oxide, and the like, and thin film transistors in which a channel formation region is formed using such a metal oxide having semiconductor characteristics are already known (see Patent Documents 1 to 4, Non-Patent Document 1).

Examples of metal oxides include not only an oxide of a single metal element but also an oxide of a plurality of metal elements. For example, $InGaO_3(ZnO)_m$ (m: natural number) having a homologous series is known as an oxide semiconductor of a plurality of metal elements, including In, Ga, and Zn (see Non-Patent Documents 2 to 4).

Further, it is proved that the oxide semiconductor formed using an In—Ga—Zn based oxide as described above can be used for a channel layer of a thin film transistor (see Patent Document 5, Non-Patent Documents 5 and 6).

REFERENCE

Patent Document

[Patent Document 1] Japanese Published Patent Application No. S60-198861

[Patent Document 2] Japanese Published Patent Application No. H8-264794

[Patent Document 3] Japanese Translation of PCT International Application No. H11-505377

[Patent Document 4] Japanese Published Patent Application No. 2000-150900

[Patent Document 5] Japanese Published Patent Application No. 2004-103957

Non-Patent Document

[Non-Patent Document 1] M. W. Prins, K. O. Grosse-Holz, G, Muller, J. F. M. Cillessen, J. B. Giesbers, R. P. Weening, and R. M. Wolf, "A ferroelectric transparent thin-film transistor," *Appl. Phys. Lett.*, 17 Jun. 1996, Vol. 68 pp. 3650-3652

[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315

[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178

[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", *KOTAI BUTSURI (SOLID STATE PHYSICS)*, 1993, Vol. 28, No. 5, pp. 317-327

[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE,* 2003, Vol. 300, pp. 1269-1272

[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE,* 2004, Vol. 432 pp. 488-492

SUMMARY OF THE INVENTION

It is an object to provide a highly reliable semiconductor device including a thin film transistor having stable electric characteristics.

In a semiconductor device including an inverted staggered thin film transistor in which an oxide semiconductor layer is used as a semiconductor layer, a buffer layer is provided over the oxide semiconductor layer. The buffer layer is provided to be in contact with a channel formation region of the semiconductor layer and source and drain electrode layers. A film of the buffer layer has resistance distribution. In the buffer layer, a region provided over the channel formation region of the semiconductor layer has lower electrical conductance (electrical conductivity) than the channel formation region of the semiconductor layer, and regions in contact with the source and drain electrode layers have higher electrical conductance (electrical conductivity) than the channel formation region of the semiconductor layer. In addition, the buffer layer and the semiconductor layer have higher electrical conductance (electrical conductivity) (i.e., lower resistance) than a gate insulating layer. Specifically, the descending order of electrical conductance (electrical conductivity) in respective portions is as follows: electrical conductivity in low resistance regions of the buffer layer (regions in contact with the source and drain electrode layers), electrical conductivity in the channel formation region of the semiconductor layer, electrical conductivity in a high resistance region of the buffer layer (region provided over the channel formation region), and electrical conductivity in the gate insulating layer.

The region in the buffer layer which is in contact with the channel formation region is a high resistance region; thus, electric characteristics of the thin film transistor are stable and increase in off current can be prevented. In contrast, the regions in the buffer layer which are in contact with the source and drain electrode layers are low resistance regions; thus, contact resistance can be reduced and on current can be increased. As a result, a semiconductor device including a thin film transistor having high electric characteristics and high reliability can be provided.

The buffer layer can be formed using an oxide semiconductor layer including titanium, molybdenum, or manganese. Addition of a metal element such as titanium, molybdenum, or manganese to the oxide semiconductor layer makes the oxide semiconductor layer have high resistance.

Note that in this specification, an element to be included in the buffer layer, such as titanium, molybdenum, or manganese is added in forming the buffer layer. For example, the buffer layer is formed by a sputtering method with use of a target containing titanium, molybdenum, or manganese.

The oxide semiconductor layer used for the buffer layer may be formed using an oxide material having semiconductor characteristics. For example, an oxide semiconductor whose composition formula is represented by $InMO_3(ZnO)_m$ (m>0) can be used, and particularly, an In—Ga—Zn—O based oxide semiconductor is preferably used. Note that M denotes one or more metal elements selected from gallium (Ga), iron (Fe), nickel (Ni), manganese (Mn), and cobalt (Co). For example, M denotes Ga in some cases; meanwhile, M denotes the above metal element such as Ni or Fe in addition to Ga (Ga and Ni or Ga and Fe) in other cases. Further, the above oxide semiconductor may contain Fe or Ni, another transitional metal element, or an oxide of the transitional metal as an impurity element in addition to the metal element contained as M. In this specification, among the oxide semiconductors whose composition formulas are represented by $InMO_3(ZnO)_m$ (m>0), an oxide semiconductor whose composition formula includes at least Ga as M is referred to as an In—Ga—Zn—O based oxide semiconductor, and a thin film of the In—Ga—Zn—O based oxide semiconductor is referred to as an In—Ga—Zn—O-based non-single-crystal film.

As the oxide semiconductor applied to the buffer layer, any of the following oxide semiconductors can be applied besides the above: an In—Sn—Zn—O based oxide semiconductor; an In—Al—Zn—O based oxide semiconductor; a Sn—Ga—Zn—O based oxide semiconductor; an Al—Ga—Zn—O based oxide semiconductor; a Sn—Al—Zn—O based oxide semiconductor; an In—Zn—O based oxide semiconductor; a Sn—Zn—O based oxide semiconductor; an Al—Zn—O based oxide semiconductor; an In—O based oxide semiconductor; a Sn—O based oxide semiconductor; and a Zn—O based oxide semiconductor.

Alternatively, a film having a low resistance metal region and a high resistance metal oxide region can be used as the buffer layer. In this case, after formation of the metal film, oxidation treatment is selectively performed on the metal film, whereby a high resistance metal oxide region can be formed in the buffer layer.

An embodiment of a structure of the invention disclosed in this specification includes a gate electrode layer over a substrate having an insulating surface, a gate insulating layer over the gate electrode layer, an oxide semiconductor layer including a channel formation region over the gate insulating layer, a buffer layer over the oxide semiconductor layer, and source and drain electrode layers over the buffer layer. In the buffer layer, a first region which is in contact with the source and drain electrode layers has higher electrical conductivity than a second region which in contact with the channel formation region of the oxide semiconductor layer.

Another embodiment of a structure of the invention disclosed in this specification includes a gate electrode layer over a substrate having an insulating surface, a gate insulating layer over the gate electrode layer, an oxide semiconductor layer including a channel formation region over the gate insulating layer, a buffer layer over the oxide semiconductor layer, and source and drain electrode layers over the buffer layer, in which the buffer layer is an oxide semiconductor layer including titanium, molybdenum, or manganese. In the buffer layer, a first region which is in contact with the source and drain electrode layers has higher electrical conductivity than a second region which is in contact with the channel formation region of the oxide semiconductor layer.

In the case of using an oxide semiconductor layer including titanium, molybdenum, or manganese for the buffer layer, a material including a metal with high affinity for oxygen is preferably used in the source and drain electrode layers. It is preferable that the metal with high affinity for oxygen be one or more materials selected from titanium, aluminum, manganese, magnesium, zirconium, beryllium, and thorium. In this case, it is preferable that in the buffer layer, the first region which is in contact with the source and drain electrode layers have the lower proportion of oxygen (lower oxygen concentration) than the second region which is in contact with the channel formation region of the oxide semiconductor layer.

Another embodiment of a structure of the invention disclosed in this specification includes a gate electrode layer over a substrate having an insulating surface, a gate insulating layer over the gate electrode layer, an oxide semiconductor layer including a channel formation region over the gate insulating layer, a buffer layer over the oxide semiconductor layer, and source and drain electrode layers over the buffer layer. In the buffer layer, a first region which is in contact with the source and drain electrode layers is a metal region, and a second region which is in contact with the channel formation region of the oxide semiconductor layer is a metal oxide region. The metal oxide region has lower electrical conductivity than the channel formation region of the oxide semiconductor layer.

Another embodiment of a structure of the invention disclosed in this specification includes the following steps: forming a gate electrode layer over a substrate having an insulating surface; forming a gate insulating layer over the gate electrode layer; forming a first oxide semiconductor layer including a channel formation region over the gate insulating layer; forming a second oxide semiconductor layer including titanium, molybdenum, or manganese over the first oxide semiconductor layer; forming source and drain electrode layers over the second oxide semiconductor layer; and performing heat treatment on the second oxide semiconductor layer including titanium, molybdenum, or manganese and the source and drain electrode layers, so that in the second oxide semiconductor layer, a first region which is in contact with the source and drain electrode layers has higher electrical conductivity than a second region which is in contact with the channel region of the first oxide semiconductor layer. By the heat treatment, the concentration of oxygen contained in the first region is made lower than the concentration of oxygen contained in the second region.

Another embodiment of a structure of the invention disclosed in this specification includes the following steps: forming a gate electrode layer over a substrate having an insulating surface; a gate insulating layer over the gate electrode layer; forming an oxide semiconductor layer including a channel formation region over the gate insulating layer; forming a metal film over the oxide semiconductor layer; forming source and drain electrode layers over a first region of the metal film; and performing oxidation treatment on a second region of the metal film, which is in contact with the channel formation region of the oxide semiconductor layer, so that a metal oxide region is formed. The oxidation treatment is oxygen plasma treatment.

An insulating film may be formed so as to cover a thin film transistor which includes the oxide semiconductor layer including the channel formation region, the buffer layer, and the source and drain electrode layers and to be in contact with the oxide semiconductor layer including the channel formation region.

Since a thin film transistor is easily broken due to static electricity or the like, a protective circuit for protecting a driver circuit is preferably provided over the same substrate for a gate line or a source line. The protective circuit is preferably formed with a non-linear element including an oxide semiconductor.

Note that the ordinal numbers such as "first" and "second" in this specification are used for convenience and do not denote the order of steps and the stacking order of layers. In addition, the ordinal numbers in this specification do not denote particular names which specify the present invention.

Moreover, as a display device including a driver circuit, a light-emitting display device in which a light-emitting element is used and a display device in which an electrophoretic display element is used, which is also referred to as an "electronic paper", are given in addition to a liquid crystal display device.

In the light-emitting display device in which a light-emitting element is used, a plurality of thin film transistors are included in a pixel portion, and in the pixel portion, there is a region where a gate electrode of one thin film transistor is connected to a source wiring or a drain wiring of another thin film transistor. In addition, in a driver circuit of the light-emitting display device in which a light-emitting element is used, there is a region where a gate electrode of a thin film transistor is connected to a source wiring or a drain wiring of the thin film transistor.

In this specification, a semiconductor device generally means a device which can function by utilizing semiconductor characteristics, and an electrooptic device, a semiconductor circuit, and an electronic device are all semiconductor devices.

A thin film transistor having stable electric characteristics can be obtained and a thin film transistor having favorable dynamic characteristics can be manufactured. Thus, a semiconductor device including a thin film transistor having high electric characteristics and high reliability can be provided.

BRIEF DESCRIPTION OF THE DRAWINGS

FIGS. 9A to 9C illustrate a method for manufacturing a semiconductor device.
FIGS. 10A to 10C illustrate a method for manufacturing a semiconductor device.
FIG. 11 illustrates a method for manufacturing a semiconductor device.
FIGS. 15A1 and A2 and 15B1 and B2 illustrate a semiconductor device.
FIGS. 18A1 and A2 and 18B illustrate a semiconductor device.

DETAILED DESCRIPTION OF THE INVENTION

Figure 1A:
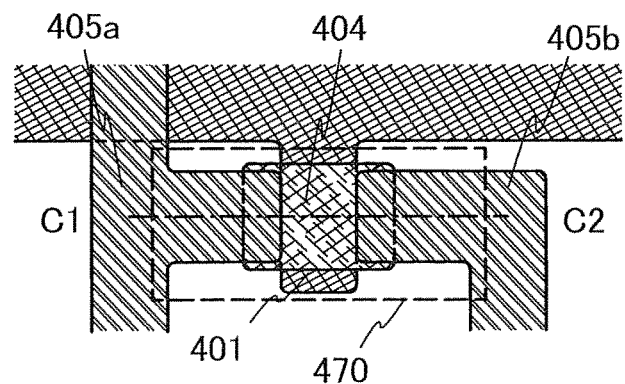
FIGS. 1A and 1B illustrate a semiconductor device.

Embodiments of the present invention are described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In the structures to be given below, the same portions or portions having similar functions are denoted by the same reference numerals in different drawings, and repetitive description thereof is omitted.

(Embodiment 1)

A semiconductor device and a manufacturing method thereof will be described with reference to FIGS. 1A and 1B and FIGS. 2A to 2E.

Figure 1B:
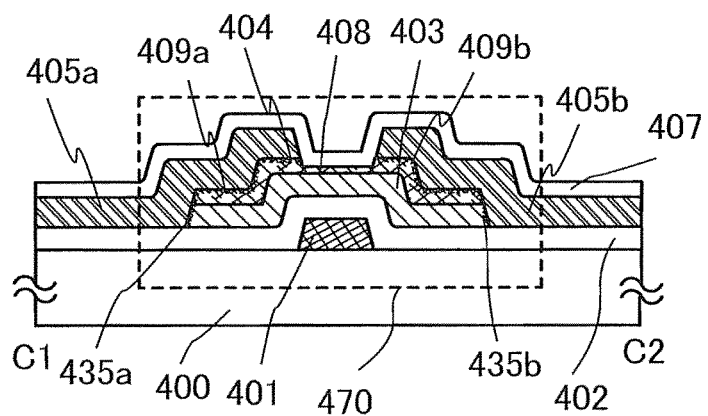

FIG. 1A is a plan view of a thin film transistor 470 of a semiconductor device, and FIG. 1B is a cross-sectional view along line C1-C2 of FIG. 1A. The thin film transistor 470 is an inverted staggered thin film transistor and includes, over a substrate 400 which is a substrate having an insulating surface, a gate electrode layer 401, a gate insulating layer 402, a semiconductor layer 403, a buffer layer 404, and source and drain electrode layers 405a and 405b. In addition, an insulating film 407 is provided so as to cover the thin film transistor 470 and be in contact with the buffer layer 404.

The buffer layer 404 includes first regions 409a and 409b which are low resistance regions and in contact with the source and drain electrode layers 405a and 405b, and a second region 408 which is a high resistance region and in contact with a channel formation region of the semiconductor layer 403. Note that in drawings of this specification, shaded regions of the buffer layer 404 and the semiconductor layer 403 indicate the first regions 409a and 409b and low resistance regions 435a and 435b.

A film of the buffer layer 404 has resistance distribution. The second region 408 provided over the channel formation region of the semiconductor layer 403 has lower electrical conductivity than the channel formation region of the semiconductor layer 403, and the first regions 409a and 409b in contact with the source and drain electrode layers 405a and 405b have higher electrical conductivity than the channel formation region of the semiconductor layer 403. In addition, the buffer layer 404 and the semiconductor layer 403 have higher electrical conductivity (i.e., lower resistance) than the gate insulating layer 402. That is, the descending order of electrical conductivity in respective portions is as follows: electrical conductivity in the low resistance region of the buffer layer 404 (the first regions 409a and 409b); that in the channel formation region of the semiconductor layer 403; that in the high resistance region of the buffer layer 404 (the second region 408); and that in the gate insulating layer 402.

The region in the buffer layer which is in contact with the channel formation region is a high resistance region; thus, the buffer layer of the high resistance region can make the electric characteristics of the thin film transistor stable and prevent off current from increasing. In contrast, the regions in the buffer layer which are in contact with the source and drain electrode layers are low resistance regions; thus, the buffer layer of the low resistance regions can reduce contact resistance and increase on current. As a result, a semiconductor device including a thin film transistor having high electric characteristics and high reliability can be provided.

The buffer layer 404 can be an oxide semiconductor layer including titanium, molybdenum, or manganese. Addition of a metal element such as titanium, molybdenum, or manganese to the oxide semiconductor layer makes the semiconductor layer have high resistance.

As an example of the buffer layer 404, an electronic state of a structure where titanium (Ti) or molybdenum (Mo) was added to an In—Ga—Zn—O based oxide semiconductor was calculated. A calculation method is described below.

Both densities of an In—Ga—Zn—O based oxide semiconductor structure including Ti and an In—Ga—Zn—O based oxide semiconductor including Mo were fixed at 5.9 g/cm$^3$ which was an experimental value of an amorphous In—Ga—Zn—O based oxide semiconductor. These two structures were calculated under the conditions described below. Note that simulation software "Materials Explorer 5.0" manufactured by Fujitsu Limited was used for classical molecular dynamics (MD) simulation, and software of first principle calculation "CASTEP" manufactured by Accelrys Software Inc. was used for first principle calculation.

First, Ti or Mo was included in an In—Ga—Zn—O based oxide semiconductor formed by classical molecular dynamics (MD) simulation and first principle calculation. Next, while the temperature was gradually decreased from 3000 K to 1500 K, and then to 300 K, first principle MD calculation was performed under the conditions of: a fixed number of particles (N), a fixed volume (V), and a fixed temperature (T) (ensemble NVT); a time step of 1 fesc; a step number of 2000 step, at each temperature; a cut-off energy of 260 eV, of electrons; and k-point sets of 1×1×1. After that, the structure was optimized by first principle calculation under the conditions of a cut-off energy of 420 eV, of electrons and k-point sets of 2×2×2.

Figure 28:
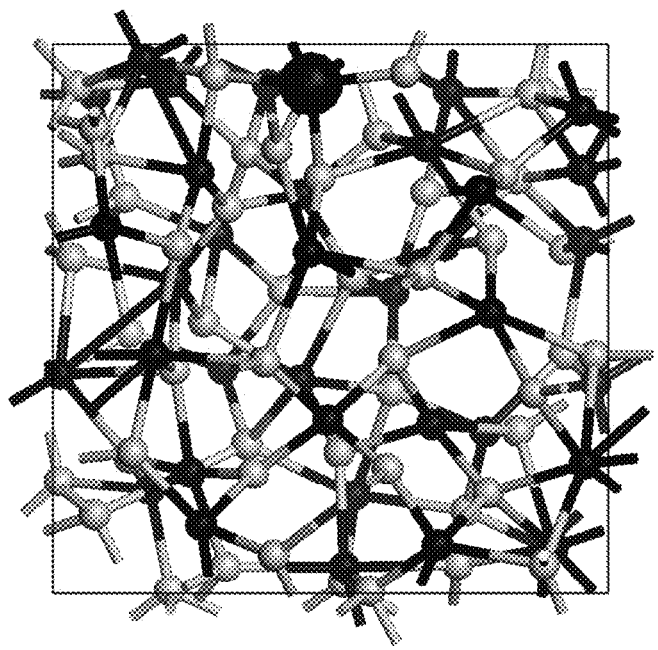
FIG. 28 shows a structure used for calculation.
Figure 29:
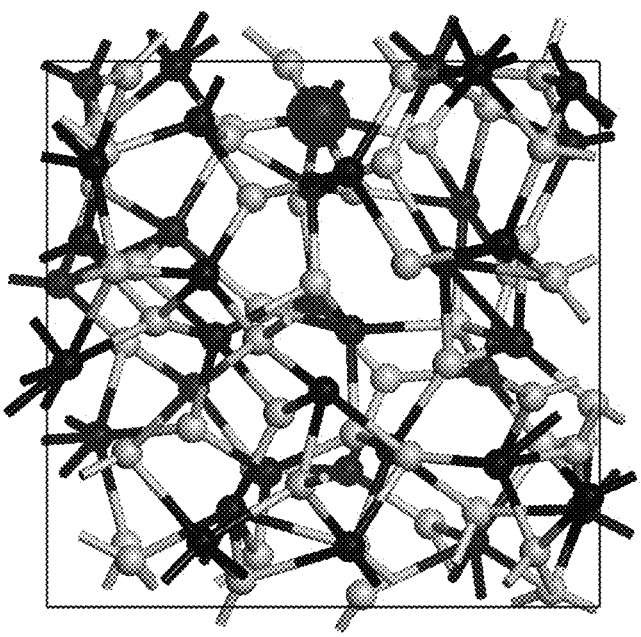
FIG. 29 shows a structure used for calculation.

FIGS. 28 and 29 show an In—Ga—Zn—O based oxide semiconductor structure including Ti and an In—Ga—Zn—O based oxide semiconductor structure including Mo, respectively, which were obtained by the calculation. In FIGS. 28 and 29, black circles indicate metal atoms and white circles indicate oxygen atoms. Large black circles indicate Ti or Mo. In the In—Ga—Zn—O based oxide semiconductor structure including Ti of FIG. 28, the number of each of In, Ga, and Zn atoms is 12, the number of O atoms is 50, and the number of Ti atoms is one. In the In—Ga—Zn—O based oxide semiconductor structure including Mo of FIG. 29, the number of each of In, Ga, and Zn atoms is 12, the number of O atoms is 51, and the number of Mo atoms is one.

The electron density of states in the In—Ga—Zn—O based oxide semiconductor structure including Ti of FIG. 28 and the electron density of states in the In—Ga—Zn—O based oxide semiconductor structure including Mo of FIG. 29 were calculated by first principle calculation under the conditions of a cut-off energy of 420 eV, of electrons and k-point sets of 3×3×3.

Figure 30A:
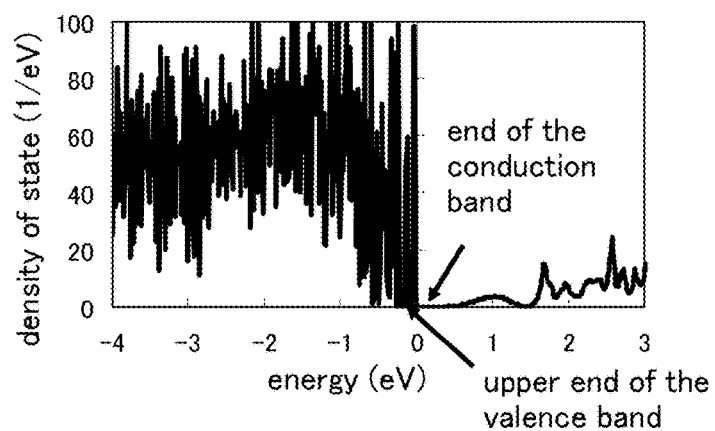
FIGS. 30A to 30C are graphs showing density of states by calculation.
Figure 30B:
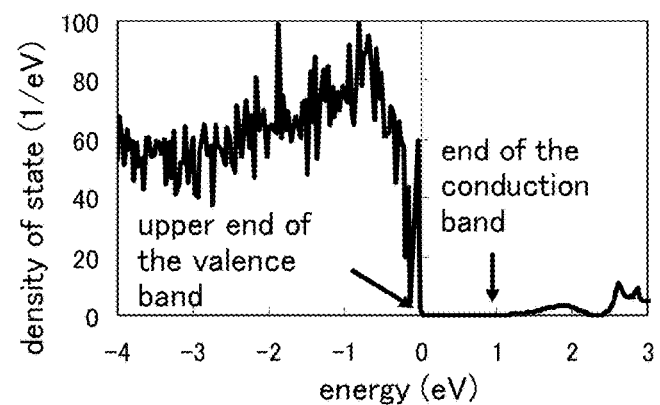
Figure 30C:
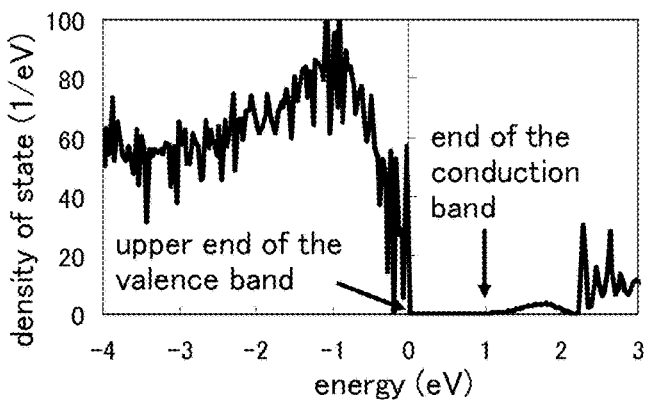

FIG. 30A shows the density of states in the whole In—Ga—Zn—O based oxide semiconductor structure, FIG. 30B shows the density of states in the whole In—Ga—Zn—O based oxide semiconductor structure including Ti, and FIG. 30C shows the density of states in the whole In—Ga—Zn—O based oxide semiconductor structure including Mo. In each of FIGS. 30A to 30C, an origin on the horizontal axis is Fermi energy. Each of the structures of FIGS. 30A to 30C has a band gap, and an upper end of a valence band and a lower end of a conduction band are indicated in each of FIGS. 30A to 30C. Fermi energy is at the upper end of the valence band.

Figure 31A:
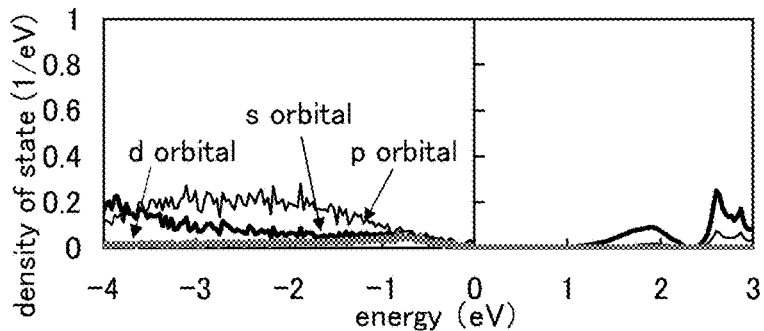
FIGS. 31A to 31D are graphs showing density of states by calculation.
Figure 31B:
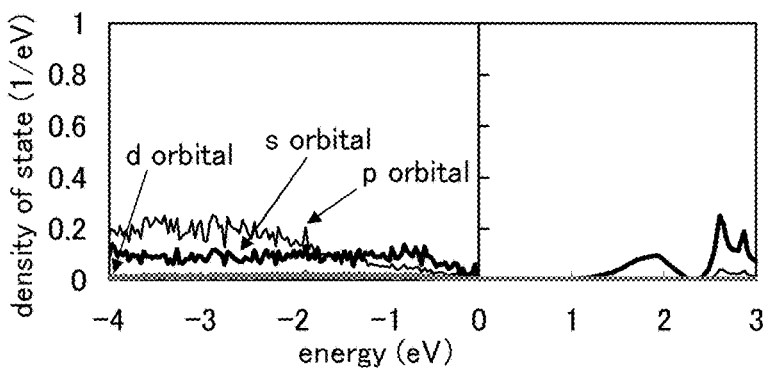
Figure 31C:
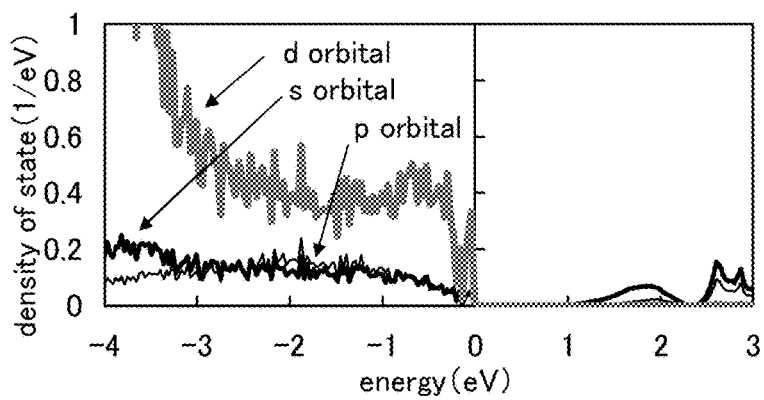
Figure 32A:
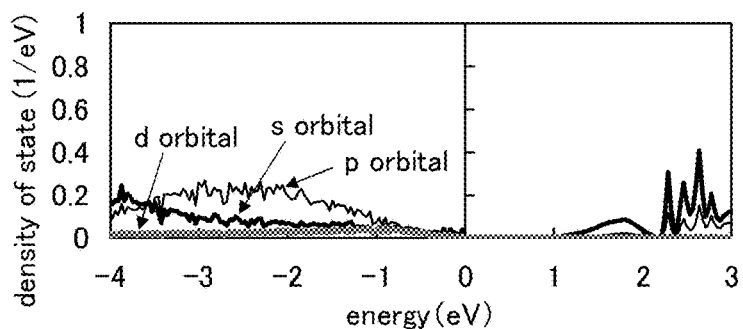
FIGS. 32A to 32D are graphs showing density of states by calculation.
Figure 32B:
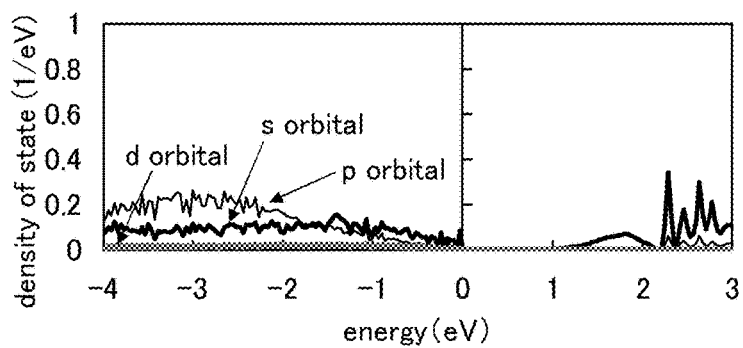
Figure 32C:
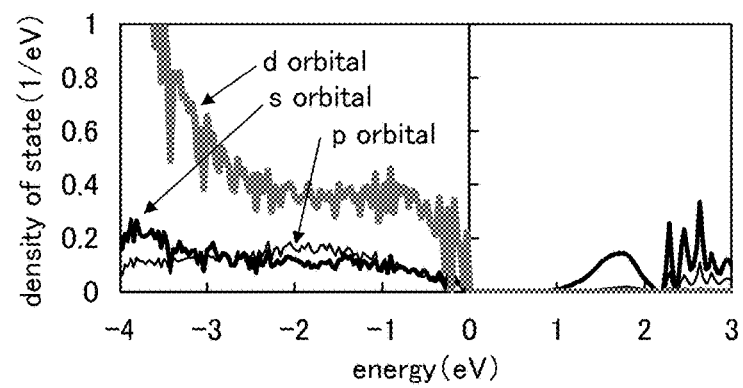

FIG. 31A shows the partial density of states of In atoms per one atom in the In—Ga—Zn—O based oxide semiconductor structure including Ti, FIG. 31B shows the partial density of states of Ga atoms per one atom therein, and FIG. 31C shows the partial density of states of Zn atoms per one atom therein. FIG. 32A shows the partial density of states of In atoms per one atom in the In—Ga—Zn—O based oxide semiconductor structure including Mo, FIG. 32B shows the partial density of states of Ga atoms per one atom therein, and FIG. 32C shows the partial density of states of Zn atoms per one atom therein. Each of these elements has 12 atoms in one system, and each density of states is an average value. From the results of FIGS. 31A, 31B, and 31C and FIGS. 32A, 32B, and 32C, each level in the vicinity of the lower end of the conduction band where n-type carriers enter is mainly formed by the s orbital of In, Ga, or Zn.

Figure 31D:
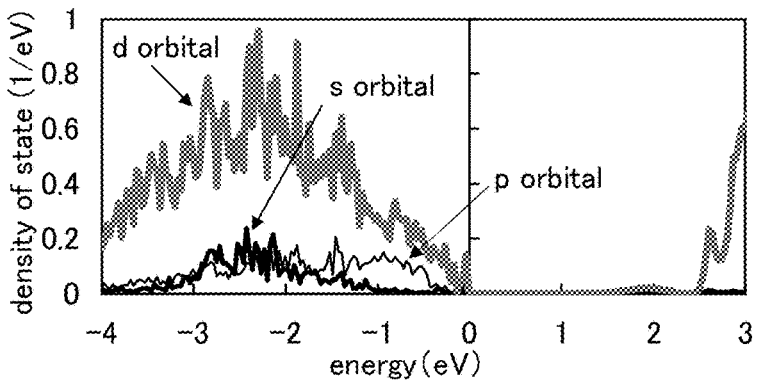
Figure 32D:
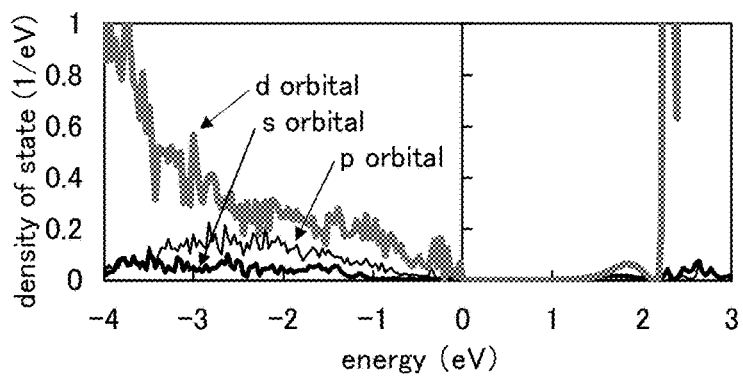

FIG. 31D shows the partial density of states of Ti atoms in the In—Ga—Zn—O based oxide semiconductor structure including Ti, and FIG. 32D shows the partial density of states of Mo atoms in the In—Ga—Zn—O based oxide semiconductor structure including Mo. From the results of FIG. 31D and FIG. 32D, the most contributing orbital is not the s orbital but the d orbital. When the concentration of Ti or Mo is increased, the level at the lower end of the conduction band is formed not by the s orbitals of In, Ga, and Zn but by the d orbital of Ti or Mo. The d orbital has a feature of strong anisotropy as compared to the s orbital and has difficulty in conducting n-type carriers in the amorphous structure, and mobility is decreased.

Consequently, it is found that by adding Ti or Mo to the In—Ga—Zn—O based oxide semiconductor, n-type carriers become difficult to flow with increase of the concentration of Ti or Mo and the electrical conductivity is reduced in a film of the In—Ga—Zn—O based oxide semiconductor. Thus, by adding Ti or Mo, which is a transition metal element whose d orbital or f orbital is empty, to an oxide semiconductor layer, the electrical conductivity can be reduced; i.e., resistance can be increased.

Note that the source and drain electrode layers 405a and 405b are preferably formed using a material which includes a metal with high oxygen affinity. It is preferable that the metal with high oxygen affinity be one or more materials selected from titanium, aluminum, manganese, magnesium, zirconium, beryllium, and thorium.

The source and drain electrode layers 405a and 405b in contact with the buffer layer 404 are preferably formed using a metal with high oxygen affinity. As a metal with high oxygen affinity, a metal whose normal electrode potential is smaller than that of zinc can be given, such as titanium, aluminum, manganese, magnesium, zirconium, beryllium, or thorium. Alternatively, copper or the like may be used. Heat treatment or the like is performed under the condition where the metal with high oxygen affinity and the oxide semiconductor layer are in contact with each other, whereby in the buffer layer 404 which is an oxide semiconductor layer, the proportion of oxygen in the regions which are in contact with the source and drain electrode layers 405a and 405b is smaller than that in the other region. The regions with low oxygen concentration become a low resistance region because conductivity tends to increase in such a region. Note that the metal with high oxygen affinity is not limited to the above material.

The above phenomenon is caused by extraction of oxygen from the oxide semiconductor layer by the metal with high oxygen affinity. Thus, in the electrode layer, the proportion of oxygen in the region in contact with the oxide semiconductor layer is considered to be higher than that in the other region; that is, the electrode layer in the region in contact with the oxide semiconductor layer is oxidized. In consideration of this, the metal oxide formed in the region of the electrode layer, which is in contact with the oxide semiconductor layer preferably has a conductive property. For example, in the case of using titanium as a metal with high oxygen affinity, various kinds of treatment may be performed under the condition where an oxide whose composition ratio is close to that of monoxide (for example, in the case of $TiO_x$, the range of x is approximately $0.5<x<1.5$) is formed. This is because monoxide of titanium has a conductive property but dioxide of titanium has an insulating property.

Here, an effect of using a metal with high oxygen affinity as an electrode layer is described on the basis of computer simulation. This time, simulation was performed in the case where titanium was used as a metal with high affinity and an In—Ga—Zn—O based oxide semiconductor material was used for an oxide semiconductor layer; however, an embodiment of the disclosed invention in not limited thereto. Note that the composition ratio of the In—Ga—Zn—O based oxide semiconductor material was set to In:Ga:Zn:O=1:1:1:4.

First, an effect caused by extracting oxygen from an amorphous oxide semiconductor was examined.

An amorphous structure of an In—Ga—Zn—O based oxide semiconductor was prepared by a melt-quench method using classical molecular dynamics (MD) simulation. Here, the structure where the total number of atoms was 84 and the density was 5.9 g/cm$^3$ was calculated. Born-Mayer-Huggins potential was used for the interatomic potential between metal and oxygen and between oxygen and oxygen, and Lennard-Jones potential was used for the interatomic potential between metal and metal. NTV ensemble was used for calculation. Materials Explorer was used as a calculation program.

After that, the structure obtained by the above classical MD simulation was optimized by first principle calculation (quantum MD calculation) using a plane wave-pseudopotential method based on density functional theory (DFT), so that the density of states was calculated. In addition, structure optimization was also performed on a structure in which one of oxygen atoms was removed randomly, and the density of states was calculated. CASTEP was used as a calculation program, and GGA-PBE was used as an exchange-correlation functional.

Figure 33A:
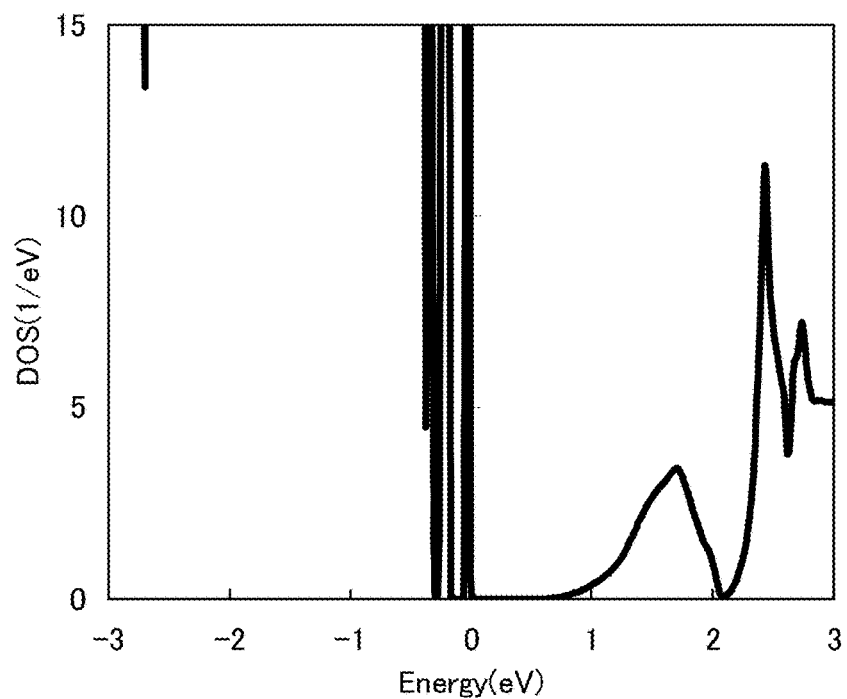
FIGS. 33A and 33B are graphs showing density of states by calculation.
Figure 33B:
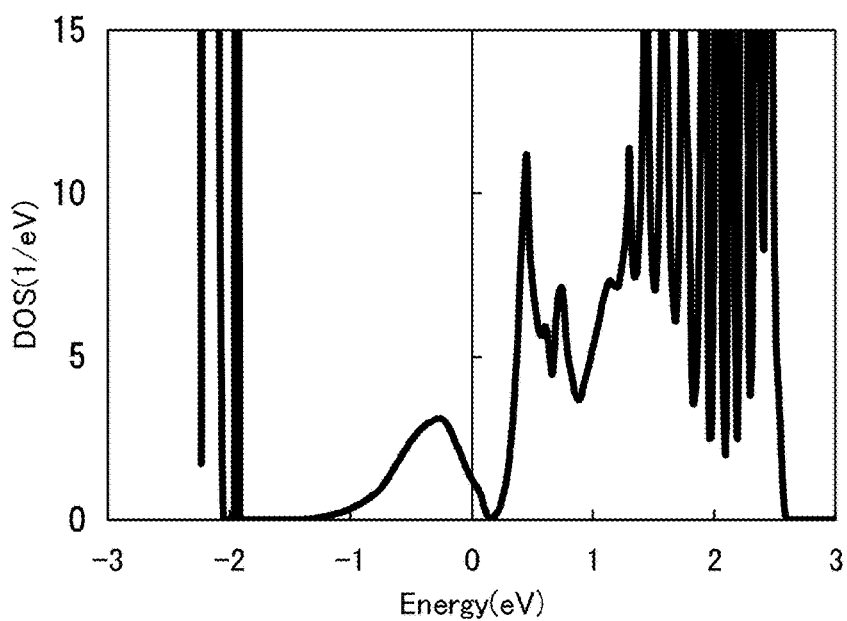

FIGS. 33A and 33B each show the density of states of the structure obtained by the above simulation. FIG. 33A shows the density of states of the structure without oxygen vacancy, and FIG. 33B shows the density of states of the structure with oxygen vacancy. Here, 0 (eV) represents energy corresponding to Fermi level. According to FIGS. 33A and 33B, Fermi level exists at the upper end of the valence band in the structure without oxygen vacancy, whereas Fermi level exists in the conduction band in the structure with oxygen vacancy. In the structure with oxygen vacancy, since Fermi level exists in the conduction band, the number of electrons contributing to conduction is increased, so that a structure having low resistance (i.e., high conductivity) can be obtained.

Next, movement of oxygen from the amorphous oxide semiconductor to a metal with high oxygen affinity was observed, by using the metal with high oxygen affinity as an electrode layer.

Here, titanium crystal was stacked over the In—Ga—Zn—O based amorphous structure obtained by the first principle calculation, and quantum MD calculation was performed on the structure by using NVT ensemble. CASTEP was used as a calculation program, and GGA-PBE was used as an exchange-correlation functional. The temperature condition was 623 K (350° C.).

Figure 34A:
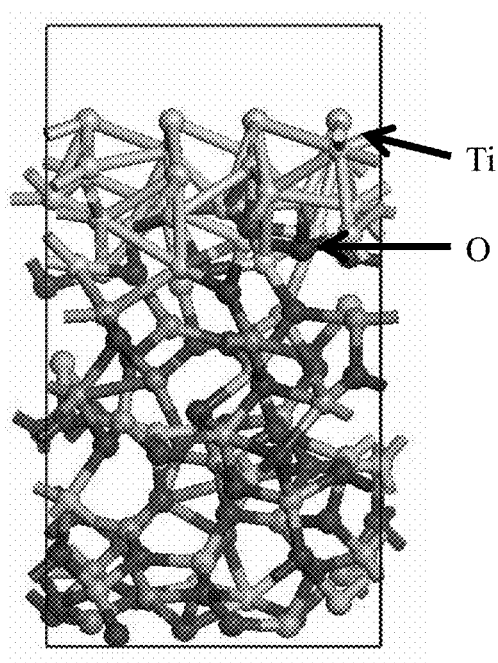
FIGS. 34A and 34B show a structure before and after calculation.
Figure 34B:
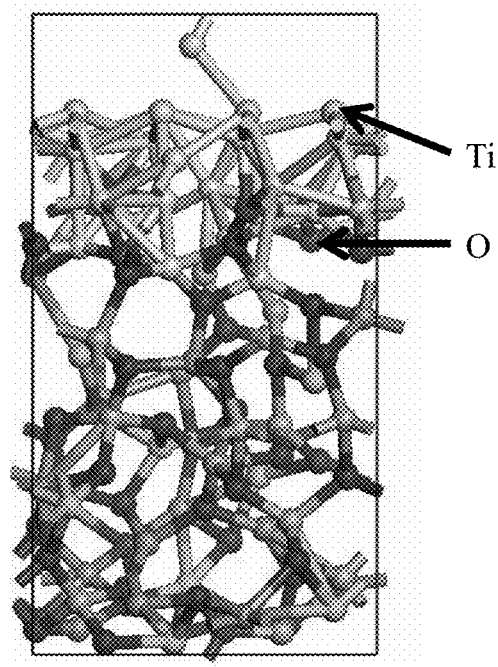

FIGS. 34A and 34B show structures before and after quantum MD calculation. FIG. 34A shows a structure before quantum MD calculation, and FIG. 34B shows the structure after quantum MD calculation. The number of oxygen atoms bonded to titanium atoms is increased in the structure after quantum MD calculation as compared to the structure before quantum MD calculation. The structure change indicates that oxygen atoms move from the amorphous oxide semiconductor layer to the metal layer with high oxygen affinity.

Figure 35:
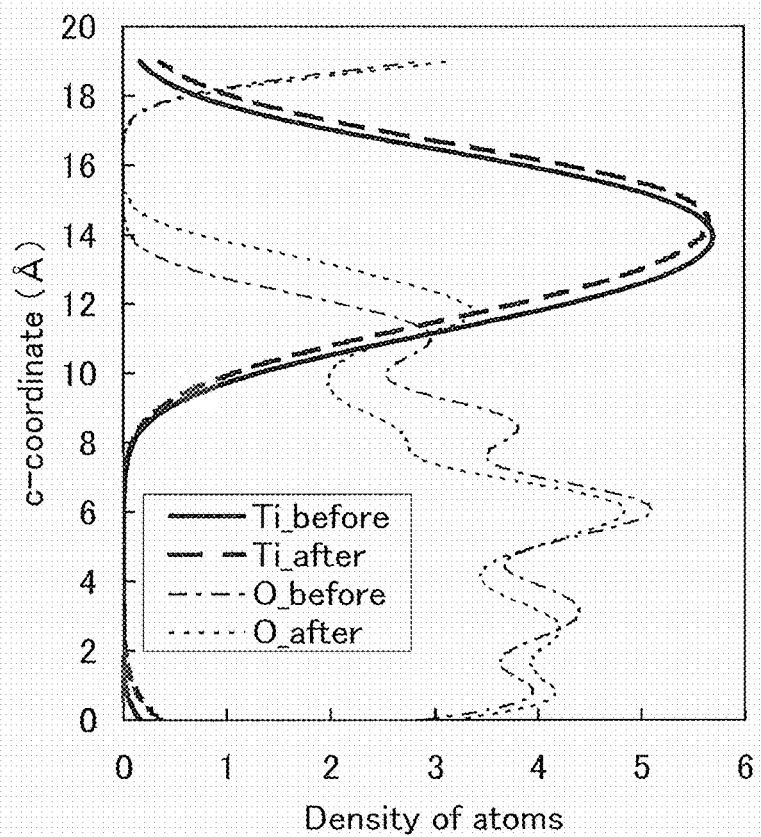
FIG. 35 is a graph showing density of atoms before and after calculation.

FIG. 35 shows the density of titanium and oxygen before and after quantum MD calculation. Curves represent the density of titanium before quantum MD calculation (Ti_before), the density of titanium after quantum MD calculation (Ti_after), the density of oxygen before quantum MD calculation (O_before), and the density of oxygen after quantum MD calculation (O_after). Also from FIG. 35, it is found that oxygen atoms move to the metal with high oxygen affinity.

As described above, the oxide semiconductor layer and the metal layer with high oxygen affinity were in contact with each other and heat treatment was performed, whereby movement of oxygen atoms was confirmed from the oxide semiconductor layer to the metal layer and the carrier density in the vicinity of interface was confirmed to be increased. This phenomenon indicates that a low resistance region is formed in the vicinity of the interface, which brings an effect of reduction of contact resistance between the semiconductor layer and the electrode layer.

As the semiconductor layer 403 including the channel formation region may be formed using an oxide material having semiconductor characteristics. For example, an oxide semiconductor whose composition formula is represented by $InMO_3(ZnO)_m$ (m>0) can be used, and an In—Ga—Zn—O based oxide semiconductor is preferably used. Note that M denotes one or more metal elements selected from gallium (Ga), iron (Fe), nickel (Ni), manganese (Mn), and cobalt (Co). For example, M denotes Ga in some cases; meanwhile, M denotes the above metal element such as Ni or Fe in addition to Ga (Ga and Ni or Ga and Fe) in other cases. Further, the above oxide semiconductor may contain Fe or Ni, another transitional metal element, or an oxide of the transitional metal as an impurity element in addition to the metal element contained as M. In this specification, among the oxide semiconductors whose composition formulas are represented by $InMO_3(ZnO)_m$ (m>0), an oxide semiconductor including at least Ga as M is referred to as an In—Ga—Zn—O based oxide semiconductor, and a thin film of the In—Ga—Zn—O based oxide semiconductor is referred to as an In—Ga—Zn—O-based non-single-crystal film.

As the oxide semiconductor which is applied to the oxide semiconductor layer, any of the following oxide semiconductors can be applied in addition to the above: an In—Sn—Zn—O based oxide semiconductor; an In—Al—Zn—O based oxide semiconductor; a Sn—Ga—Zn—O based oxide semiconductor; an Al—Ga—Zn—O based oxide semiconductor; a Sn—Al—Zn—O based oxide semiconductor; an In—Zn—O based oxide semiconductor; a Sn—Zn—O based oxide semiconductor; an Al—Zn—O based oxide semiconductor; an In—O based oxide semiconductor; a Sn—O based oxide semiconductor; and a Zn—O based oxide semiconductor.

FIGS. 2A to 2E are cross-sectional views illustrating manufacturing steps of the thin film transistor 470.

Figure 2A:
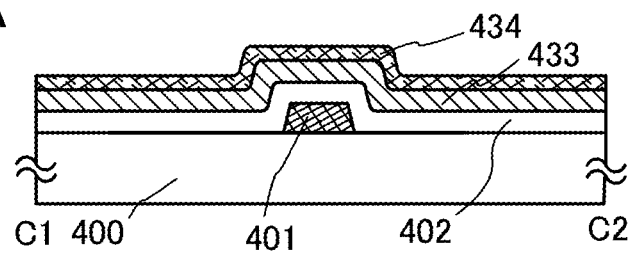
FIGS. 2A to 2E illustrates a method for manufacturing a semiconductor device.

In FIG. 2A, the gate electrode layer 401 is provided over the substrate 400 which is a substrate having an insulating surface. An insulating film serving as a base film may be provided between the substrate 400 and the gate electrode layer 401. The base film has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film. The gate electrode layer 401 can be formed to have a single-layer or stacked-layer structure using a metal material such as molybdenum, titanium, chromium, tantalum, tungsten, aluminum, copper, neodymium, or scandium, or an alloy material which contains any of these materials as its main component.

For example, as a two-layer structure of the gate electrode layer 401, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable.

The gate insulating layer 402 is formed over the gate electrode layer 401.

The gate insulating layer 402 can be formed using a silicon oxide layer, a silicon nitride layer, a silicon oxynitride layer, or a silicon nitride oxide layer to have a single-layer or stacked-layer structure by a plasma CVD method, a sputtering method, or the like. Alternatively, the gate insulating layer 402 can be formed using a silicon oxide layer by a CVD method with use of an organosilane gas. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Over the gate insulating layer 402, a first oxide semiconductor film 433 and a second oxide semiconductor film 434 are stacked in this order (see FIG. 2A).

Note that before the first oxide semiconductor film 433 is formed by a sputtering method, dust on a surface of the gate insulating layer 402 is preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to modify a surface.

Note that instead of an argon atmosphere, a nitrogen atmosphere, a helium atmosphere, or the like may be used. Alternatively, an argon atmosphere to which oxygen, $N_2O$, or the like is added may be used. Further alternatively, an argon atmosphere to which $Cl_2$, $CF_4$, or the like is added may be used.

An In—Ga—Zn—O based non-single-crystal film is used as the first oxide semiconductor film 433. The first oxide semiconductor film 433 is formed by a sputtering method with use of an In—Ga—Zn—O based oxide semiconductor target.

As the second oxide semiconductor film 434, an In—Ga—Zn—O based non-single-crystal film including titanium is used. The second oxide semiconductor film 434 is formed by a sputtering method with use of an In—Ga—Zn—O based oxide semiconductor target including titanium oxide.

The gate insulating layer 402, the first oxide semiconductor film 433, and the second oxide semiconductor film 434 may be formed successively without being exposed to the air. Successive film formation without being exposed to air makes it possible to obtain each interface of stacked layers, which are not contaminated by atmospheric components or impurity elements floating in air. Therefore, variation in characteristics of the thin film transistor can be reduced.

The first oxide semiconductor film 433 and the second oxide semiconductor film 434 are processed into the island-shaped semiconductor layer 403 which is an oxide semiconductor layer and an island-shaped oxide semiconductor layer 431 by a photolithography step.

Figure 2B:
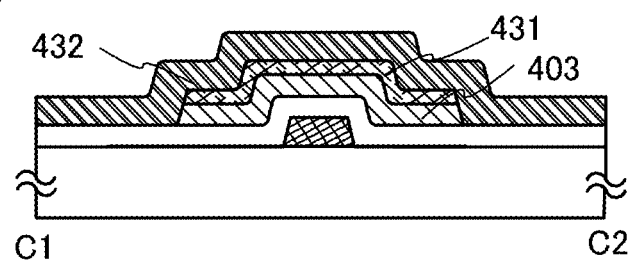

A conductive film 432 is formed over the gate insulating layer 402, the semiconductor layer 403, and the oxide semiconductor layer 431 (see FIG. 2B).

As a material of the conductive film 432, a film of titanium which is a metal with high oxygen affinity is used. In addition, an element selected from Al, Cr, Ta, Mo, and W, an alloy including any of the above elements, an alloy film including these elements in combination, and the like may be stacked over the titanium film.

Figure 2C:
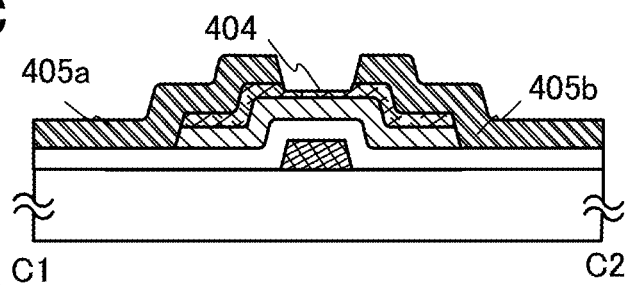
Figure 2D:
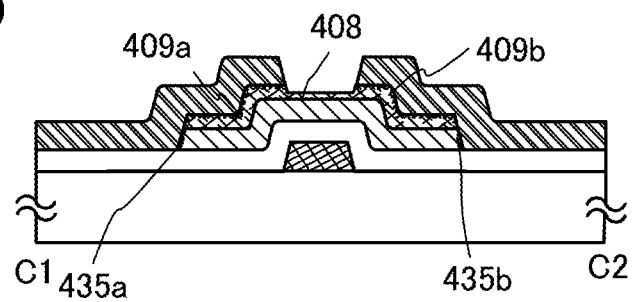

The oxide semiconductor layer 431 and the conductive film 432 are etched in an etching step, so that the buffer layer 404 and the source and drain electrode layers 405*a* and 405*b* are formed (see FIG. 2C). Note that the buffer layer 404 is partly etched, whereby the buffer layer 404 has a groove (a depressed portion).

Next, heat treatment is performed on the buffer layer 404 which is an oxide semiconductor layer and the source and drain electrode layers 405*a* and 405*b*. By heat treatment, oxygen atoms move from the oxide semiconductor layer to a metal layer, whereby resistance of the first regions 409a and 409b which are in contact with the source and drain electrode layers 405a and 405b is reduced. In contrast, the second region 408 which is in contact with the channel formation region of the semiconductor layer 403 keeps resistance high. Thus, the first regions 409a and 409b which are low resistance regions and the second region 408 which is a high resistance region are formed in the buffer layer 404 (see FIG. 2D). Moreover, by this heat treatment, also in the semiconductor layer 403, oxygen atoms in regions which are in contact with the source and drain electrode layers 405a and 405b move from the oxide semiconductor layer to the metal layer, so that the low resistance regions 435a and 435b are formed.

Heat treatment is preferably performed at 200° C. to 600° C., typically 300° C. to 500° C. For example, heat treatment is performed at 350° C. for an hour under a nitrogen atmosphere.

Figure 2E:
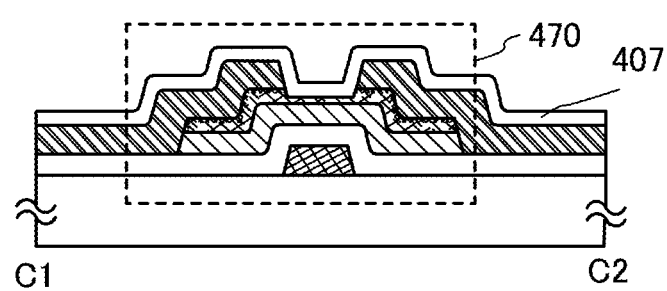

Through the above steps, the inverted staggered thin film transistor 470 illustrated in FIG. 2E can be completed. In addition, the insulating film 407 is formed so as to cover the thin film transistor 470 and be in contact with the buffer layer 404.

The region in the buffer layer which is in contact with the channel formation region is a high resistance region; thus, the buffer layer of the high resistance region can make the electric characteristics of the thin film transistor stable and prevent off current from increasing. In contrast, the regions in the buffer layer which are in contact with the source and drain electrode layers are low resistance regions; thus, the buffer layer of the low resistance regions can reduce contact resistance and increase on current. Therefore, a semiconductor device including a thin film transistor having high electric characteristics and high reliability can be provided.

(Embodiment 2)

In Embodiment 2, an example of a semiconductor device including a thin film transistor will be described with reference to FIGS. 3A and 3B and FIGS. 4A to 4E. In the thin film transistor of this embodiment, the oxide semiconductor layer including a channel formation region and the buffer layer described in Embodiment 1 are separately processed in different etching steps from each other. Note that except for formation of the oxide semiconductor layer and the buffer layer, the thin film transistor can be formed in a manner similar to Embodiment 1; thus, repetitive description of the same components or components having similar functions as in Embodiment 1 and manufacturing steps of forming those components will be omitted.

Figure 3A:
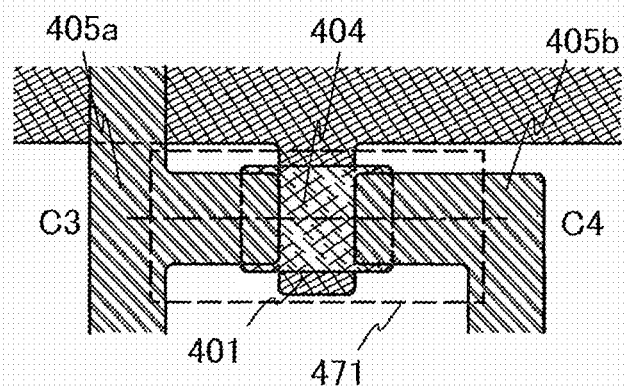
FIGS. 3A and 3B illustrate a semiconductor device.
Figure 3B:
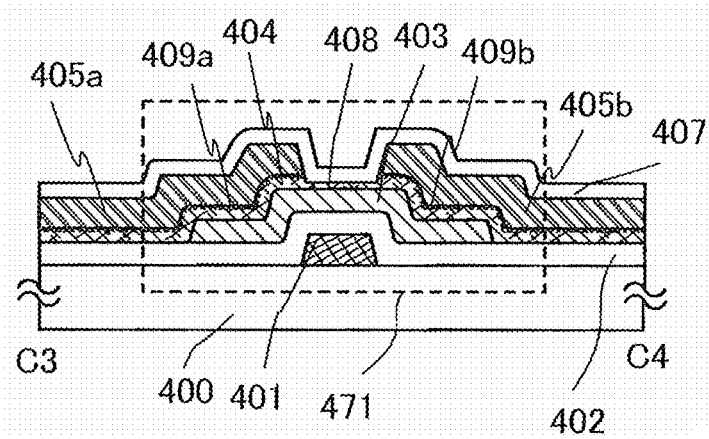

FIG. 3A is a plan view of a thin film transistor 471 included in a semiconductor device, and FIG. 3B is a cross-sectional view along line C3-C4 of FIG. 3A. The thin film transistor 471 is an inverted staggered thin film transistor and includes, over a substrate 400 which is a substrate having an insulating surface, a gate electrode layer 401, a gate insulating layer 402, a semiconductor layer 403, a buffer layer 404, and source and drain electrode layers 405a and 405b. In addition, an insulating film 407 is provided so as to cover the thin film transistor 471 and be in contact with the buffer layer 404.

The buffer layer 404 includes first regions 409a and 409b which are low resistance regions and in contact with the source and drain electrode layers 405a and 405b, and a second region 408 which is a high resistance region and in contact with a channel formation region of the semiconductor layer 403.

In the thin film transistor 471, the buffer layer 404 is formed to cover end portions of the semiconductor layer 403 and extend below the source and drain electrode layers 405a and 405b.

FIGS. 4A to 4E are cross-sectional views illustrating manufacturing steps of the thin film transistor 471.

The gate electrode layer 401 is over the substrate 400 which is a substrate having an insulating surface. The gate insulating layer 402 is formed over the gate electrode layer 401.

Figure 4A:
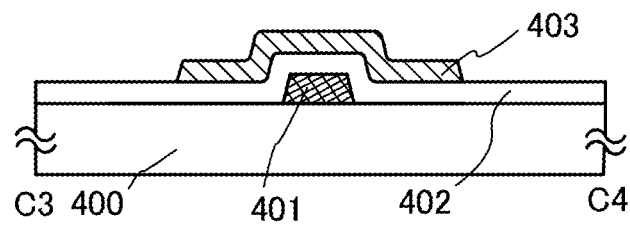
FIGS. 4A to 4E illustrate a method for manufacturing a semiconductor device.

Over the gate insulating layer 402, an oxide semiconductor film is formed and then etched to have an island shape, so that the semiconductor layer 403 is formed (see FIG. 4A).

Figure 4B:
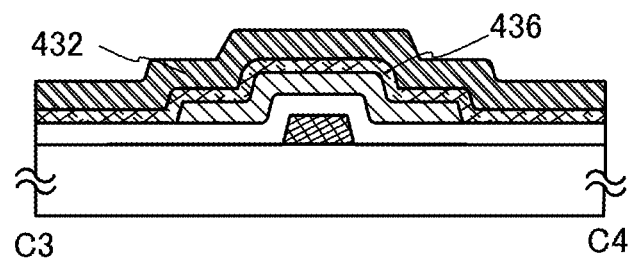

An oxide semiconductor film 436 is formed so as to cover the island-shaped oxide semiconductor layer 403, and a conductive film 432 is stacked over the oxide semiconductor film 436 (see FIG. 4B). The oxide semiconductor film 436 is the same film as the second oxide semiconductor film 434 in Embodiment 1, which is an In—Ga—Zn—O based non-single-crystal film including titanium. The oxide semiconductor film 436 is formed by a sputtering method with use of an In—Ga—Zn—O target including titanium oxide.

As a material of the conductive film 432, a film of titanium which is a metal with high oxygen affinity is used.

Figure 4C:
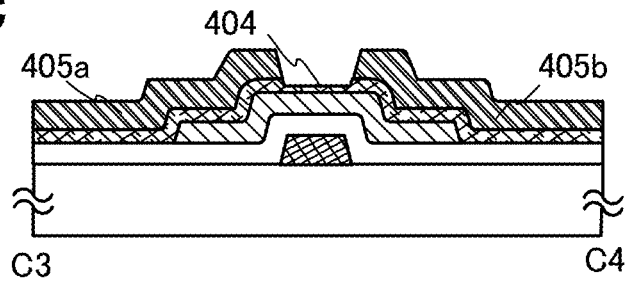
Figure 4D:
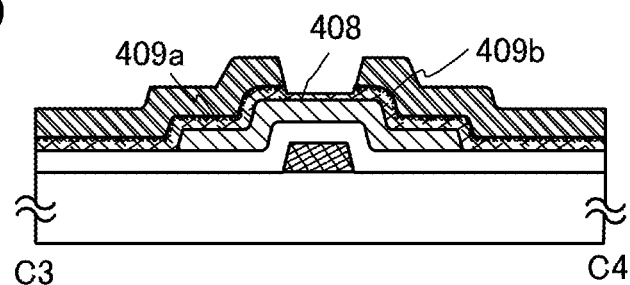

The oxide semiconductor film 436 and the conductive film 432 are etched in an etching step, so that the buffer layer 404 and the source and drain electrode layers 405a and 405b are formed (see FIG. 4C). Note that the buffer layer 404 is partly etched, whereby the buffer layer 404 has a groove (a depressed portion).

Next, heat treatment is performed on the buffer layer 404 which is an oxide semiconductor layer and the source and drain electrode layers 405a and 405b. By heat treatment, oxygen atoms move from the oxide semiconductor layer to the metal layer, whereby resistance of the first regions 409a and 409b which are in contact with the source and drain electrode layers 405a and 405b is reduced. In contrast, the second region 408 which is in contact with the channel formation region of the semiconductor layer 403 keeps resistance high. Thus, the first regions 409a and 409b which are low resistance regions and the second region 408 which is a high resistance region are formed in the buffer layer 404 (see FIG. 4D).

Heat treatment is preferably performed at 200° C. to 600° C., typically 300° C. to 500° C. For example, heat treatment is performed at 350° C. for an hour under a nitrogen atmosphere.

Figure 4E:
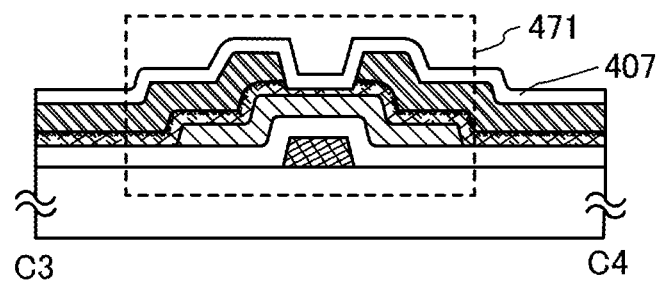

Through the above steps, the inverted staggered thin film transistor 471 illustrated in FIG. 4E can be completed. In addition, the insulating film 407 is formed so as to cover the thin film transistor 471 and be in contact with the buffer layer 404.

In such a manner, the order of etching steps in the manufacturing process of the thin film transistor is changed, whereby a variety of thin film transistors having different shapes can be manufactured.

The region in the buffer layer which is in contact with the channel formation region is a high resistance region; thus, the buffer layer of the high resistance region can make the electric characteristics of the thin film transistor stable and prevent off current from increasing. In contrast, the regions in the buffer layer which are in contact with the source and drain electrode layers are low resistance regions; thus, the buffer layer of the low resistance regions can reduce contact resistance and increase on current. Therefore, a semiconductor device including a thin film transistor having high electric characteristics and high reliability can be provided.

(Embodiment 3)

Another example of a semiconductor device and a manufacturing method thereof will be described with reference to FIGS. 5A and 5B and FIGS. 6A to 6E. In this embodiment, an example in which a material of the buffer layer and a manufacturing method thereof are different from those of Embodiments 1 and 2 is described. Note that except for the buffer layer, a thin film transistor of this embodiment can be formed in a manner similar to Embodiments 1 and 2, and repetitive description of the same portions as or portions having functions similar to those in Embodiments 1 and 2 and manufacturing steps will be omitted.

Figure 5A:
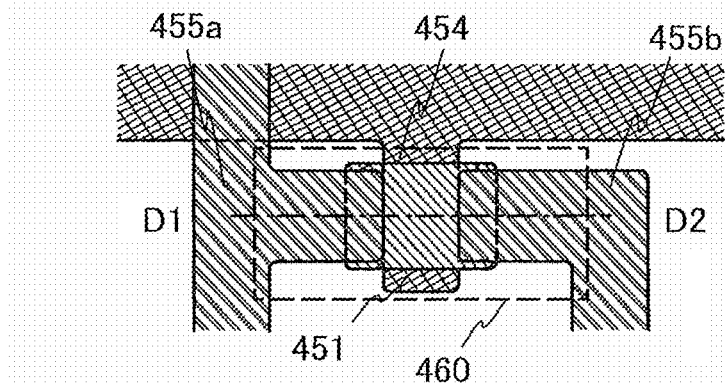
FIGS. 5A and 5B illustrate a semiconductor device.
Figure 5B:
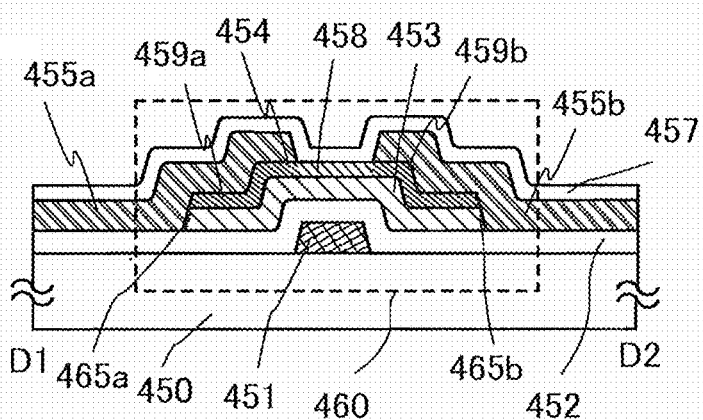

FIG. 5A is a plan view of a thin film transistor 460 included in a semiconductor device, and FIG. 5B is a cross-sectional view along line D1-D2 of FIG. 5A. The thin film transistor 460 is an inverted staggered thin film transistor and includes, over a substrate 450 which is a substrate having an insulating surface, a gate electrode layer 451, a gate insulating layer 452, a semiconductor layer 453, a buffer layer 454, and source and drain electrode layers 455a and 455b. In addition, an insulating film 457 is provided so as to cover the thin film transistor 460 and be in contact with the buffer layer 454.

The buffer layer 454 includes first regions 459a and 459b which are low resistance regions and in contact with the source and drain electrode layers 455a and 455b and a second region 458 which is a high resistance region and in contact with a channel formation region of the semiconductor layer 453.

A film of the buffer layer 454 has resistance distribution. The second region 458 provided over the channel formation region of the semiconductor layer 453 has lower electrical conductivity than the channel formation region of the semiconductor layer 453. The first regions 459a and 459b in contact with the source and drain electrode layers 455a and 455b have higher electrical conductivity than the channel formation region of the semiconductor layer 453. The buffer layer 454 and the semiconductor layer 453 have higher electrical conductivity (i.e., lower resistance) than the gate insulating layer 452. Thus, the descending order of electrical conductivity in respective portions is as follows: electrical conductivity in the low resistance regions of the buffer layer 454 (the first regions 459a and 459b), that in the channel formation region of the semiconductor layer 453, that in the high resistance region of the buffer layer 454 (the second region 458), and that in the gate insulating layer 452.

In the buffer layer 454, the first regions 459a and 459b having low resistance are formed as metal regions and the second region 458 having high resistance is formed as a metal oxide region. Such a buffer layer 454 can be formed as follows: a metal film is formed; and oxidation treatment is selectively performed on the metal film.

FIGS. 6A to 6E are cross-sectional views illustrating manufacturing steps of the thin film transistor 460.

The gate electrode layer 451 is formed over the substrate 450, and the gate insulating layer 452 is formed over the gate electrode layer 451.

Figure 6A:
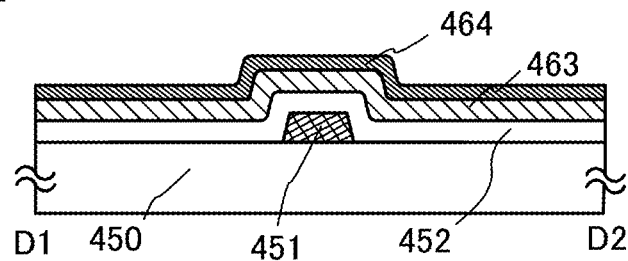
FIGS. 6A to 6E illustrate a method for manufacturing a semiconductor device.

Over the gate insulating layer 452, an oxide semiconductor film 463 is formed, and a metal film 464 is stacked over the oxide semiconductor film 463 (see FIG. 6A).

As the oxide semiconductor film 463, an In—Ga—Zn—O based non-single-crystal film is used. The oxide semiconductor film 463 is formed by a sputtering method with use of an In—Ga—Zn—O based oxide semiconductor target.

The metal film 464 may be formed using a material which can be subjected to oxidation treatment selectively in a formation process of the high resistance region, and tantalum (Ta) or aluminum (Al) can be used. As the metal film 464, a tantalum film is formed.

The oxide semiconductor film 463 and the metal film 464 are processed into a semiconductor layer 453 which is an island-shaped oxide semiconductor layer and an island-shaped buffer layer 454 by a photolithography step.

Figure 6B:
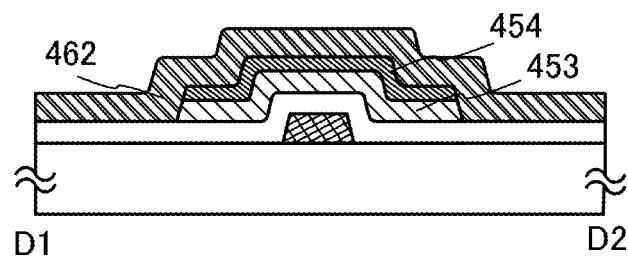

A conductive film 462 is formed over the gate insulating layer 452, the semiconductor layer 453, and the buffer layer 454 (see FIG. 6B).

Figure 6C:
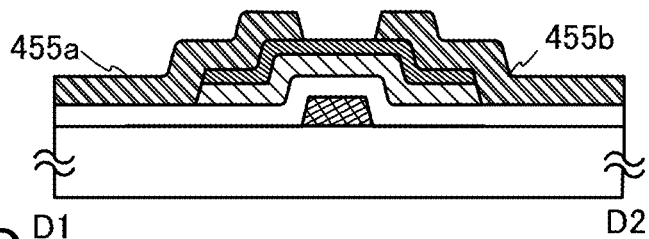
Figure 6D:
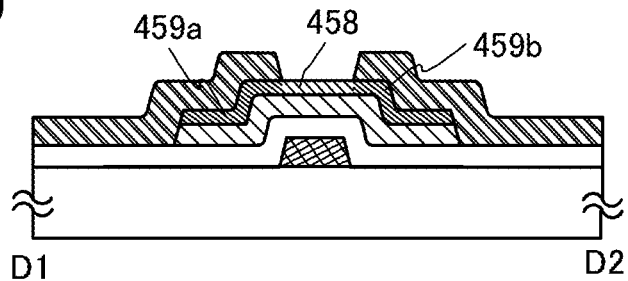

The conductive film 462 is etched in an etching step, so that the source and drain electrode layers 455a and 455b are formed (see FIG. 6C).

Next, oxidation treatment is performed selectively on the buffer layer 454. Modification treatment by plasma treatment or chemical treatment may be performed as oxidation treatment. The region in the buffer layer 454, which is not covered with the source and drain electrode layers 455a and 455b, is subjected to oxygen plasma treatment as oxidation treatment, so that a high resistance metal oxide region is formed. This metal oxide region is the second region 458 in the buffer layer 454, which is in contact with the channel formation region of the semiconductor layer 453. On the other hand, since the first regions 459a and 459b which are in contact with the source and drain electrode layers 455a and 455b are not subjected to oxidation treatment, the first regions 459a and 459b keep the metal region having low resistance. Accordingly, in the buffer layer 454, the first regions 459a and 459b which are low resistance regions and the second region 458 which is a high resistance region are formed (see FIG. 6D).

After that, heat treatment is preferably performed at 200° C. to 600° C., typically 300° C. to 500° C. For example, heat treatment is performed at 350° C. for an hour under a nitrogen atmosphere. By this heat treatment, rearrangement at an atomic level of the In—Ga—Zn—O based oxide semiconductor included in the semiconductor layer 453 is performed. This heat treatment (including optical annealing) can release strain energy which inhibits carrier movement in the semiconductor layer 453. Note that there is no particularly limitation on the timing of the above heat treatment as long as it is after the formation of the oxide semiconductor film 463.

Moreover, a film of titanium which is a metal with high oxygen affinity is used for the source and drain electrode layers 455a and 455b. Thus, by this heat treatment, oxygen atoms in the regions of the semiconductor layer 453, which are in contact with the source and drain electrode layers 455a and 455b, move from the oxide semiconductor layer to the metal layer as in Embodiments 1 and 2. Accordingly, the low resistance regions 465a and 465b are formed.

Figure 6E:
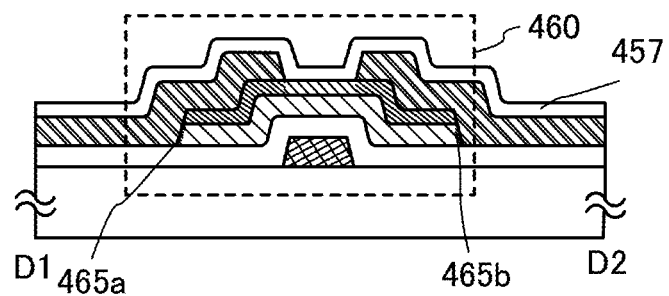

Through the above steps, as illustrated in FIG. 6E, the inverted staggered thin film transistor 460 in which the semiconductor layer 453 includes a channel formation region can be completed. In addition, the insulating film 457 is formed so as to cover the thin film transistor 460 and be in contact with the buffer layer 454.

The region in the buffer layer which is in contact with the channel formation region is a high resistance region; thus, the buffer layer of the high resistance region can make the electric characteristics of the thin film transistor stable and prevent off current from increasing. In contrast, the regions in the buffer layer which are in contact with the source and drain electrode layers are low resistance regions; thus, the buffer layer of the low resistance regions can reduce contact resistance and increase on current. Therefore, a semiconductor device including a thin film transistor having high electric characteristics and high reliability can be provided.

(Embodiment 4)

In Embodiment 4, an example of a semiconductor device including a thin film transistor will be described with reference to FIGS. 7A and 7B and FIGS. 8A to 8E. In the thin film transistor of this embodiment, the oxide semiconductor layer including a channel formation region and the buffer layer described in Embodiment 3 are processed in different etching steps from each other. Note that except for formation of the oxide semiconductor layer and the buffer layer, the thin film transistor can be formed in a manner similar to Embodiment 3, and repetitive description of the same portions as or portions having functions similar to those in Embodiment 3 and manufacturing steps will be omitted.

Figure 7A:
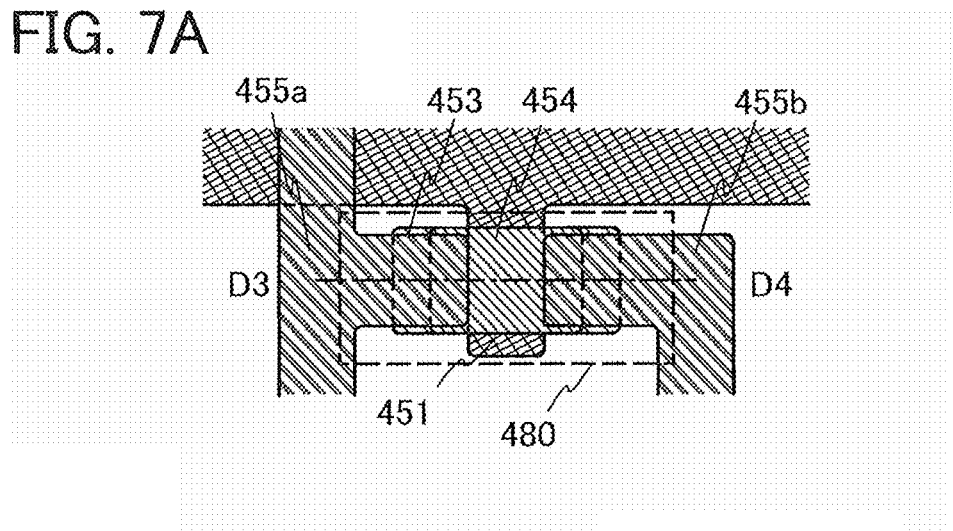
FIGS. 7A and 7B illustrate a semiconductor device.
Figure 7B:
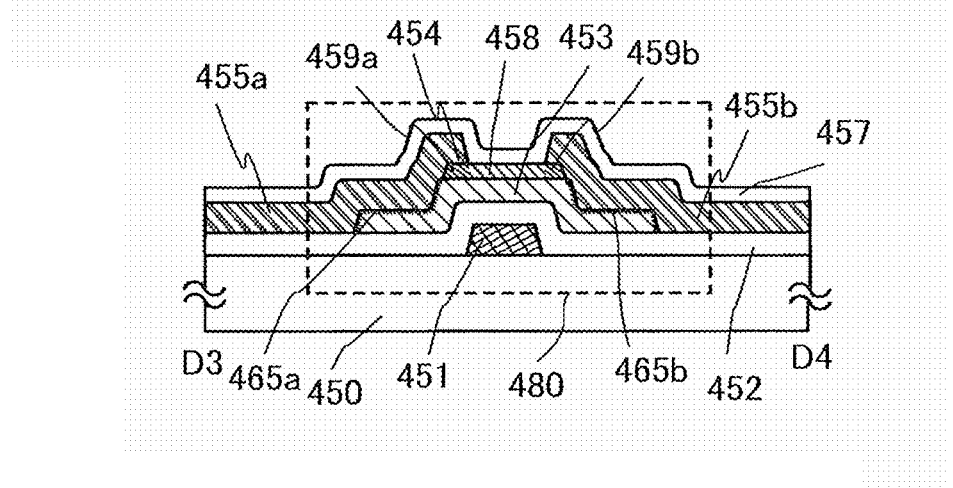

FIG. 7A is a plan view of a thin film transistor 480 included in a semiconductor device, and FIG. 7B is a cross-sectional view along line D3-D4 of FIG. 7A. The thin film transistor 480 is an inverted staggered thin film transistor and includes, over a substrate 450 which is a substrate having an insulating surface, a gate electrode layer 451, a gate insulating layer 452, a semiconductor layer 453, a buffer layer 454, and source and drain electrode layers 455a and 455b. In addition, an insulating film 457 is provided so as to cover the thin film transistor 480 and be in contact with the buffer layer 454.

The buffer layer 454 includes first regions 459a and 459b which are low resistance regions and in contact with the source and drain electrode layers 455a and 455b and a second region 458 which is a high resistance region and in contact with a channel formation region of the semiconductor layer 453.

The buffer layer 454 is formed so as to selectively cover the channel formation region of the semiconductor layer 453 and its vicinity. In the semiconductor layer 453, exposed regions which are not covered with the buffer layer 454 are in direct contact with the source and drain electrode layers 455a and 455b. The regions which are in contact with the source and drain electrode layers 455a and 455b are low resistance regions 465a and 465b.

In the buffer layer 454, the first regions 459a and 459b having low resistance are formed as metal regions, and the second region 458 having high resistance is formed as a metal oxide region. Such a buffer layer 454 can be formed as follows: a metal film is formed; and oxidation treatment is selectively performed on the metal film.

FIGS. 8A to 8E are cross-sectional views illustrating manufacturing steps of the thin film transistor 480.

The gate electrode layer 451 is formed over the substrate 450, and the gate insulating layer 452 is formed over the gate electrode layer 451.

An oxide semiconductor film is formed over the gate insulating layer 452 and processed to have an island shape by a photolithography step, so that the semiconductor layer 453 is formed. A metal film 464 is formed using a tantalum film over the semiconductor layer 453 (see FIG. 8A). A tantalum film is formed as the metal film 464.

The metal film 464 is processed by a photolithography step, so that the buffer layer 454 covering the semiconductor layer 453 selectively is formed. The buffer layer 454 is selectively formed so as to cover the channel formation region of the semiconductor layer 453 and its vicinity.

Figure 8A:
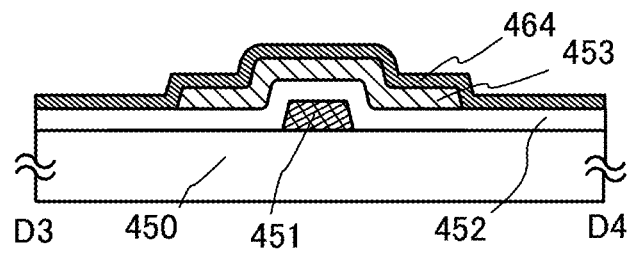
FIGS. 8A to 8E illustrate a method for manufacturing a semiconductor device.
Figure 8B:
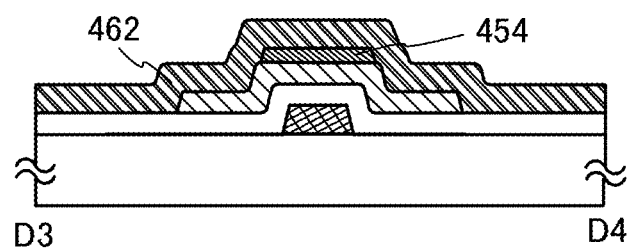

A conductive film 462 is formed over the gate insulating layer 452, the semiconductor layer 453, and the buffer layer 454 (see FIG. 8B).

Figure 8C:
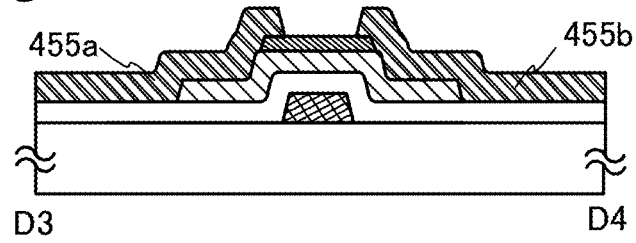
Figure 8D:
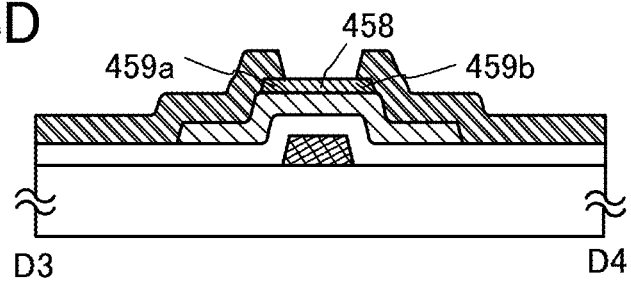

The conductive film 462 is etched in an etching step, so that the source and drain electrode layers 455a and 455b are formed (see FIG. 8C).

Next, insulating treatment is selectively performed on the buffer layer 454. The region of the buffer layer 454, which is not covered with the source and drain electrode layers 455a and 455b, is subjected to oxygen plasma treatment as oxidation treatment, so that a high resistance metal oxide region is formed. In the buffer layer 454, this metal oxide region is the second region 458 which is in contact with the channel formation region of the semiconductor layer 453. On the other hand, since the first regions 459a and 459b which are in contact with the source and drain electrode layers 455a and 455b are not subjected to oxidation treatment, the first regions 459a and 459b keep the metal region having low resistance. Accordingly, in the buffer layer 454, the first regions 459a and 459b which are low resistance regions and the second region 458 which is a high resistance region are formed (see FIG. 8D).

After that, heat treatment is preferably performed at 200° C. to 600° C., typically 300° C. to 500° C. For example, heat treatment is performed at 350° C. for an hour under a nitrogen atmosphere.

Moreover, a film of titanium which is a metal with high oxygen affinity is used for the source and drain electrode layers 455a and 455b. Thus, by this heat treatment, oxygen atoms in the regions of the semiconductor layer 453, which are in contact with the source and drain electrode layers 455a and 455b, move from the oxide semiconductor layer to the metal layer as in Embodiments 1 and 2. Accordingly, the low resistance regions 465a and 465b are formed.

Figure 8E:
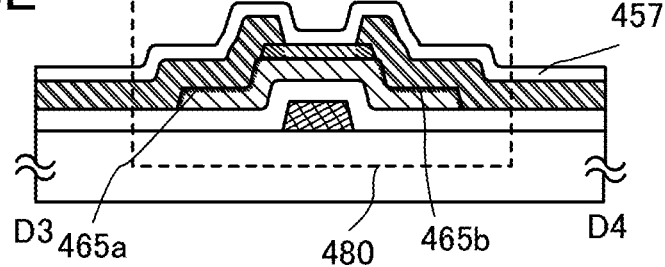
Figure 12:
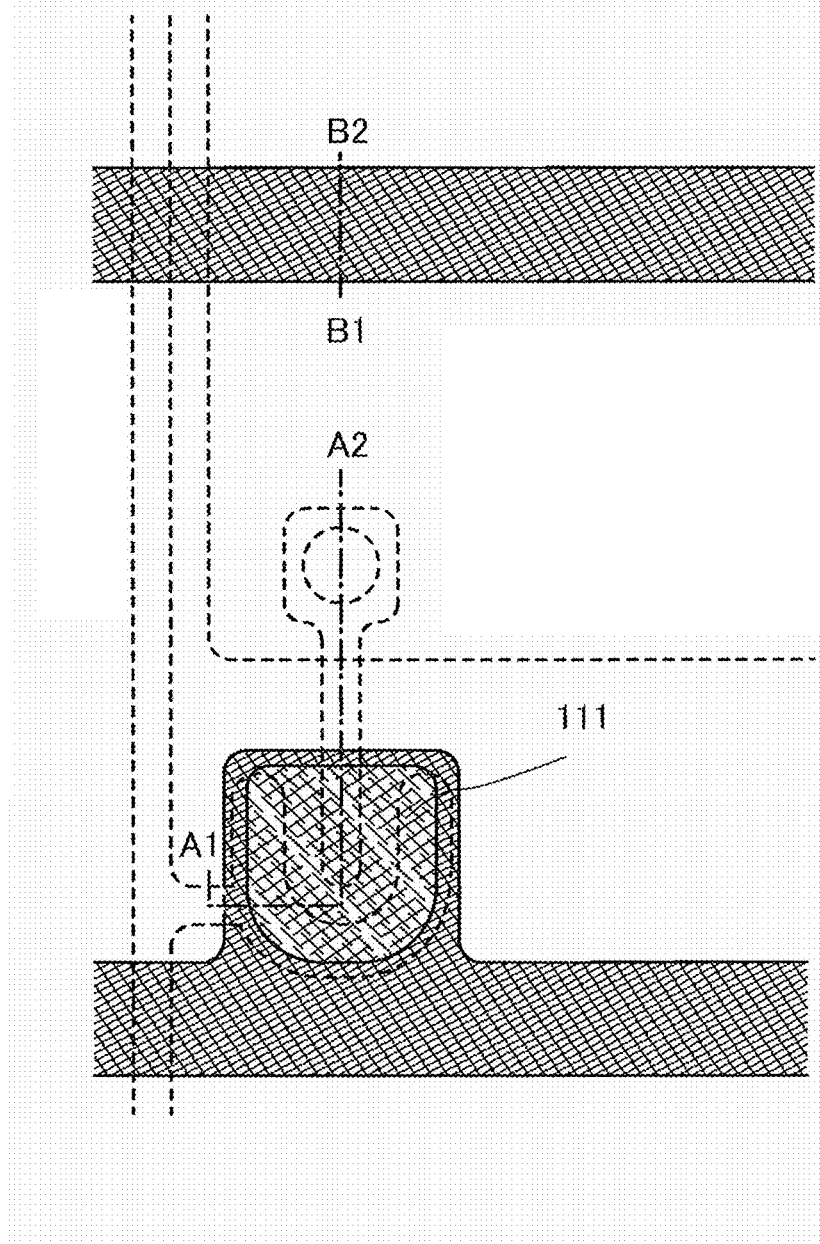
FIG. 12 illustrates a method for manufacturing a semiconductor device.

Through the above steps, as illustrated in FIG. 8E, the inverted staggered thin film transistor 480 in which the semiconductor layer 453 includes a channel formation region can be completed. In addition, the insulating film 457 is formed so as to cover the thin film transistor 480 and be in contact with the buffer layer 454.

In such a manner, the order of etching steps in the manufacturing process of the thin film transistor is changed, whereby a variety of thin film transistors having different shapes can be manufactured.

The region in the buffer layer which is in contact with the channel formation region is a high resistance region; thus, the buffer layer of the high resistance region can make the electric characteristics of the thin film transistor stable and prevent off current from increasing. In contrast, the regions in the buffer layer which are in contact with the source and drain electrode layers are low resistance regions; thus, the buffer layer of the low resistance regions can reduce contact resistance and increase on current. Therefore, a semiconductor device including a thin film transistor having high electric characteristics and high reliability can be provided.

(Embodiment 5)

Manufacturing steps of a semiconductor device including a thin film transistor will be described with reference to FIGS. 9A to 9C, FIGS. 10A to 10C, FIG. 11, FIG. 12, FIG. 13, FIG. 14, FIGS. 15A1 and A2 and 15B1 and B2, and FIG. 16.

In FIG. 9A, a glass substrate of barium borosilicate glass, aluminoborosilicate glass, or the like can be used as a substrate 100 having a light-transmitting property.

Next, a conductive layer is formed entirely over a surface of the substrate 100, and then a first photolithography step is performed. A resist mask is formed, and an unnecessary portion is removed by etching, so that wirings and electrodes (a gate wiring including a gate electrode layer 101, a capacitor wiring 108, and a first terminal 121) are formed. At this time, the etching is performed so that at least end portions of the gate electrode layer 101 have a tapered shape.

A cross-sectional view at this stage is illustrated in FIG. 9A. A plan view at this stage is illustrated in FIG. 11.

Each of the gate wiring including the gate electrode layer 101, the capacitor wiring 108, and the first terminal 121 at a terminal portion is preferably formed using a heat-resistant conductive material such as an element selected from titanium (Ti), tantalum (Ta), tungsten (W), molybdenum (Mo), chromium (Cr), neodymium (Nd), and scandium (Sc); an alloy containing any of these elements as its component; an alloy film containing a combination of any of these elements; or a nitride containing any of these elements as its component. In the case of using a low-resistant conductive material such as aluminum (Al) or copper (Cu), the low-resistant conductive material is used in combination with the above heat-resistant conductive material because Al alone has problems of low heat resistance, being easily corroded, and the like.

Next, a gate insulating layer 102 is formed throughout the surface over the gate electrode layer 101. The gate insulating layer 102 is formed to a thickness of 50 to 250 nm by a sputtering method or the like.

For example, as the gate insulating layer 102, a silicon oxide film is formed to a thickness of 100 nm by a sputtering method. Needless to say, the gate insulating layer 102 is not limited to such a silicon oxide film and may be a single layer or a stack of layers including another insulating film, such as a silicon oxynitride film, a silicon nitride film, an aluminum oxide film, or a tantalum oxide film.

Next, a first oxide semiconductor film 133 (a first In—Ga—Zn—O based non-single-crystal film) is formed over the gate insulating layer 102. Formation of the first In—Ga—Zn—O based non-single-crystal film without exposure to air after plasma treatment is effective in preventing powder substances (also called particles or dust) from attaching to the interface between the gate insulating layer and the semiconductor film. Here, the first In—Ga—Zn—O based non-single-crystal film is formed in an argon or oxygen atmosphere with use of an oxide semiconductor target having a diameter of 8 inches and containing In, Ga, and Zn (the composition ratio is set to $In_2O_3$:$Ga_2O_3$:ZnO=1:1:1), with the distance between the substrate and the target set to 170 mm, under a pressure of 0.4 Pa, and with a direct-current (DC) power source of 0.5 kW. Note that a pulse direct current (DC) power source is preferable because dust can be reduced and the film thickness can be uniform. The first In—Ga—Zn—O based non-single-crystal film has a thickness of 5 nm to 200 nm. Here, the thickness of the first In—Ga—Zn—O based non-single-crystal film is 100 nm.

Next, a second oxide semiconductor film 134 including titanium (an In—Ga—Zn—O based non-single-crystal film including titanium) is formed by a sputtering method without exposure to air (see FIG. 9B). The second oxide semiconductor film 134 is formed by a sputtering method with use of an In—Ga—Zn—O based oxide semiconductor target including titanium.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Moreover, there are a sputtering apparatus provided with a magnet system inside the chamber and used for a magnetron sputtering, and a sputtering apparatus used for an ECR sputtering in which plasma generated with use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

Next, a second photolithography step is performed. A resist mask is formed, and the first oxide semiconductor film 133 and the second oxide semiconductor film 134 are etched. For example, unnecessary portions are removed by wet etching using a mixed solution of phosphoric acid, acetic acid, and nitric acid, so that a semiconductor layer 103 and an oxide semiconductor layer 111 are formed. Note that etching here is not limited to wet etching but dry etching may also be performed. Note that a plan view at this stage corresponds to FIG. 12.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a solution obtained by mixing phosphoric acid, acetic acid, and nitric acid, an ammonia peroxide mixture (hydrogen peroxide:ammonia:water=5:2:2), or the like can be used. In addition, ITO07N (produced by KANTO CHEMICAL CO., INC.) may also be used.

The etchant used in the wet etching is removed by cleaning together with the material which is etched off. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

Next, a third photolithography step is performed. A resist mask is formed, and unnecessary portions are removed by etching, whereby a contact hole that reaches the electrode layer or the wiring which is formed from the same material as the gate electrode layer 101 is formed. The contact hole is provided for direct connection with a conductive film to be formed later. For example, a contact hole is formed when a thin film transistor in which a gate electrode layer is in direct contact with a source or drain electrode layer in a driver circuit portion is formed, or when a terminal that is electrically connected to a gate wiring of a terminal portion is formed.

Then, a conductive film 132 made of a metal material is formed over the semiconductor layer 103 and the oxide semiconductor layer 111 by a sputtering method or a vacuum evaporation method (see FIG. 9C).

As a material of the conductive film 132, a film of titanium which is a metal with high oxygen affinity is used. In addition, an element selected from Al, Cr, Ta, Mo, and W, an alloy including any of the above elements, an alloy film including these elements in combination, and the like may be stacked over the titanium film.

Next, a fourth photolithography step is performed. A resist mask 131 is formed, and unnecessary portions are removed by etching, whereby source and drain electrode layers 105a and 105b, a buffer layer 104, and a second terminal 122 are formed (see FIG. 10A). Wet etching or dry etching is employed as an etching method at this time. For example, when an aluminum film or an aluminum-alloy film is used as the conductive film 132, wet etching using a mixed solution of phosphoric acid, acetic acid, and nitric acid can be carried out. Here, by wet etching using an ammonia hydrogen peroxide mixture (with the ratio of hydrogen peroxide:ammonia:water=5:2:2), the conductive film 132 of a Ti film is etched to form the source and drain electrode layers 105a and 105b. In this etching, an exposed region of the oxide semiconductor layer 111 is partly etched, whereby the buffer layer 104 is formed. Thus, a region (second region 112) of the buffer layer 104 has a small thickness, which is between the source and drain electrode layers 105a and 105b and over a channel formation region of the semiconductor layer 103. In FIG. 10A, etching for forming the source and drain electrode layers 105a and 105b and the buffer layer 104 is performed at a time by using an etchant of an ammonia hydrogen peroxide mixture. Accordingly, an end portion of the source or drain electrode layer 105a and an end portion of the source or drain electrode layer 105b are aligned with end portions of the buffer layer 104; thus, continuous structures are formed. In addition, wet etching allows the layers to be etched isotropically, so that the end portions of the source and drain electrode layers 105a and 105b are recessed from the resist mask 131.

Then, the resist mask 131 is removed, and heat treatment is performed on the buffer layer 104 which is an oxide semiconductor layer and the source and drain electrode layers 105a and 105b. By heat treatment, oxygen atoms move from the oxide semiconductor layer to the metal layer; thus, resistance of first regions 109a and 109b which are in contact with the source and drain electrode layers 105a and 105b is reduced. In contrast, the second region 112 which is in contact with the channel formation region of the semiconductor layer 103 keeps resistance high. As a result, in the buffer layer 104, the first regions 109a and 109b which are low resistance regions and the second region 112 which is a high resistance region are formed (see FIG. 10B). Moreover, by this heat treatment, also in the semiconductor layer 103, oxygen atoms in regions which are in contact with the source and drain electrode layers 105a and 105b move from the oxide semiconductor layer to the metal layer similarly. Thus, low resistance regions are formed in the above regions.

Heat treatment is preferably performed at 200° C. to 600° C., typically 300° C. to 500° C. For example, heat treatment is performed at 350° C. for an hour under a nitrogen atmosphere.

Figure 13:
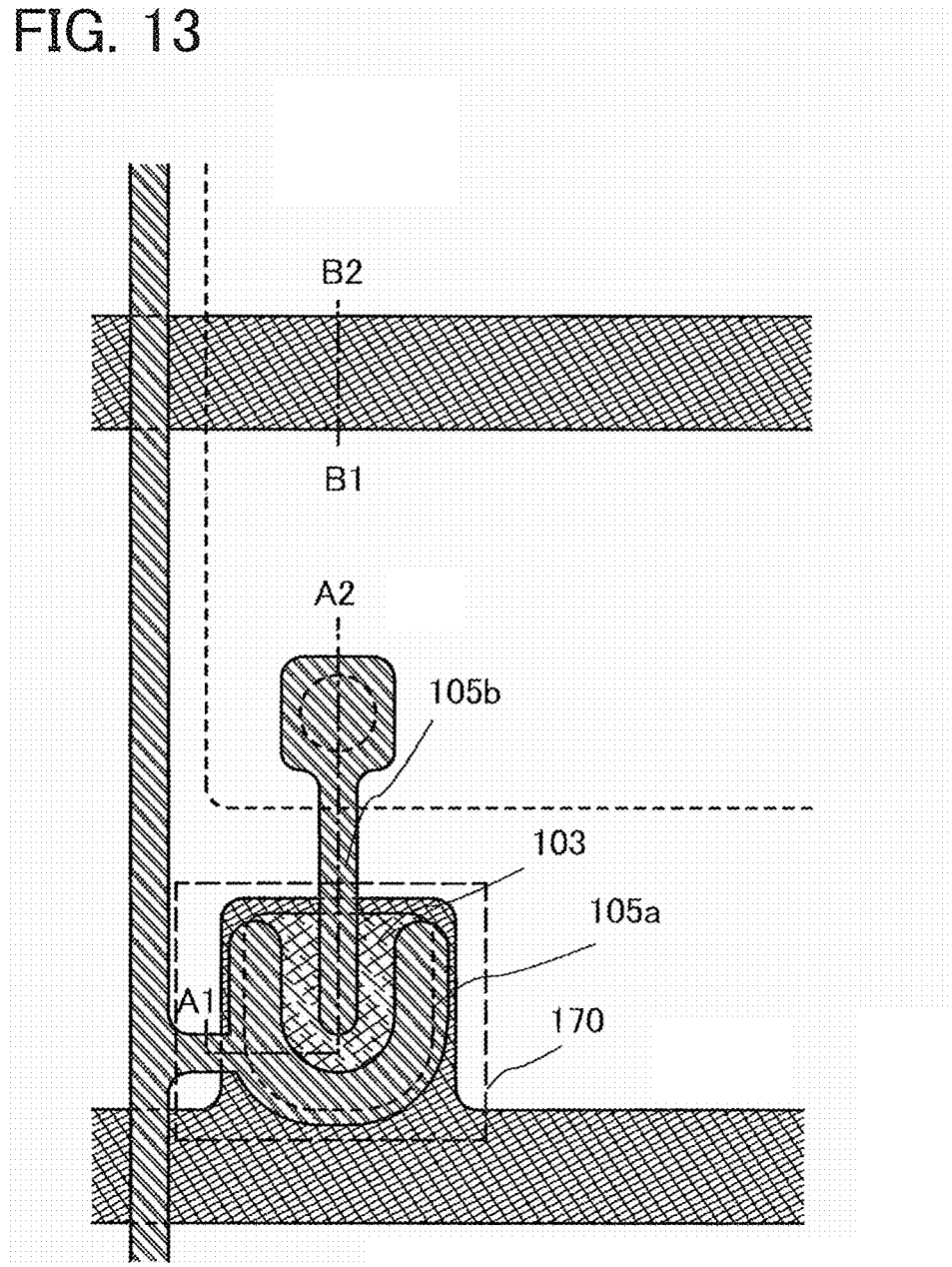
FIG. 13 illustrates a method for manufacturing a semiconductor device.

Through the above steps, a thin film transistor 170 can be completed. FIG. 13 is a plan view of at this stage.

In the fourth photolithography step, the second terminal 122 made from the same material as the source and drain electrode layers 105a and 105b is also left in the terminal portion. Note that the second terminal 122 is electrically connected to a source wiring (a source wiring including the source or drain electrode layer 105a or 105b).

Further, by use of a resist mask having regions with plural thicknesses (typically, two different thicknesses) which is formed using a multi-tone mask, the number of resist masks can be reduced, resulting in simplified process and lower costs.

Next, a protective insulating layer 107 is formed so as to cover the thin film transistor 170. For the protective insulating layer 107, a silicon nitride film, a silicon oxide film, a silicon oxynitride film, an aluminum oxide film, a tantalum oxide film, or the like which is obtained by a sputtering method or the like can be used.

Next, a fifth photolithography step is performed. A resist mask is formed, and the protective insulating layer 107 is etched, so that a contact hole 125 reaching the source or drain electrode layer 105b is formed. In addition, a contact hole 127 reaching the second terminal 122 and a contact hole 126 reaching the first terminal 121 are also formed in the same etching step. A cross-sectional view at this stage is illustrated in FIG. 10B.

Then, after the resist mask is removed, a transparent conductive film is formed. The transparent conductive film is formed using indium oxide ($In_2O_3$), indium oxide-tin oxide alloy ($In_2O_3$—$SnO_2$, abbreviated to ITO), or the like by a sputtering method, a vacuum evaporation method, or the like. Such a material is etched with a hydrochloric acid-based solution. However, since a residue is easily generated in etching ITO particularly, indium oxide-zinc oxide alloy ($In_2O_3$—$ZnO$) may be used to improve etching processability.

Next, a sixth photolithography step is performed. A resist mask is formed, and an unnecessary portion of the transparent conductive film is removed by etching, so that a pixel electrode layer 110 is formed.

Through this sixth photolithography step, a storage capacitor is formed by the capacitor wiring 108 and the pixel electrode layer 110, in which the gate insulating layer 102 and the protective insulating layer 107 in the capacitor portion are used as a dielectric.

In addition, in this sixth photolithography step, the first terminal 121 and the second terminal 122 are covered with the resist mask, and transparent conductive films 128 and 129 are left in the terminal portion. The transparent conductive films 128 and 129 function as electrodes or wirings connected to an FPC. The transparent conductive film 128 formed over the first terminal 121 is a connecting terminal electrode which functions as an input terminal of a gate wiring. The transparent conductive film 129 formed over the second terminal 122 is a connection terminal electrode which functions as an input terminal of the source wiring.

Figure 14:
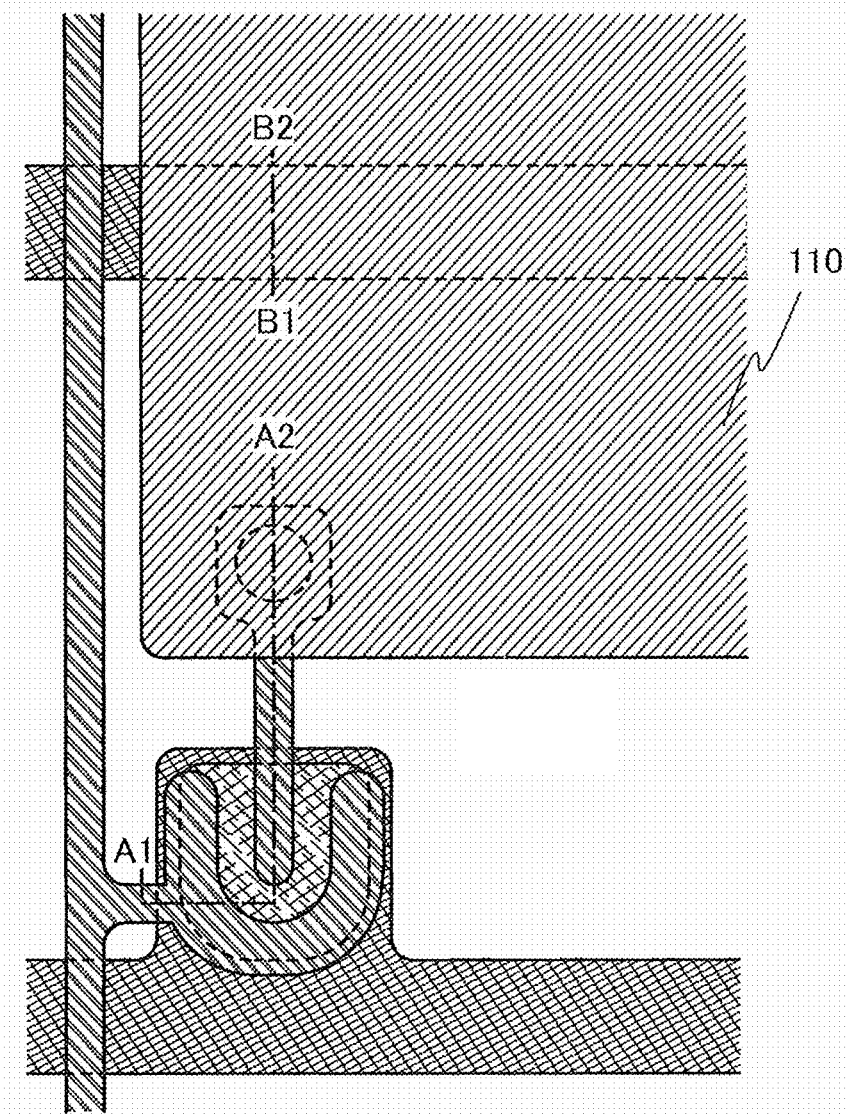
FIG. 14 illustrates a semiconductor device.

Then, the resist mask is removed. A cross-sectional view at this stage is illustrated in FIG. 10C. Note that FIG. 14 is a plan view at this stage.

FIGS. 15A1 and 15A2 are respectively a cross-sectional view and a plan view of a gate wiring terminal portion at this stage. FIG. 15A1 is a cross-sectional view along line E1-E2 of FIG. 15A2. In FIG. 15A1, a transparent conductive film 155 formed over a protective insulating film 154 is a connection terminal electrode functioning as an input terminal. Furthermore, in the terminal portion of FIG. 15A1, a first terminal 151 made of the same material as the gate wiring and a connection electrode layer 153 made of the same material as the source wiring overlap each other with a gate insulating layer 152 interposed therebetween, and are electrically connected to each other through the transparent conductive film 155. Note that a part of FIG. 10C, where the transparent conductive film 128 is in contact with the first terminal 121, corresponds to a part of FIG. 15A1 where the transparent conductive film 155 is in contact with the first terminal 151.

FIGS. 15B1 and 15B2 are respectively a cross-sectional view and a plan view of a source wiring terminal portion which is different from that illustrated in FIG. 10C. FIG. 15B1 is a cross-sectional view along line F1-F2 of FIG. 15B2. In FIG. 15B1, the transparent conductive film 155 formed over the protective insulating film 154 is a connection terminal electrode functioning as an input terminal. Furthermore, in the terminal portion of FIG. 15B1, an electrode layer 156 made of the same material as the gate wiring is disposed below the second terminal 150 electrically connected to the source wiring, with the gate insulating layer 152 interposed between the second terminal 150 and the electrode layer 156. The electrode layer 156 is not electrically connected to the second terminal 150, and a capacitor for preventing noise or static electricity can be formed if the potential of the electrode layer 156 is set to a potential different from that of the second terminal 150, such as floating, GND, or 0 V The second terminal 150 is electrically connected to the transparent conductive film 155 with the protective insulating film 154 therebetween.

A plurality of gate wirings, source wirings, and capacitor wirings are provided depending on the pixel density. Also in the terminal portion, a plurality of terminals including the first terminal at the same potential as the gate wiring, the second terminal at the same potential as the source wiring, a third terminal at the same potential as the capacitor wiring, and the like are each arranged. The number of each of the terminals may be any number, and the number of the terminals may be determined by a practitioner as appropriate.

Through these six photolithography steps, using six photomasks, a pixel thin film transistor portion including the thin film transistor 170 that is a bottom-gate n-channel thin film transistor, and a storage capacitor can be completed. By disposing the thin film transistor and the storage capacitor in each pixel of a pixel portion in which pixels are arranged in a matrix form, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

Figure 16:
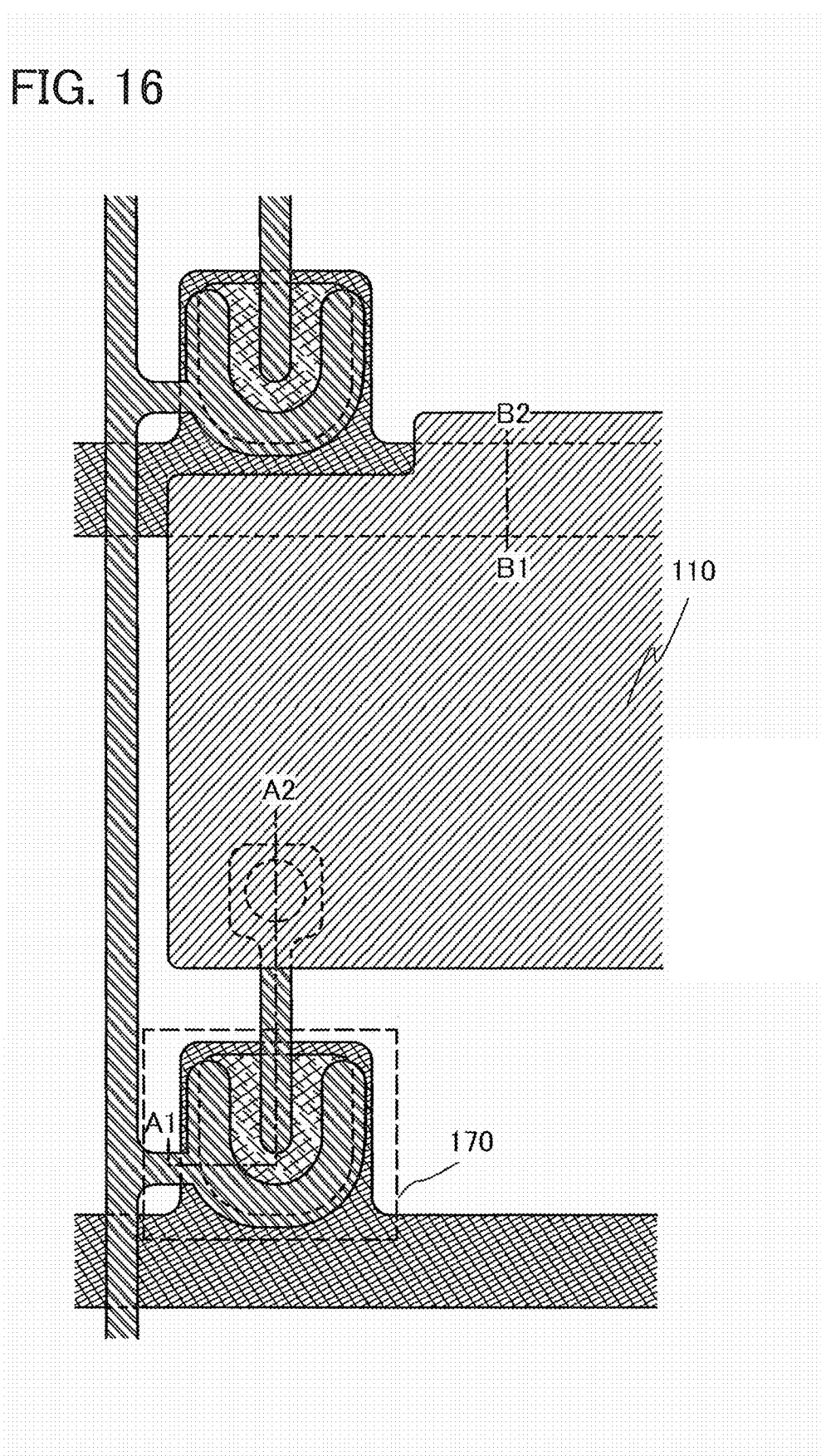
FIG. 16 illustrates a semiconductor device.

An embodiment of the present invention is not limited to the pixel structure of FIG. 14, and an example of the plan view different from FIG. 14 is illustrated in FIG. 16. FIG. 16 illustrates an example in which a capacitor wiring is not provided but a pixel electrode overlaps with a gate wiring of an adjacent pixel, with a protective insulating film and a gate insulating layer therebetween to form a storage capacitor. In that case, the capacitor wiring and the third terminal connected to the capacitor wiring can be omitted. Note that in FIG. 16, the same parts as those in FIG. 14 are denoted by the same reference numerals.

In an active matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Alternatively, a driving method so-called double-frame rate driving may be employed in which a vertical synchronizing frequency is 1.5 times or more, preferably 2 times or more as high as a usual vertical synchronizing frequency, whereby the moving-image characteristics are improved.

Further alternatively, in order to improve the moving-image characteristics of a liquid crystal display device, a driving method may be employed, in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

The n-channel transistor disclosed in this specification includes an oxide semiconductor film which is used for a channel formation region and has excellent dynamic characteristics; thus, it can be combined with these driving techniques.

In manufacturing a light-emitting display device, one electrode (also referred to as a cathode) of an organic light-emitting element is set to a low power supply potential such as GND or 0 V; thus, a terminal portion is provided with a fourth terminal for setting the cathode to a low power supply potential such as GND or 0 V. Also in manufacturing a light-emitting display device, a power supply line is provided in addition to a source wiring and a gate wiring. Accordingly, the terminal portion is provided with a fifth terminal electrically connected to the power supply line.

The use of an oxide semiconductor in a thin film transistor leads to reduction in manufacturing cost.

The region in the buffer layer which is in contact with the channel formation region is a high resistance region; thus, the buffer layer of the high resistance region can make the electric characteristics of the thin film transistor stable and prevent off current from increasing. In contrast, the regions in the buffer layer which are in contact with the source and drain electrode layers are low resistance regions; thus, the buffer layer of the low resistance regions can reduce contact resistance and increase on current. Therefore, a semiconductor device including a thin film transistor having high electric characteristics and high reliability can be provided.

This embodiment can be implemented in appropriate combination with the structures described in the other embodiments.

(Embodiment 6)

Instead of the In—Ga—Zn—O based non-single-crystal film, another oxide semiconductor film may be used for the buffer layer described in any of Embodiments 1, 2, and 5.

For example, a film whose composition formula is represented by $InMO_3(ZnO)_m$ (m>0) may be used, where M denotes another metal element. Note that M denotes a metal element selected from iron (Fe), nickel (Ni), manganese (Mn), and cobalt (Co) or denotes a plurality of elements selected from gallium (Ga), iron (Fe), nickel (Ni), manganese (Mn), and cobalt (Co). For example, there is a case where Ga and the above metal elements other than Ga, for example, Ga and Ni or Ga and Fe are contained as M. Further, the above oxide semiconductor may contain Fe or Ni, another transitional metal element, or an oxide of the transitional metal as an impurity element in addition to the metal element contained as M. Note that the metal element denoted by M and the above impurity element are contained during deposition of the oxide semiconductor film, so that the $InMO_3(ZnO)_m$ (m>0) film is obtained.

As the oxide semiconductor which is applied to the oxide semiconductor layer, any of the following oxide semiconductors can be applied in addition to the above: an In—Sn—Zn—O based oxide semiconductor; an In—Al—Zn—O based oxide semiconductor; a Sn—Ga—Zn—O based oxide semiconductor; an Al—Ga—Zn—O based oxide semiconductor; a Sn—Al—Zn—O based oxide semiconductor; an In—Zn—O based oxide semiconductor; a Sn—Zn—O based oxide semiconductor; an Al—Zn—O based oxide semiconductor; an In—O based oxide semiconductor; a Sn—O based oxide semiconductor; and a Zn—O based oxide semiconductor.

When a metal element such as titanium, molybdenum, or manganese is added to the above oxide semiconductor layer, resistance of the oxide semiconductor layer is increased and the above oxide semiconductor layer can be used as a buffer layer.

Note that in this specification, an element such as titanium, molybdenum, or manganese which is to be included in the buffer layer is added to the buffer layer in forming the buffer layer. For example, the buffer layer is formed by a sputtering method with use of a target including titanium, molybdenum, or manganese.

The buffer layer is provided so as to include a high resistance region and low resistance regions. The region in the buffer layer which is in contact with the channel formation region is a high resistance region; thus, the buffer layer of the high resistance region can make the electric characteristics of the thin film transistor stable and prevent off current from increasing. In contrast, the regions in the buffer layer which are in contact with the source and drain electrode layers are low resistance regions; thus, the buffer layer of the low resistance regions can reduce contact resistance and increase on current. Therefore, a semiconductor device including a thin film transistor having high electric characteristics and high reliability can be provided.

Through the above steps, a semiconductor device having high reliability can be manufactured.

This embodiment can be implemented in appropriate combination with the structures described in the other embodiments.

(Embodiment 7)

A thin film transistor is manufactured, and a semiconductor device having a display function (also referred to as a display device) can be manufactured using the thin film transistor in a pixel portion and further in a driver circuit. Further, part or whole of a driver circuit can be formed over the same substrate as that of a pixel portion, using a thin film transistor, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. Furthermore, an element substrate, which corresponds to one mode before the display element is completed in a manufacturing process of the display device, is provided with a means for supplying current to the display element in each of a plurality of pixels. Specifically, the element substrate may be in a state in which only a pixel electrode of the display element is provided, a state after formation of a conductive film to be a pixel electrode and before etching of the conductive film to form the pixel electrode, or any other states.

Note that a display device in this specification means an image display device, a display device, or a light source (including a lighting device). Further, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

The appearance and a cross section of a liquid crystal display panel, which is one embodiment of a semiconductor device, will be described with reference to FIGS. 18A1, 18A2, and 18B. FIGS. 18A1 and 18A2 are each a plan view of a panel in which highly reliable thin film transistors 4010 and 4011 each including the buffer layer and the oxide semiconductor layer described in Embodiment 5, and a liquid crystal element 4013 are sealed between a first substrate 4001 and a second substrate 4006 with a sealant 4005. FIG. 18B is a cross-sectional view along line M-N in FIGS. 18A1 and 18A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 18A1 illustrates an example of mounting the signal line driver circuit 4003 by COG, and FIG. 18A2 illustrates an example of mounting the signal line driver circuit 4003 by TAB.

The pixel portion 4002 and the scan line driver circuit 4004 provided over the first substrate 4001 each include a plurality of thin film transistors. FIG. 18B illustrates the thin film transistor 4010 included in the pixel portion 4002 and the thin film transistor 4011 included in the scan line driver circuit 4004. Over the thin film transistors 4010 and 4011, insulating layers 4020 and 4021 are provided.

Any of the highly reliable thin film transistors including the buffer layer and the oxide semiconductor layer which are described in Embodiment 5, can be used as the thin film transistors 4010 and 4011. Alternatively, any of the thin film transistors described in Embodiments 1 to 4 and 6 can be employed. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is provided on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 therebetween.

Note that the first substrate 4001 and the second substrate 4006 can be formed of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film, which is provided to control the distance between the pixel electrode layer 4030 and the counter electrode layer 4031 (a cell gap). Alternatively, a spherical spacer may also be used. In addition, the counter electrode layer 4031 is electrically connected to a common potential line formed over the same substrate as the thin film transistor 4010. With use of the common connection portion, the counter electrode layer 4031 and the common potential line can be electrically connected to each other by conductive particles arranged between a pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes liquid crystal exhibiting a blue phase and a chiral agent have such characteristics that the response time is 10 μs to 100 μs, which is short, the alignment process is unnecessary because the liquid crystal composition has optical isotropy, and viewing angle dependency is small.

An embodiment of the present invention can also be applied to a reflective liquid crystal display device or a semi-transmissive liquid crystal display device, in addition to a transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. Further, a light-blocking film serving as a black matrix may be provided.

In order to reduce surface unevenness of the thin film transistor and to improve reliability of the thin film transistor, the thin film transistor obtained in any of the above embodiments is covered with the insulating layers (the insulating layer 4020 and the insulating layer 4021) functioning as a protective film or a planarizing insulating film. Note that the protective film is provided to prevent entry of contaminant impurities such as organic substance, metal, or moisture existing in air and is preferably a dense film. The protective film may be formed with a single layer or a stacked layer of a silicon oxide film, a silicon nitride film, a silicon oxynitride film, a silicon nitride oxide film, an aluminum oxide film, an aluminum nitride film, an aluminum oxynitride film, and an aluminum nitride oxide film by a sputtering method. Although an example in which the protective film is formed by a sputtering method is described in this embodiment, an embodiment of the present invention is not limited to this method and a variety of methods may be employed.

In this embodiment, the insulating layer 4020 having a stacked-layer structure is formed as a protective film. Here, as a first layer of the insulating layer 4020, a silicon oxide film is formed by a sputtering method. The use of a silicon oxide film as a protective film has an effect of preventing hillock of an aluminum film used for the source and drain electrode layers.

As a second layer of the protective film, an insulating layer is formed. In this embodiment, as a second layer of the insulating layer 4020, a silicon nitride film is formed by a sputtering method. The use of the silicon nitride film as the protective film can prevent mobile ions such as sodium ions from entering a semiconductor region, thereby suppressing variations in electric characteristics of the TFT.

After the protective film is formed, the semiconductor layer may be subjected to annealing (300° C. to 400° C.).

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

A formation method of the insulating layer 4021 is not particularly limited, and the following method can be employed depending on the material: a sputtering method, an SOG method, a spin coating method, a dipping method, a spray coating method, a droplet discharge method (e.g., an ink-jet method, screen printing, offset printing, or the like), a doctor knife, a roll coater, a curtain coater, a knife coater, or the like. In a case of forming the insulating layer 4021 using a material solution, annealing (300° C. to 400° C.) of the semiconductor layer may be performed at the same time as a baking step. The baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

A connection terminal electrode 4015 is formed from the same conductive film as that of the pixel electrode layer 4030 included in the liquid crystal element 4013, and a terminal electrode 4016 is formed from the same conductive film as that of the source and drain electrode layers of the thin film transistors 4010 and 4011.

The connection terminal electrode 4015 is electrically connected to a terminal included in the FPC 4018 via an anisotropic conductive film 4019.

Note that FIGS. 18A1, 18A2, and 18B illustrate an example in which the signal line driver circuit 4003 is formed separately and mounted on the first substrate 4001; however, the present invention is not limited to this structure. The scan line driver circuit may be separately formed and then mounted, or only part of the signal line driver circuit or part of the scan line driver circuit may be separately formed and then mounted.

Figure 22:
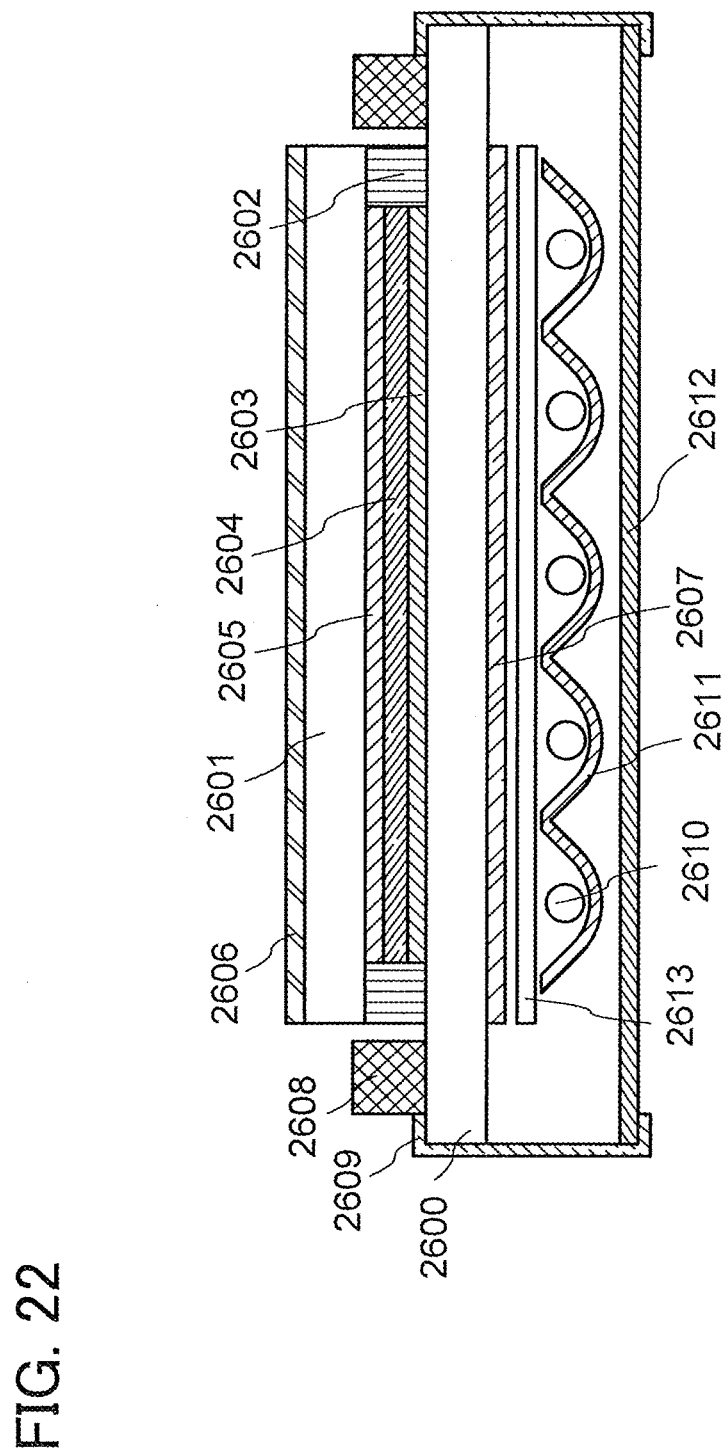
FIG. 22 illustrates a semiconductor device.

FIG. 22 shows an example in which a liquid crystal display module is formed as a semiconductor device using a TFT substrate 2600 which is manufactured according to the manufacturing method disclosed in this specification.

FIG. 22 illustrates an example of a liquid crystal display module, in which the TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through the above steps, a highly reliable liquid crystal display panel as a semiconductor device can be manufactured.

This embodiment can be implemented in appropriate combination with the structures described in the other embodiments.

(Embodiment 8)

An example of an electronic paper will be described as a semiconductor device.

An electronic paper which drives electronic ink by utilizing a switching element and an element which is electrically connected to the switching element and includes the electronic paper can be applied to the thin film transistor using the oxide semiconductor layer described in Embodiments 1 to 6.

The electronic paper is also referred to as an electrophoretic display device (an electrophoretic display) and has advantages in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. An electrophoretic display device does not need to use a polarizer which is required in a liquid crystal display device, and both the thickness and weight of the electrophoretic display device can be reduced to a half of those of a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. As the active matrix substrate, for example, the active matrix substrate with use of any of the thin film transistors obtained in Embodiments 1 to 6 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Figure 17:
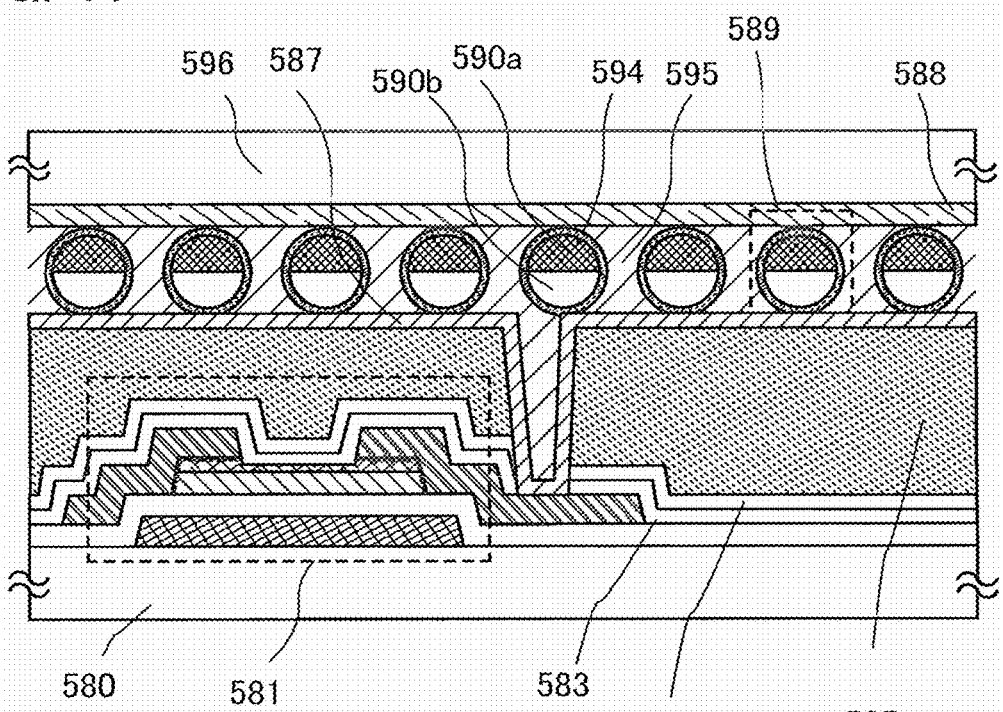
FIG. 17 illustrates a semiconductor device.

FIG. 17 illustrates an active matrix electronic paper as an example of a semiconductor device. A thin film transistor 581 used for the semiconductor device can be formed in a manner similar to the thin film transistor described in Embodiment 5, which is a highly reliable thin film transistor including a buffer layer and an oxide semiconductor layer. Any of the thin film transistors described in Embodiments 1 to 4 and 6 can also be used as the thin film transistor 581 of this embodiment.

The electronic paper in FIG. 17 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 sealed between a substrate 580 and a substrate 596 is a thin film transistor with a bottom gate structure, and a source or drain electrode layer thereof is in contact with a first electrode layer 587 through an opening formed in insulating layers 583, 584, and 585, whereby the thin film transistor 581 is electrically connected to the first electrode layer 587. Between the first electrode layer 587 and a second electrode layer 588, spherical particles 589 each having a black region 590a, a white region 590b, and a cavity 594 around the regions which are filled with liquid are provided. A space around the spherical particles 589 is filled with a filler 595 such as a resin (see FIG. 17). In this embodiment, the first electrode layer 587 corresponds to the pixel electrode and the second electrode layer 588 corresponds to the common electrode. The second electrode layer 588 is electrically connected to a common potential line provided over the same substrate as the thin film transistor 581. With the use of a common connection portion, the second electrode layer 588 can be electrically connected to the common potential line through conductive particles provided between a pair of substrates.

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through the above steps, a highly reliable electronic paper as a semiconductor device can be manufactured.

This embodiment can be implemented in appropriate combination with the structures described in the other embodiments.

(Embodiment 9)

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 20:
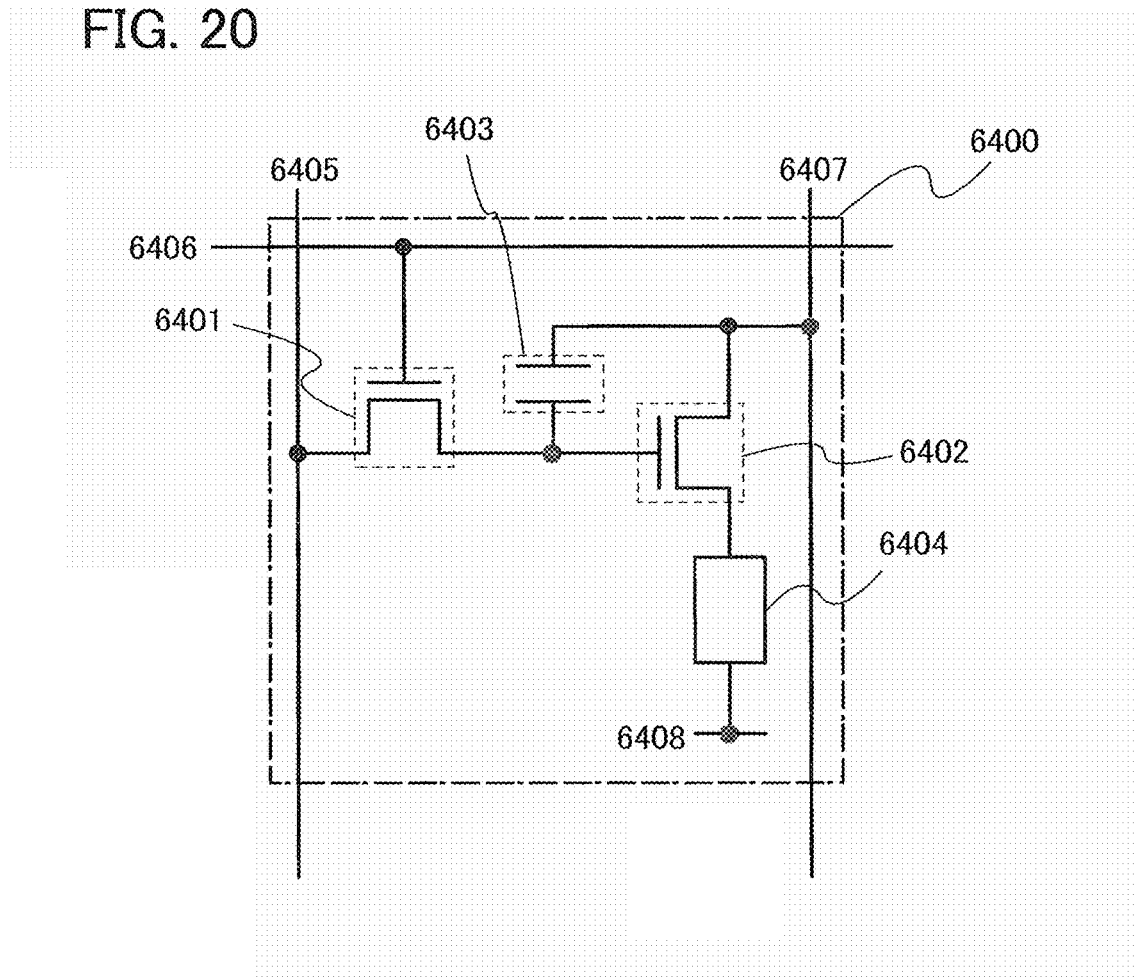
FIG. 20 illustrates a pixel equivalent circuit of a semiconductor device.

FIG. 20 illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential satisfying that the low power supply potential is lower than a high power supply potential (low power supply potential<high power supply potential) based on the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404.

Note that gate capacitor of the driver transistor 6402 may be used as a substitute for the capacitor 6403, so that the capacitor 6403 can be omitted. The gate capacitor of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, a voltage higher than the voltage of the power supply line 6407 is applied to the gate of the driver transistor 6402. Note that a voltage higher than or equal to the sum voltage of the power supply line voltage and $V_{th}$ of the driver transistor 6402 (voltage of the power supply line+$V_{th}$ of the driver transistor 6402) is applied to the signal line 6405.

In the case of using an analog grayscale method instead of the digital time grayscale method, the same pixel structure as in FIG. 20 can be employed by inputting signals in a different way.

In the case of performing analog grayscale driving, a voltage higher than or equal to the sum voltage of forward voltage of the light-emitting element 6404 and $V_{th}$ of the driver transistor 6402 (forward voltage of the light-emitting element 6404+$V_{th}$ of the driver transistor 6402) is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure is not limited to that illustrated in FIG. 20. For example, the pixel in FIG. 20 can further include a switch, a resistor, a capacitor, a transistor, a logic circuit, or the like.

Next, structures of the light-emitting element will be described with reference to FIGS. 21A to 21C. Here, a cross-sectional structure of a pixel is described by taking an n-channel driving TFT as an example. Driving TFTs 7001, 7011, and 7021 used in semiconductor devices illustrated in FIGS. 21A, 21B, and 21C, respectively can be formed in a manner similar to the thin film transistor described in Embodiment 5 and are highly reliable thin film transistors each including a buffer layer and an oxide semiconductor layer. Alternatively, any of the thin film transistors described in Embodiments 1 to 4, and 6 can be employed as the driving TFTs 7001, 7011, and 7021.

In order to extract light emitted from the light-emitting element, at least one of an anode and a cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure can be applied to a light-emitting element having any of these emission structures.

A light-emitting element having a top emission structure will be described with reference to FIG. 21A.

Figure 21A:
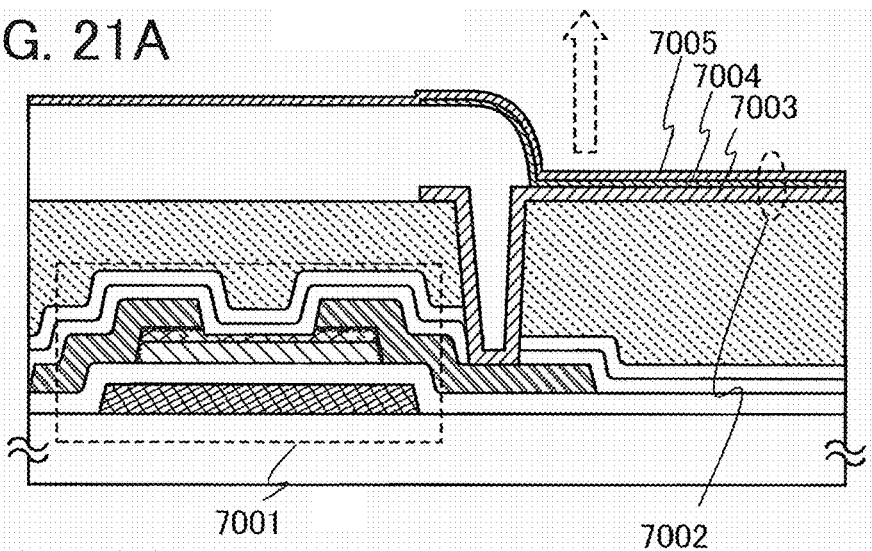
FIGS. 21A to 21C illustrate a semiconductor device.

FIG. 21A is a cross-sectional view of a pixel in the case where the driving TFT 7001 is an n-channel transistor and light is emitted from a light-emitting element 7002 to an anode 7005 side. In FIG. 21A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 21A, light is emitted from the light-emitting element 7002 to the anode 7005 side as indicated by an arrow.

Next, a light-emitting element having a bottom emission structure will be described with reference to FIG. 21B. FIG. 21B is a cross-sectional view of a pixel in the case where the driving TFT 7011 is an n-channel transistor and light is emitted from a light-emitting element 7012 to a cathode 7013 side. In FIG. 21B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, various materials can be used, like in the case of FIG. 21A, as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. Similarly to the case of FIG. 21A, the light-emitting layer 7014 may be formed using either a single layer or a plurality of layers stacked. The anode 7015 is not required to transmit light, but can be made of a light-transmitting conductive material like in the case of FIG. 21A. As the light-blocking film 7016, a metal or the like that reflects light can be used for example; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of the pixel illustrated in FIG. 21B, light is emitted from the light-emitting element 7012 to the cathode 7013 side as indicated by an arrow.

Next, a light-emitting element having a dual emission structure will be described with reference to FIG. 21C. In FIG. 21C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. Like in the case of FIG. 21A, the cathode 7023 can be made of a variety of conductive materials as long as they have a low work function. The cathode 7023 is formed to have a thickness that can transmit light. For example, a film of Al having a thickness of 20 nm can be used as the cathode 7023. Like in FIG. 21A, the light-emitting layer 7024 may be formed as either a single layer or a plurality of layers stacked. The anode 7025 can be made of a light-transmitting conductive material like in the case of FIG. 21A.

The light-emitting element 7022 corresponds to a region where the cathode 7023, the light-emitting layer 7024, and the anode 7025 overlap with one another. In the case of the pixel illustrated in FIG. 21C, light is emitted from the light-emitting element 7022 to both the anode 7025 side and the cathode 7023 side as indicated by arrows.

Note that, although the organic EL elements are described here as the light-emitting elements, an inorganic EL element can also be provided as a light-emitting element.

Note that the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 21B:
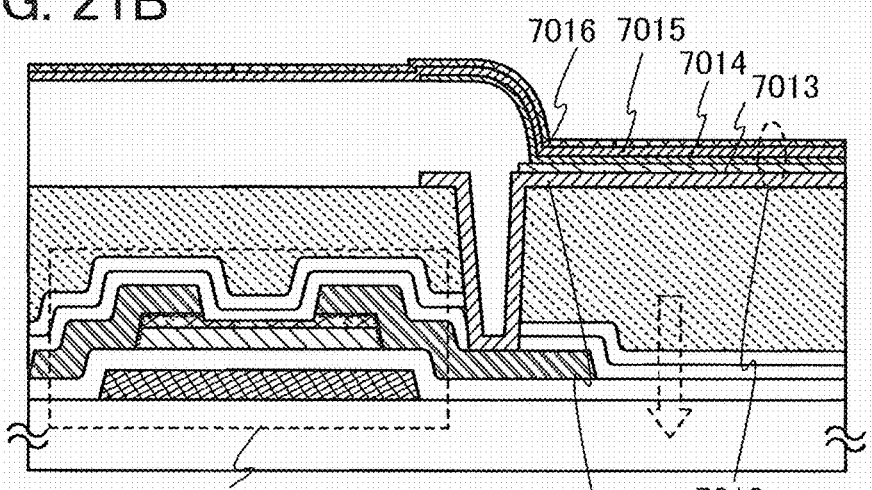
Figure 21C:
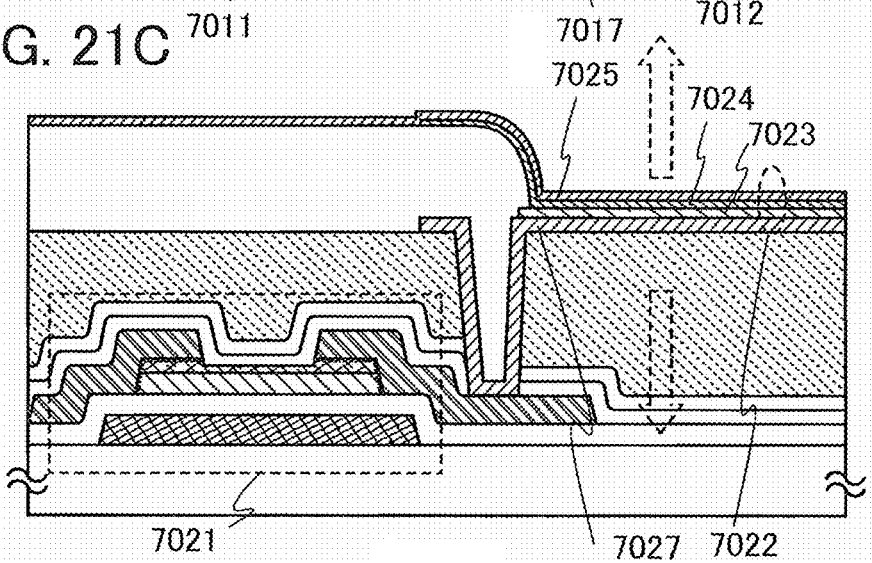

Note that the structure of the semiconductor device is not limited to those illustrated in FIGS. 21A to 21C and can be modified in various ways based on techniques disclosed in this specification.

Figure 19A:
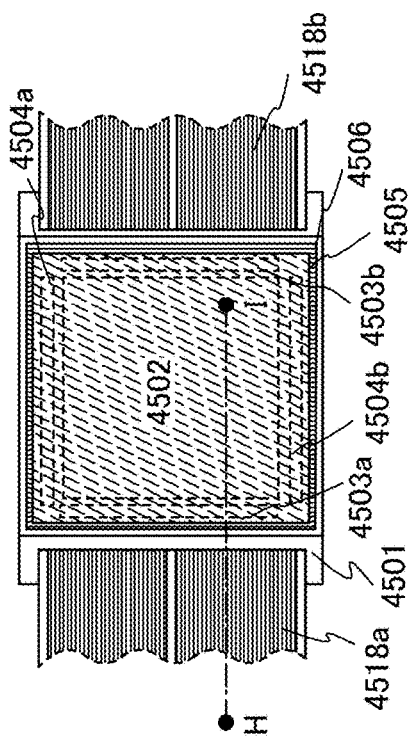
FIGS. 19A and 19B illustrate a semiconductor device.
Figure 19B:
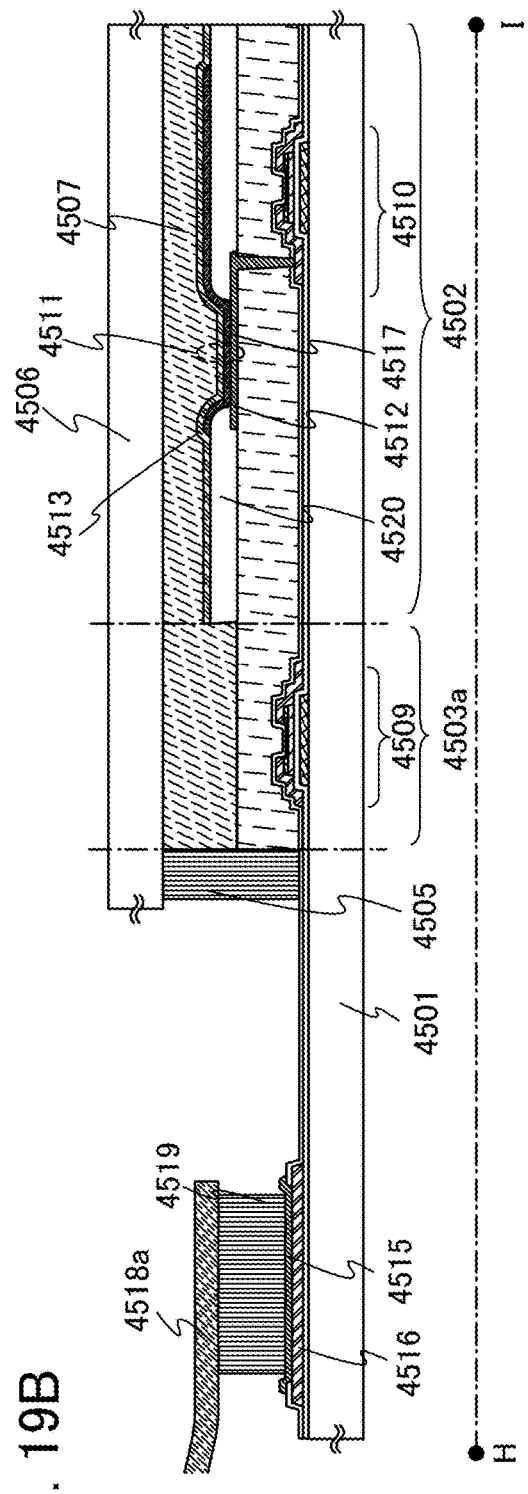

Next, the appearance and cross section of a light-emitting display panel (also referred to as a light-emitting panel) which corresponds to one embodiment of a semiconductor device will be described with reference to FIGS. 19A and 19B. FIG. 19A is a plan view of a panel in which a thin film transistor and a light-emitting element formed over a first substrate are sealed between the first substrate and a second substrate with a sealant. FIG. 19B is a cross-sectional view along line H-I of FIG. 19A.

A sealant 4505 is provided so as to surround a pixel portion 4502, signal line driver circuits 4503*a* and 4503*b*, and scan line driver circuits 4504*a* and 4504*b* which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503*a* and 4503*b*, and the scan line driver circuits 4504*a* and 4504*b* formed over the first substrate 4501 each include a plurality of thin film transistors. In FIG. 19B, a thin film transistor 4510 included in the pixel portion 4502 and a thin film transistor 4509 included in the signal line driver circuit 4503*a* are illustrated.

For the thin film transistors 4509 and 4510, the highly reliable thin film transistor including the buffer layer and the oxide semiconductor layer described in Embodiment 5 can be employed. Alternatively, any of the thin film transistors described in Embodiments 1 to 4 and 6 may be employed. The thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is, but not limited to, the stack structure which includes the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a via an anisotropic conductive film 4519.

As the second substrate located in the direction in which light is extracted from the light-emitting element 4511 needs to have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 19A and 19B.

Through the above steps, a highly reliable light-emitting display device (display panel) as a semiconductor device can be manufactured.

This embodiment can be implemented in appropriate combination with the structures described in the other embodiments.

(Embodiment 10)

A semiconductor device disclosed in this specification can be applied to an electronic paper. An electronic paper can be used for electronic appliances of a variety of fields as long as they can display data. For example, an electronic paper can be applied to an e-book reader (electronic book), a poster, an advertisement in a vehicle such as a train, or displays of various cards such as a credit card. Examples of the electronic devices are illustrated in FIGS. 23A and 23B and FIG. 24.

Figure 23A:
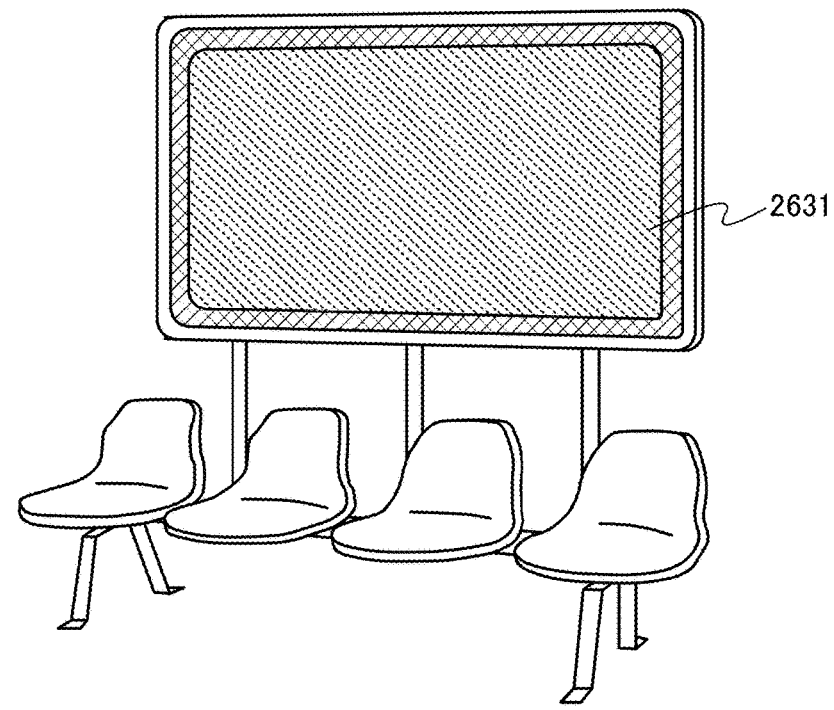
FIGS. 23A and 23B each illustrate an example of a usage pattern of an electronic paper.

FIG. 23A illustrates a poster 2631 formed using an electronic paper. In the case where an advertising medium is printed paper, the advertisement is replaced by hands; however, by using electronic paper disclosed in this specification, the advertising display can be changed in a short time. Furthermore, stable images can be obtained without display defects. Note that the poster may have a configuration capable of wirelessly transmitting and receiving data.

Figure 23B:
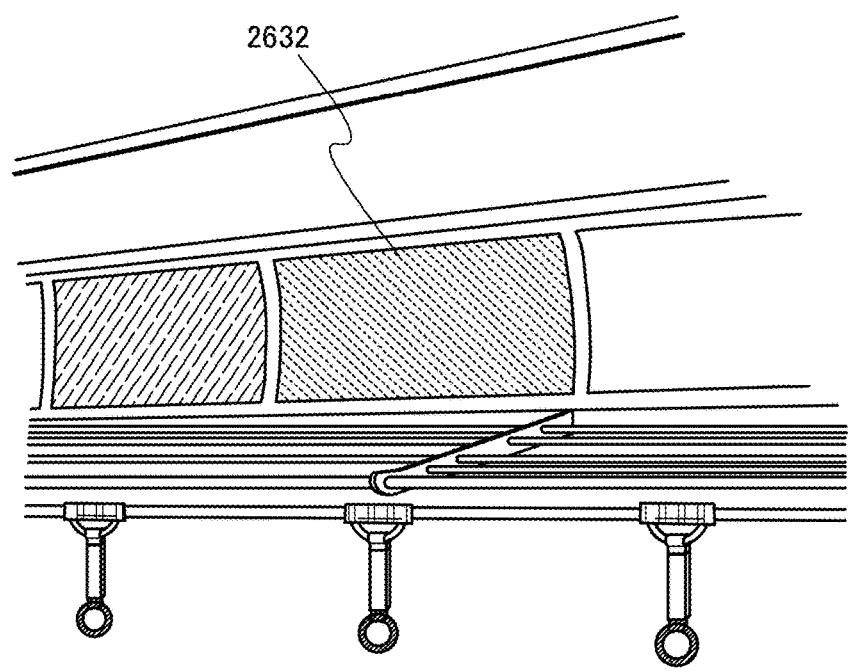

FIG. 23B illustrates an advertisement 2632 in a vehicle such as a train. In the case where an advertising medium is printed paper, the advertisement is replaced by hands; however, by using electronic paper disclosed in this specification, the advertising display can be changed in a short time with less manpower. Furthermore, stable images can be obtained without display defects. Note that the advertisement may have a configuration capable of wirelessly transmitting and receiving data.

Figure 24:
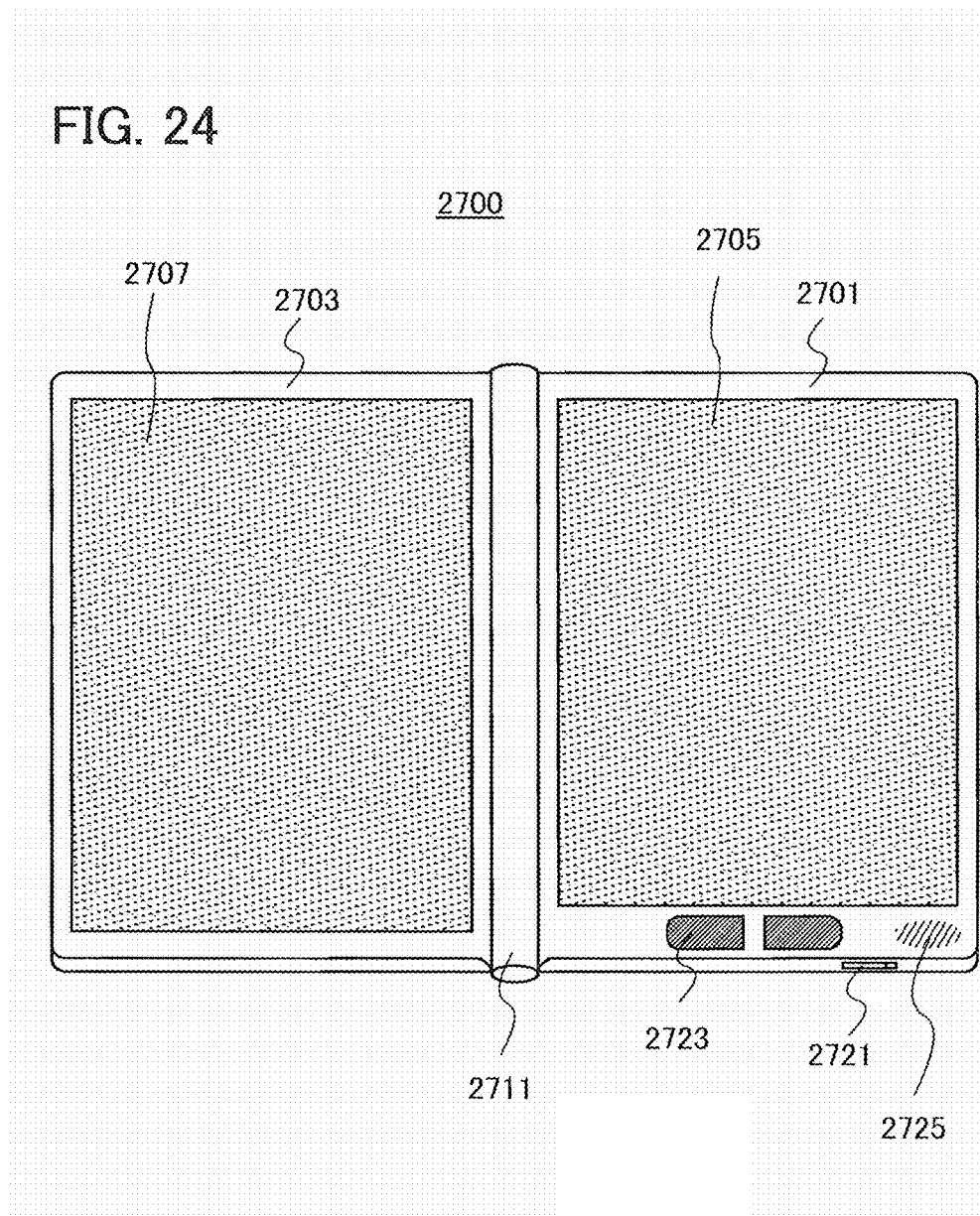
FIG. 24 is an external view of an example of an electronic book reader.

FIG. 24 illustrates an example of an electronic book reader 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 24) can display text and a display portion on the left side (the display portion 2707 in FIG. 24) can display graphics.

FIG. 24 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

(Embodiment 11)

A semiconductor device disclosed in this specification can be applied to a variety of electronic appliances (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 25A:
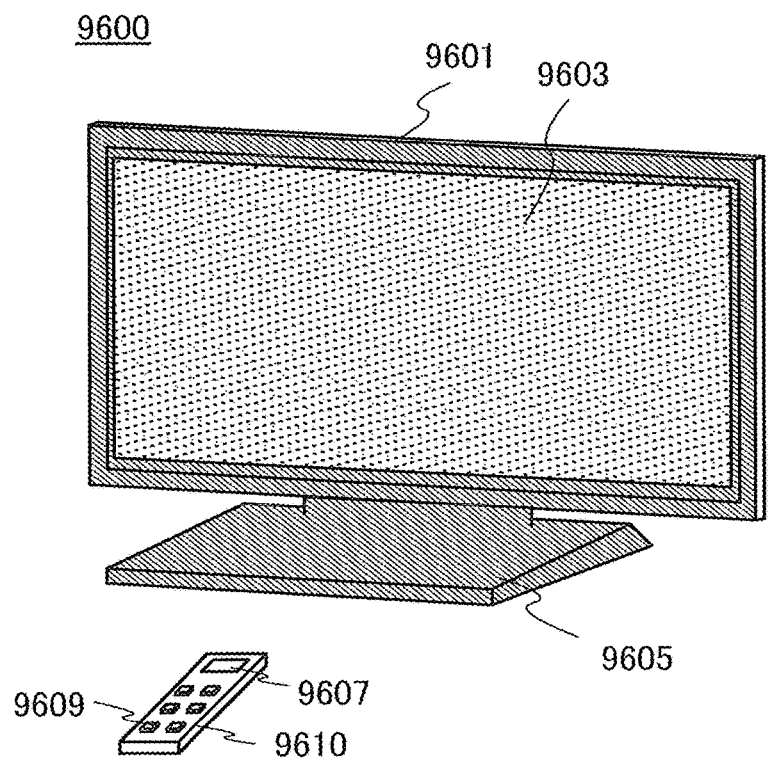
FIG. 25A is an external view of an example of a television set and FIG. 25B is an external view of an example of a digital photo frame.

FIG. 25A illustrates an example of a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 25B:
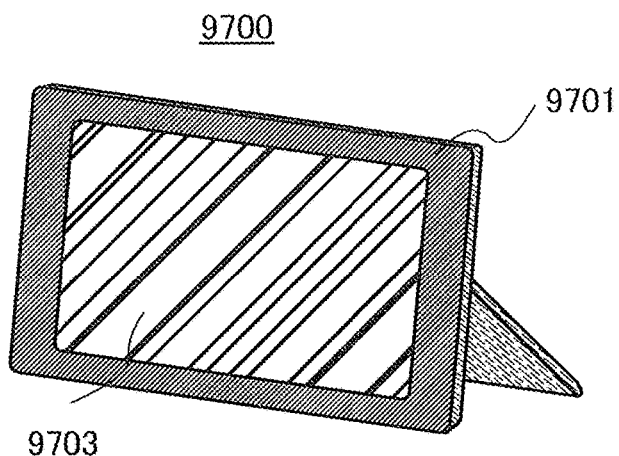

FIG. 25B illustrates an example of a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 26A:
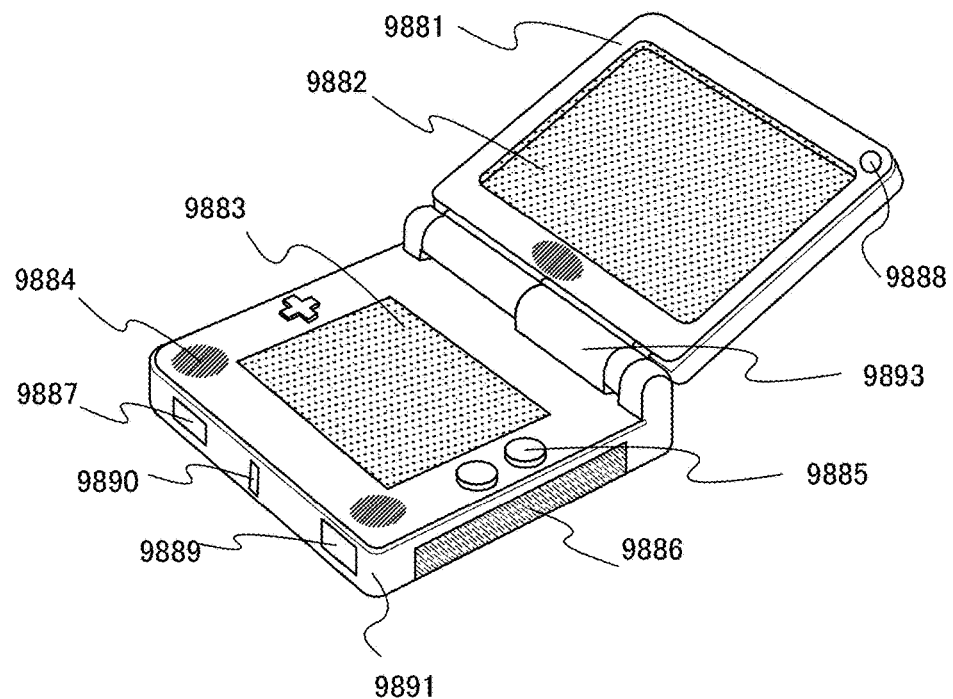
FIGS. 26A and 26B are external views of examples of an amusement machine.

FIG. 26A is a portable amusement machine and includes two housings, a housing 9881 and a housing 9891, which are connected with a joint portion 9893 so that the portable amusement machine can be opened or folded. A display portion 9882 and a display portion 9883 are incorporated in the housing 9881 and the housing 9891, respectively. In addition, the portable amusement machine illustrated in FIG. 26A is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable amusement machine is not limited to the above and other structures provided with at least a semiconductor device disclosed in this specification can be employed. The portable amusement machine may include other accessory equipment as appropriate. The portable amusement machine illustrated in FIG. 26A has a function of reading a program or data stored in a recording medium to display it on the display portion, and a function of sharing information with another portable amusement machine by wireless communication. Note that a function of the portable amusement machine illustrated in FIG. 26A is not limited to those described above, and the portable amusement machine can have a variety of functions.

Figure 26B:
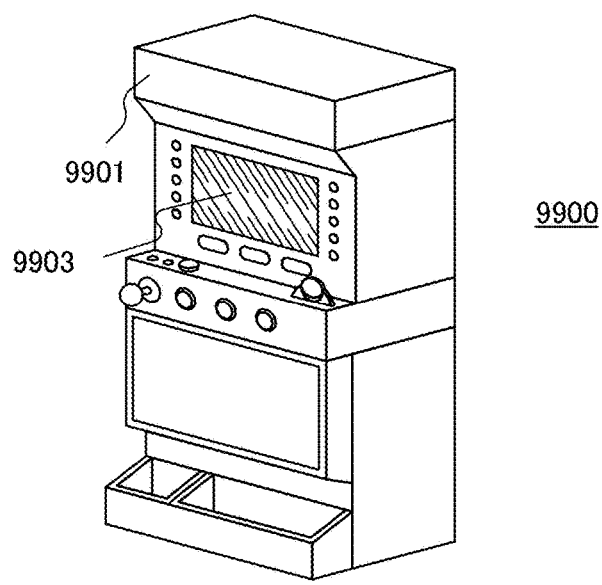

FIG. 26B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device disclosed in this specification may be employed. The slot machine 9900 may include other accessory equipment as appropriate.

Figure 27A:
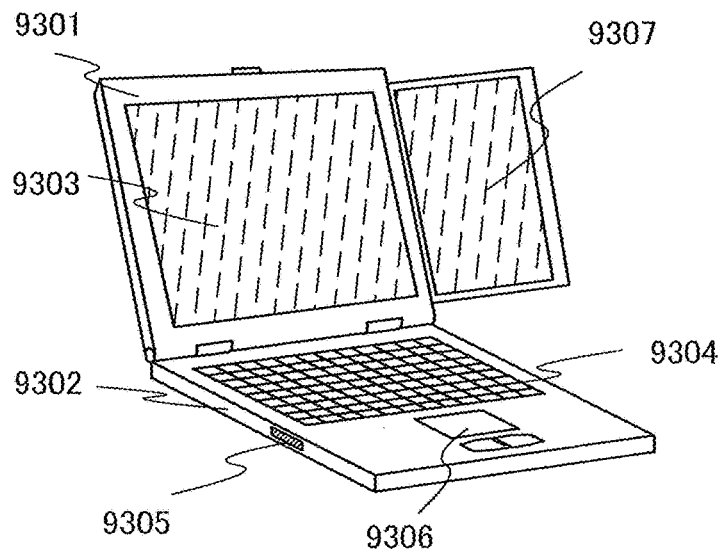
FIG. 27A is an external view of an example of a portable computer and FIG. 27B is an external view of an example of a mobile phone.

FIG. 27A is a perspective view illustrating an example of a portable computer.

In the portable computer of FIG. 27A, a top housing 9301 having a display portion 9303 and a bottom housing 9302 having a keyboard 9304 can overlap with each other by closing a hinge unit which connects the top housing 9301 and the bottom housing 9302. The portable computer of FIG. 27A can be convenient for carrying, and in the case of using the keyboard for input, the hinge unit is opened and the user can input data looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes another device, for example, an external connection port 9305 into which a communication cable conformable to communication standards of a USB is inserted.

The top housing 9301 includes a display portion 9307 and can keep the display portion 9307 therein by sliding it toward the inside of the top housing 9301; thus, the top housing 9301 can have a large display screen. In addition, the user can adjust the orientation of a screen of the display portion 9307 which can be kept in the top housing 9301. When the display portion 9307 which can be kept in the top housing 9301 is a touch input panel, input can be performed by touching part of the display portion 9307 which can be kept in the top housing 9301.

The display portion 9303 or the display portion 9307 which can be kept in the top housing 9301 are formed with an image display device of a liquid crystal display panel, a light-emitting display panel such as an organic light-emitting element or an inorganic light-emitting element, or the like.

In addition, the portable computer of FIG. 27A can be provided with a receiver and the like and can receive television broadcast to display an image on the display portion. The user can watch television broadcast when the whole screen of the display portion 9307 is exposed by sliding the display portion 9307 while the hinge unit which connects the top housing 9301 and the bottom housing 9302 is kept closed. In this case, the hinge unit is not opened and display is not performed on the display portion 9303. In addition, start up of only a circuit for displaying television broadcast is performed. Therefore, power can be consumed to the minimum, which is useful for the portable computer whose battery capacity is limited.

Figure 27B:
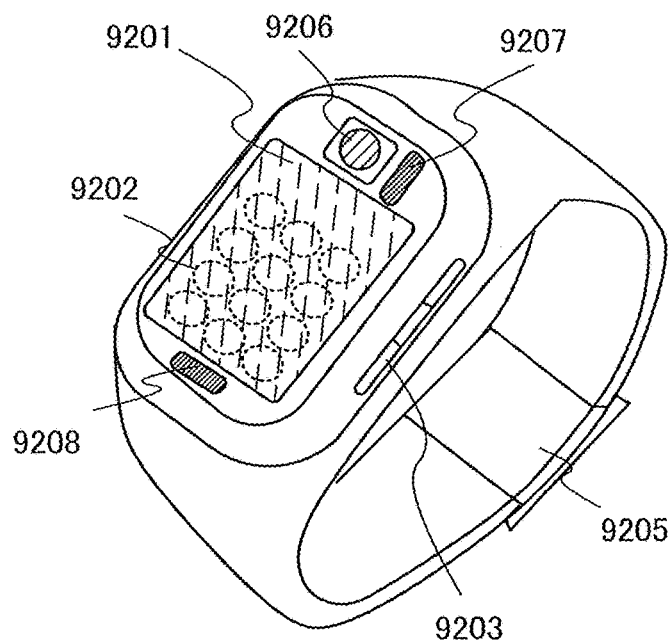

FIG. 27B is a perspective view illustrating an example of a mobile phone that the user can wear on the wrist like a wristwatch.

This mobile phone is formed with a main body which includes a communication device including at least a telephone function, and battery; a band portion which enables the main body to be wore on the wrist; an adjusting portion 9205 for adjusting the fixation of the band portion fixed for the wrist; a display portion 9201; a speaker 9207; and a microphone 9208.

In addition, the main body includes operating switches 9203. The operating switches 9203 have a function, for example, of a switch for starting a program for the Internet when the switch is pushed, in addition to a function of a switch for turning on a power source, a switch for shifting a display, a switch for instructing to start taking images, or the like, and can be used so as to correspond to each function.

Input to this mobile phone is operated by touching the display portion 9201 with a finger or an input pen, operating the operating switches 9203, or inputting voice into the microphone 9208. Note that displayed buttons 9202 which are displayed on the display portion 9201 are illustrated in FIG. 27B. Input can be performed by touching the displayed buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The mobile phone illustrated in FIG. 27B is provided with a receiver of television broadcast and the like, and can display an image on the display portion 9201 by receiving television broadcast. In addition, the mobile phone illustrated in FIG. 27B is provided with a memory device and the like such as a memory, and can record television broadcast in the memory. The mobile phone illustrated in FIG. 27B may have a function of collecting location information such as GPS.

An image display device of a liquid crystal display panel, a light-emitting display panel such as an organic light-emitting element or an inorganic light-emitting element, or the like is used as the display portion 9201. The mobile phone illustrated in FIG. 27B is compact and lightweight, and the battery capacity of such a mobile phone is limited. Therefore, a panel which can be driven with low power consumption is preferably used as a display device for the display portion 9201.

Note that FIG. 27B illustrates the electronic appliances which is worn on the wrist; however, this embodiment is not limited thereto as long as a portable shape is employed.

This application is based on Japanese Patent Application serial no. 2009-053399 filed with Japan Patent Office on Mar. 6, 2009, the entire contents of which are hereby incorporated by reference.

What is claimed is:

1. A semiconductor device comprising:
a gate electrode over a substrate;
a gate insulating layer over the gate electrode;
a first oxide semiconductor layer over the gate insulating layer;
a second oxide semiconductor layer over the first oxide semiconductor layer;
a source electrode electrically connected to the second oxide semiconductor layer;
a drain electrode electrically connected to the second oxide semiconductor layer;
a first region between the second oxide semiconductor layer and the source electrode; and
a second region between the second oxide semiconductor layer and the drain electrode,
wherein each of the first oxide semiconductor layer and the second oxide semiconductor layer comprises indium, gallium and zinc,
wherein a composition ratio of the first region is different from a composition ratio of each of the first oxide semiconductor layer and the second oxide semiconductor layer,
wherein a composition ratio of the second region is different from a composition ratio of each of the first oxide semiconductor layer and the second oxide semiconductor layer,
wherein each of the source electrode and the drain electrode comprises at least one of titanium, aluminum, manganese, magnesium, zirconium, beryllium, thorium, and copper, and
wherein each of the source electrode and the drain electrode is in contact with the gate insulating layer.

2. The semiconductor device according to claim 1,
wherein the first oxide semiconductor layer comprises a channel formation region,
wherein a concentration of oxygen in the first region is lower than a concentration of oxygen in the channel formation region, and
wherein a concentration of oxygen in the second region is lower than the concentration of oxygen in the channel formation region.

3. The semiconductor device according to claim 1, wherein each of the source electrode and the drain electrode overlap with the gate electrode.

4. The semiconductor device according to claim 1, wherein a thickness of the first oxide semiconductor layer is larger than a thickness of the second oxide semiconductor layer.

5. The semiconductor device according to claim 1, further comprising an insulating film over and in contact with the source electrode, the drain electrode, and the second oxide semiconductor layer.

6. The semiconductor device according to claim 1, wherein the second oxide semiconductor layer comprises a depressed portion between the source electrode and the drain electrode.

7. The semiconductor device according to claim 1, wherein each of the first region and the second region comprises a metal oxide.

8. A display module comprising the semiconductor device according to claim 1, wherein the display module comprises an FPC.

9. An electronic apparatus comprising the semiconductor device according to claim 1, wherein the electronic apparatus comprises at least one of a speaker, a battery, and an operation key.

10. A semiconductor device comprising:
a gate electrode over a substrate;
a gate insulating layer over the gate electrode;
a first oxide semiconductor layer over the gate insulating layer;
a second oxide semiconductor layer over the first oxide semiconductor layer;
a source electrode electrically connected to the second oxide semiconductor layer;

a drain electrode electrically connected to the second oxide semiconductor layer;

a first region between the second oxide semiconductor layer and the source electrode; and a second region between the second oxide semiconductor layer and the drain electrode, wherein each of the first oxide semiconductor layer and the second oxide semiconductor layer comprises indium, gallium and zinc, wherein a composition ratio of the first region is different from a composition ratio of each of the first oxide semiconductor layer and the second oxide semiconductor layer, wherein a composition ratio of the second region is different from the composition ratio of each of the first oxide semiconductor layer and the second oxide semiconductor layer, wherein each of the source electrode and the drain electrode comprises at least one of titanium, aluminum, manganese, magnesium, zirconium, beryllium, thorium, and copper, wherein each of the source electrode and the drain electrode is in contact with the gate insulating layer, and wherein an upper edge of the first oxide semiconductor layer is aligned with a bottom edge of the second oxide semiconductor layer.

11. The semiconductor device according to claim 10,
wherein the first oxide semiconductor layer comprises a channel formation region, wherein a concentration of oxygen in the first region is lower than a concentration of oxygen in the channel formation region, and wherein a concentration of oxygen in the second region is lower than the concentration of oxygen in the channel formation region.

12. The semiconductor device according to claim 10, wherein each of the source electrode and the drain electrode overlap with the gate electrode.

13. The semiconductor device according to claim 10, wherein a thickness of the first oxide semiconductor layer is larger than a thickness of the second oxide semiconductor layer.

14. The semiconductor device according to claim 10, further comprising an insulating film over and in contact with the source electrode, the drain electrode, and the second oxide semiconductor layer.

15. The semiconductor device according to claim 10, wherein the second oxide semiconductor layer comprises a depressed portion between the source electrode and the drain electrode.

16. The semiconductor device according to claim 10, wherein each of the first region and the second region comprises a metal oxide.

17. A display module comprising the semiconductor device according to claim 10, wherein the display module comprises an FPC.

18. An electronic apparatus comprising the semiconductor device according to claim 10, wherein the electronic apparatus comprises at least one of a speaker, a battery, and an operation key.

* * * * *